(12) United States Patent
Abe et al.

(10) Patent No.: US 8,542,424 B2
(45) Date of Patent: Sep. 24, 2013

(54) BLACK COATING FILM AND PRODUCTION METHOD THEREFOR, BLACK LIGHT SHADING PLATE, AND DIAPHRAGM, DIAPHRAGM DEVICE FOR LIGHT INTENSITY ADJUSTMENT, SHUTTER USING THE SAME, AND HEAT RESISTANT LIGHT SHADING TAPE

(75) Inventors: Yoshiyuki Abe, Ichikawa (JP); Katsushi Ono, Ichikawa (JP); Yukio Tsukakoshi, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 413 days.

(21) Appl. No.: 13/062,435

(22) PCT Filed: Aug. 11, 2009

(86) PCT No.: PCT/JP2009/064182
§ 371 (c)(1),
(2), (4) Date: Mar. 4, 2011

(87) PCT Pub. No.: WO2010/026853
PCT Pub. Date: Mar. 11, 2010

(65) Prior Publication Data
US 2011/0164297 A1 Jul. 7, 2011

(30) Foreign Application Priority Data

Sep. 5, 2008 (JP) ................................. 2008-228150
Jan. 28, 2009 (JP) ................................. 2009-016741
Mar. 23, 2009 (JP) ................................. 2009-070670

(51) Int. Cl.
*G02B 26/02* (2006.01)
*C23C 14/00* (2006.01)

(52) U.S. Cl.
USPC ................. 359/227; 204/192.15; 204/192.26; 204/192.27; 204/298.13

(58) Field of Classification Search
USPC ............. 204/192.26–192.28, 298.01–298.02, 204/298.13; 359/227, 601
See application file for complete search history.

(56) References Cited

U.S. PATENT DOCUMENTS
2010/0276276 A1* 11/2010 Takami et al. ........... 204/192.16

FOREIGN PATENT DOCUMENTS
JP 1-120503 A 5/1989
JP 2-116837 A 5/1990
(Continued)

OTHER PUBLICATIONS
International Search Report PCT/JP2009/064182 mailing date of Oct. 13, 2009.

*Primary Examiner* — James Phan
(74) *Attorney, Agent, or Firm* — Westerman, Hattori, Daniels & Adrian, LLP

(57) ABSTRACT

A heat resistant black coating film which is capable of making the surface of optical members to be low reflection property and black property, a black light shading plate having a resin film using the same as a base substrate, and a diaphragm, a diaphragm device for light intensity adjustment and a shutter using the same, and heat resistant light shading tape. They are provided by a black coating film (A), where a titanium oxide film containing titanium and oxygen as main components, and having an oxygen content of from 0.7 to 1.4, as atomicity ratio O/Ti, is formed on an opaque or translucent substrate, characterized in that the titanium oxide film takes a constitution of fine columnar crystals assembled, where the longitudinal direction of the crystal extends in a film thickness direction, has protrusions at the film surface, and has a film thickness of equal to or thicker than 50 nm; and a black light shading plate, wherein the metallic light shading film (B), having a film thickness of equal to or thicker than 40 nm, is formed onto at least one surface of the substrate, and still more the black coating film (A) is laminated and formed on the surface of the metallic light shading film (B), or the like.

39 Claims, 6 Drawing Sheets

(56) References Cited

FOREIGN PATENT DOCUMENTS

| | | |
|---|---|---|
| JP | 4-009802 A | 1/1992 |
| JP | 10-130830 A | 5/1998 |
| JP | 11-095009 A | 4/1999 |
| JP | 2000-303163 A | 10/2000 |
| JP | 2002-040512 A | 2/2002 |
| JP | 2002-277630 A | 9/2002 |
| JP | 2006-138974 A | 6/2006 |
| JP | 2008-158479 A | 7/2008 |

* cited by examiner

BLACK COATING FILM AND PRODUCTION METHOD THEREFOR, BLACK LIGHT SHADING PLATE, AND DIAPHRAGM, DIAPHRAGM DEVICE FOR LIGHT INTENSITY ADJUSTMENT, SHUTTER USING THE SAME, AND HEAT RESISTANT LIGHT SHADING TAPE

BACKGROUND OF THE INVENTION

1. Field of the Invention

The present invention relates to a black coating film and a production method therefore, a black light shading plate, and a diaphragm, a diaphragm device for light intensity adjustment, a shutter using the same, and a heat resistant light shading tape, and in more detail, the present invention relates to a heat resistant black coating film which is capable of making the surface of optical members to be low reflection property and black property, a black light shading plate having a resin film etc. using the same as a base substrate, and a diaphragm, a diaphragm device for light intensity adjustment, a shutter using the same, and a heat resistant light shading tape.

2. Description of the Prior Art

In recent years, development of a high-speed (mechanical-type) shutter of a digital camera has been performed actively. It is because increase in shutter speed enables to provide photographing of an ultra high-speed photographic subject without blurring and thus provide a vivid image. In general, a shutter is opened and closed by rotation and moving of a plurality of blades called shutter blades, and in order to increase shutter speed, weight reduction and high sliding property are required so that the shutter blades operate and stop in an extremely short period of time. Still more, the shutter blades have a role to shade light by covering the front surface of a photo-sensitive material such as a film, or an image sensor such as CCD or CMOS, and are required to have complete light shading property. Not limiting thereto, the shutter blades are desired to have low light reflectance, that is, high black degree, at the blade surface, to prevent generation of leaked light among each of the blades, in actuation of a plurality of shutter blade pieces in an overlapping way each other.

As for a fixed diaphragm to be inserted in a lens unit of a digital camera, which has a role to transmit light to the image sensor after squeezing to a certain quantity of light, it is also desired to have low light reflection property, that is, high black property, at the surface, because generation of light reflection at the diaphragm surface makes stray light and impairs vivid imaging.

In recent years, also in a mobile phone having photographing function, that is, a camera-equipped mobile phone, a compact mechanical-type shutter has started to be mounted in the lens unit, so as to enable to take a photo with high pixel and in high quality. In addition, inside the lens unit of a mobile phone, a fixed diaphragm is inserted. The mechanical-type shutter to be incorporated in the above mobile phone requires the operation under more saved power as compared with a general digital camera. Therefore, weight reduction of the shutter blades is particularly strongly required. Still more, in recent years, in production of the lens unit of a mobile phone, aiming at reduction of production cost, it is desired that each of the parts such as a lens, a fixed diaphragm and a shutter can be assembled in the reflow step. Therefore, heat resistance in addition to low light reflection property and black property at the surface are required for the shutter blades or the fixed diaphragm to be used therein.

In addition, in viewing a recent trend of an apparatus mounted on an automobile, there is a trend that a monitor using a video camera such as a back-view monitor is mounted. A fixed diaphragm is used also in the lens unit of this video camera monitor, and low reflection property, and black property are required for the diaphragm surface, similarly to prevent stray light. And heat resistance is required for the lens unit of the automotive video camera, so that function is not impaired even under high temperature use environment such asunder scorching sun in midsummer, and heat resistance is required also for the fixed diaphragm member.

On the other hand, a liquid crystal projector has recently started prevailing at ordinary households, because it makes viewing possible as a home theater with a large screen. Enhancement of picture quality has been desired strongly so that a vivid and high-contract projected image can be enjoyed, even under bright environment such as in a living room, and higher brightness of picture quality by increased output of a lamp light source is progressing. A diaphragm device for light intensity adjustment (auto iris) to adjust light quantity from the lamp light source is used at the inside or the side surface of the lens system, in an optical system of a projector. In the diaphragm device for light intensity adjustment, area of an opening part, which transmits light, is adjusted by overlapping of a plurality of diaphragm blade pieces each other, similarly as in a shutter. Low reflection property at the surface and weight reduction thereof are also required for the diaphragm blades of such a diaphragm device for light intensity adjustment, because of the similar reason as in the case of the shutter blades. At the same time, because the diaphragm blades of the diaphragm device for light intensity adjustment are heated by irradiation of the lamp light, heat resistance is also necessary. That is, it is because degeneration and deterioration of low reflection property of a blade material caused by light irradiation generate stray light, and cannot take a vivid projected image.

The following materials are used generally in response to required characteristics, for a light shading plate to be used for the above shutter blades, the fixed diaphragm material and the diaphragm blades of the diaphragm device for light intensity adjustment.

In the case where heat resistance is required, generally, a light shading plate made of a thin plate of a metal such as SUS, an SK material, Al, or Ti is used as a substrate. There is the case where the thin metal plate itself is used as the light shading plate, however, because of having metallic gloss, it is not preferable in the case where influence of stray light caused by reflected light at the surface should be avoided. On the other hand, a light shading plate having black and lubricating coat on the metal thin plate has a problem of inability of general use under high temperature environment, because of having inferior heat resistance at the coated part, although having low reflection property and black property. In Patent Document 3, there has been disclosed a light shading material, where a hard type carbon film is formed at the surface of a blade material made of a metal such as an aluminum alloy. However, low reflection characteristics of the light shading material cannot be attained even by formation of the hard type carbon film onto the surface, and generation of stray light caused by reflected light is unavoidable. In the case of the light shading plate where the above metal thin film is used as a substrate, use thereof as the shutter blades or the diaphragm blades raises a problem of increased torque of a drive motor for driving the blades, increased power consumption, inability to increase shutter-speed and generation of noise caused by contact of blades themselves, because of heavy weight in any cases.

On the other hand, a light shading plate using a resin film as a substrate has also been proposed. In Patent Document 1, there has been proposed a light shading plate using a resin film, which is matte-processed to reduce reflection at the surface, or a film-like light shading plate furnished with matte property by forming a surface with multiple fine irregularities, and also in Patent Document 2, there has been proposed a light shading film, wherein a thermosetting resin containing a matte paint is coated on a resin film. However, they only reduce reflection at the surface by processing the resin film itself, or by the addition of a matte agent, and there is no consideration on prevention of influence of stray light cause by reflection from the light shading blades.

As for the light shading plate using a resin film as a substrate, polyethylene terephthalate (PET) is used as a substrate in many cases, because of low specific gravity, low price and flexibility. In addition, such a PET film is widely used that has reduced transmittance by impregnation of black fine particles such as carbon black or titanium black to inside. For example, in Patent Document 4, there has been proposed coating a substrate with a coating film containing a needle-like or particulate micro material of titanium oxide or the like.

However, the PET material has a heat resistance of lower than 150° C., and weak mechanical strength such as tensile modulus of elasticity. Because of inferior heat resistance, it cannot be utilized as a diaphragm member for light intensity adjustment of a projector which is irradiated by high output lamp light, or a fixed diaphragm member or a shutter member which enables to correspond to the reflow step. In addition, in the blade member of a high-speed shutter, it is required to reduce film thickness in response to higher-speed of the shutter blades, and in the case of the resin film obtained by impregnation of black fine particles inside, it is impossible to exert sufficient light shading property, when film thickness decreased to, for example, 38 μm or thinner, and thus it cannot be used as the shutter blades.

In Patent Document 5, there has been proposed a light shading blade material obtained by sequentially laminating a thin film composed of a metal simple substance, a mixture or a compound, which is obtained by film-formation by a sputtering method or the like on a resin film, and a thin film (a protective film) composed of a simple substance or a mixture or a compound of a specific element, which satisfies characteristics of electrical conductivity, lubrication property and scratch resistance. Here, there is no description of low reflection property and black property, which are characteristics required for recent light shading blades. In addition, there is no specific description of effect of the protective film, other than effect of carbon on scratch resistance.

As described above, although there are coating film materials for making the surface of optical parts such as the shutter blades or the fixed diaphragm, or the diaphragm blades of, the diaphragm device for light intensity adjustment, low reflectance and black color, those excellent in heat resistance have not been found.

Under these circumstances, there has been required the light shading plate using a thin film of a metal, having relatively light weight, such as SUS, SK material, Al or Ti, or a resin film furnished with low reflection property and black property, as a substrate, which does not increase torque or power consumption of a drive motor for driving the blades, and enables to increase shutter speed, and does not generate noise caused by contact of the blades themselves, and shutter blades or the fixed diaphragm, and the diaphragm blades for the diaphragm device for light intensity adjustment, having all of sufficient light shading property in a visible light region and low reflection property, lightweight and electrical conductivity.

As described above, with progress of a more compact and thinner type of a digital camera and a camera-equipped mobile phone, more compact and thinner types of component parts to be mounted have been required as well, and there is a trend of a thinner type of an image sensor such as CCD or CMOS, or a flexible printed circuit substrate (FPC) mounted with an image sensor. In this case, light leaks from the rear surface of the image sensor, and still more, light passes through also the FPC. This transmitted light reflects at the parts of the FPC side and passes again through the FPC and enters from the rear surface of the image sensor. Increase in leaked light to this rear surface of the image sensor causes viewing of an image of a wiring circuit of the FPC into an imaging region, resulting in deterioration of quality of the imaging. Therefore, it is considered effective that a lightweight light shading film, having function to absorb and shade light, adheres onto the FPC, so that light, which transmitted from the rear surface of the image sensor, should not return again. In the case where a camera unit enables to correspond to reflow, heat resistance is also required for the light shading film.

There is no heat resistant light shading tape effective to such applications up to now, and development thereof has been required.

[Patent Document 1] JP-A-1-120503
[Patent Document 2] JP-A-4-9802
[Patent Document 3] JP-A-2-116837
[Patent Document 4] JP-A-2002-40512
[Patent Document 5] JP-A-2006-138974

SUMMARY OF THE INVENTION

It is an object of the present invention to provide a novel black coating film material for optical parts such as the shutter blades or the fixed diaphragm, the diaphragm blades for the diaphragm device for light intensity adjustment, and the heat resistant light shading tape, which are capable of maintaining low reflection property and black property, even under a high temperature environment of 300° C. in air. Still more; it is an object of the present invention to provide a black light shading plate using a resin film formed with said black coating film at the surface or the like, as a base substrate, having excellent heat resistance and reduced weight.

The present inventors have found, as a result of investigation of a coating film material which is capable of making the surface of the optical parts such as the shutter blades, the fixed diaphragm and the diaphragm blades for the diaphragm device for light intensity adjustment to have low reflectance and black color, that the above performance can be attained by forming, on a substrate, a black coating film, containing Ti and O as main components, oxygen quantity (atomicity ratio O/Ti) in a specific range, a constitution of fine columnar crystals assembled, where the longitudinal direction of the crystal extends in a film thickness direction, and a film thickness of equal to or thicker than 50 nm; or by still more making the black light shading plate where the metallic light shading film is formed and laminated on the substrate surface, before forming the black coating film, and characteristics thereof are not impaired, even under high temperature environment, and have thus completed the present invention. It should be noted that the black coating film formed on the substrate, or the metallic light shading film and the black coating film formed on the substrate may be referred to hereinafter as a light shading thin film.

That is, according to a first aspect of the present invention, there is provided a black coating film (A), where a titanium oxide film containing titanium and oxygen as main components, and having an oxygen content of from 0.7 to 1.4 as atomicity ratio O/Ti, is formed on a substrate, characterized in that the titanium oxide film takes a constitution of fine columnar crystals assembled, where the longitudinal direction of the crystal extends in a film thickness direction, has protrusions at the film surface, and has a film thickness of equal to or thicker than 50 nm.

In addition, according to a second aspect of the present invention, there is provided, in the first aspect, the black coating, characterized in that the substrate is selected from a thin film of a metal such as stainless steel, SK (carbon steel), Al or Ti, a thin film of ceramic such as alumina, magnesia, silica or zirconia, a glass plate, a resin plate or a resin film.

In addition, according to a third aspect of the present invention, there is provided, in the first aspect, the black coating film, characterized in that the titanium oxide film still more contains carbon, and is a titanium oxy-carbide film having a content thereof of equal to or higher than 0.7 as atomicity ratio C/Ti. In addition, according to a fourth aspect of the present invention, there is provided, in the first or the third aspect, the black coating film, characterized in that crystallite size of the fine columnar crystal, which constitutes the titanium oxide film or the titanium oxy-carbide film, is from 10 to 40 nm as diameter (width). In addition, according to a fifth aspect of the present invention, there is provided, in the first or the third aspect, the black coating film, characterized in that the film thickness is from 50 to 250 nm.

In addition, according to a sixth aspect of the present invention, there is provided, in the first or the third aspect, the black coating film, characterized in that an arithmetic average height (Ra) in a region of 1 μm×1 μm, measured with an atomic force microscope, is equal to or higher than 1.8 nm.

In addition, according to a seventh aspect of the present invention, there is provided, in the sixth aspect, the black coating film, characterized in that an arithmetic average height (Ra) in a region of 1 μm×1 μm, measured with an atomic force microscope, is equal to or higher than 2.4 nm.

Still more, according to an eighth aspect of the present invention, there is provided, in any one of the first to the seventh aspects, the black coating film, characterized in that a parallel light transmittance of the film itself, in a wavelength of from 380 to 780 nm, is from 13 to 35%, as an average value.

On the other hand, according to a ninth aspect of the present invention, there is provided, a method for producing the black coating film relevant to any one of the first to the eighth aspects, characterized in that a titanium oxide film or a titanium oxy-carbide film is formed on a substrate by sputtering under a film-formation gas pressure of equal to or higher than 1.5 Pa, by using any of sintered body target selected from titanium oxide, titanium oxide and titanium carbide, or titanium oxy-carbide.

In addition, according to a tenth aspect of the present invention, there is provided, in the ninth aspect, the method for producing the black coating film, characterized in that the film-formation gas is inert gas containing mainly argon or helium, and a content of oxygen gas is equal to or lower than 0.8% by volume.

In addition, according to an eleventh aspect of the present invention, there is provided a method for producing a black coating film, characterized in that oxygen contained in a sintered body and/or oxygen in residual gas in a film-formation room is incorporated into the film, by sputtering film-formation by using any of a sintered body target selected from titanium oxide, titanium oxide and titanium carbide, or titanium oxy-carbide, without introducing oxygen gas and introducing inert gas containing mainly argon or helium, as the film-formation gas, during film-formation.

Still more, according to a twelfth aspect of the present invention, there is provided, in the eleventh aspect, the method for producing the black coating film, characterized in that film-formation is performed under a film-formation gas pressure of equal to or higher than 1.5 Pa, in sputtering.

On the other hand, according to a thirteenth aspect of the present invention, there is provided, a laminated body of a black light shading thin film having sequential lamination, on the black coating film (A) selected from the titanium oxide film or the titanium oxy-carbide film, relevant to any one of the first to the eighth aspects, of a metallic light shading film (B) and the black coating film (A) similar to the above.

In addition, according to a fourteenth aspect of the present invention, there is provided, in the thirteenth aspect, the laminated body of a black light shading thin film, characterized in that the metallic light shading film (B) is a metal material containing one or more kinds of elements selected from titanium, tantalum, tungsten, cobalt, nickel, niobium, iron, zinc, copper, aluminum, or silicon, as main components.

Still more, according to a fifteenth aspect of the present invention, there is provided, in the thirteenth or the fourteenth aspect, the laminated body of a black light shading thin film, characterized in that the metallic light shading film (B) is a titanium carbide film or a titanium oxy-carbide film, and a carbon content in the film is equal to or higher than 0.6 as atomicity ratio C/Ti, and an oxygen content in the film is equal to or lower than 0.4 as atomicity ratio O/Ti.

On the other hand, according to a sixteenth aspect of the present invention, there is provided, a black light shading plate, wherein by using a resin film, a resin plate, a metal thin plate or a ceramic thin plate, as a substrate, the metallic light shading film (B) having a film thickness of equal to or thicker than 40 nm, is formed onto at least one surface thereof, and still more the black coating film (A) relevant to any one of the first to the eighth aspects, is laminated and formed onto the surface of the metallic light shading film (B), characterized in that an average optical density, in a wavelength of from 380 to 780 nm, is equal to or higher than 4.0, and an average value of direct optical reflectance at the surface of the black coating film, in a wavelength of from 380 to 780 nm, is equal to or lower than 18%.

In addition, according to a seventeenth aspect of the present invention, there is provided, in the sixteenth aspect, the black light shading plate, characterized in that the resin film, the resin plate, the metal thin plate or the ceramic thin plate has surface irregular property.

In addition, according to an eighteenth aspect of the present invention, there is provided, in the sixteenth or the seventeenth aspect, the black light shading plate, characterized in that the resin film is a polyimide film.

In addition, according to a nineteenth aspect of the present invention, there is provided, in the sixteenth aspect, the black light shading plate, characterized in that the metallic light shading film (B) is a metal material containing one or more kinds of elements selected from titanium, tantalum, tungsten, cobalt, nickel, niobium, iron, zinc, copper, aluminum, or silicon, as main components.

In addition, according to a twentieth aspect of the present invention, there is provided, in the sixteenth or the nineteenth aspect, the black light shading plate, characterized in that the metallic light shading film (B) is a titanium carbide film or a titanium oxy-carbide film, and a carbon content in the film is equal to or higher than 0.6, as atomicity ratio C/Ti, and an oxygen content in the film is equal to or lower than 0.4, as atomicity ratio O/Ti.

In addition, according to a twenty-first aspect of the present invention, there is provided, in any one of the sixteenth to the twentieth aspects, the black light shading plate, characterized in that the metallic light shading film (B) having substantially the same film thickness and the same composition is formed at both surfaces of the substrate of the resin film, the resin plate, the metal thin plate or the ceramic thin plate, and still more the black coating film (A) having substantially the same film thickness and the same composition is laminated and formed at the surface of the metallic light shading film (B), and they have a symmetric structure to the substrate.

Still more, according to a twenty-second aspect of the present invention, there is provided, in any one of the sixteenth to the twenty-first aspects, the black light shading plate, characterized in that a surface roughness of the black coating film (A), formed at the surface of the metallic light shading film (B), is from 0.05 to 0.7 µm (arithmetic average height), and an average value of direct optical reflectance at the surface of the black coating film (A), in a wavelength of from 380 to 780 nm, is equal to or lower than 0.8%.

Still more, according to a twenty-third aspect of the present invention, there is provided, in any one of the sixteenth to the twenty-second aspects, the black light shading plate, characterized in that a lightness (L*) of the black light shading plate, where the black coating film (A) is formed on the surface of the metallic light shading film (B), is from 25 to 45.

On the other hand, according to a twenty-fourth aspect of the present invention, there is provided, in any one of the first to the eighth aspects, a black light shading plate, wherein by using a colored resin film, as a substrate, the black coating film (A) is formed onto at least one surface thereof, characterized in that film thickness of the black coating film (A) is equal to or thicker than 20 nm, and an average value of direct optical reflectance at the surface of the black light shading plate, in a wavelength of from 380 to 780 nm, is equal to or lower than 1%.

In addition, according to a twenty-fifth aspect of the present invention, there is provided, in the twenty-fourth aspect, the black light shading plate, characterized in that the colored resin film has surface irregular property.

In addition, according to a twenty-sixth aspect of the present invention, there is provided, in the twenty-fourth aspect, the black light shading plate, characterized in that the film thickness of the black coating film (A) is from 20 to 150 nm.

Still more, according to a twenty-seventh aspect of the present invention, there is provided, in any one of the twenty-fourth to the twenty-sixth aspects, the black light shading plate, characterized in that the lightness (L*) of the black light shading plate obtained by formation of the black coating film (A) on the colored resin film, is from 25 to 45.

On the other hand, according to a twenty-eighth aspect of the present invention, there is provided, a black light shading plate, where the laminated body of a black light shading thin film, relevant to any one of the thirteenth to the fifteenth aspects, is formed at one surface side of a translucent substrate, characterized in that the metallic light shading film (B) has a film thickness of equal to or thicker than 100 nm, an average optical density, in a wavelength of from 380 to 780 nm, is equal to or higher than 4.0, and an average value of direct optical reflectance at the surface of the laminated body and at the substrate surface not formed with the film, in a wavelength of from 380 to 780 nm, is equal to or lower than 18%.

In addition, according to a twenty-ninth aspect of the present invention, there is provided, in the twenty-eighth aspect, the black light shading plate, characterized in that the translucent substrate is a resin film, a resin plate, a glass plate, a ceramic plate or a single crystal plate of an inorganic compound.

In addition, according to a thirtieth aspect of the present invention, there is provided, in the twenty-ninth aspect, the black light shading plate, characterized in that the translucent substrate is a polyimide film.

In addition, according to a thirty-first aspect of the present invention, there is provided, in the twenty-eighth to the thirtieth aspects, the black light shading plate, characterized in that the translucent substrate has surface irregular property.

In addition, according to a thirty-second aspect of the present invention, there is provided, a black light shading plate, characterized in that a surface roughness of the black coating film (A), formed at the surface of the metallic light shading film (B), in the laminated body of a black light shading thin film, relevant to any one of the twenty-eighth to the thirty-first aspects, is from 0.05 to 0.7 µm (arithmetic average height), and an average value of direct optical reflectance at the surface of the black coating film (A), in a wavelength of from 380 to 780 nm, is equal to or lower than 0.8%.

In addition, according to a thirty-third aspect of the present invention, there is provided, in any one of the twenty-eighth to the thirty-second aspects, the black light shading plate, characterized in that surface roughness at the translucent substrate side is from 0.0001 to 0.7 µm (arithmetic average height), and an average value of direct optical reflectance at the surface of the laminated body of a black light shading thin film, in a wavelength of from 380 to 780 nm, is equal to or lower than 0.8%.

In addition, according to a thirty-fourth aspect of the present invention, there is provided, in any one of the twenty-eighth to the thirty-third aspects, the black light shading plate, characterized in that the lightness (L*) of the film surface side of the black light shading plate formed with the laminated body of a black light shading thin film, is from 25 to 45.

Still more, according to a thirty-fifth aspect of the present invention, there is provided, in any one of the twenty-eighth to the thirty-fourth aspects, the black light shading plate, characterized in that the lightness (L*) of the translucent substrate surface side of the black light shading plate formed with the laminated body of a black light shading thin film, is from 25 to 45.

On the other hand, according to a thirty-sixth aspect of the present invention, there is provided, a diaphragm obtained by fabrication of the black light shading plate relevant to any one of the sixteenth to the thirty-fifth aspects.

In addition, according to a thirty-seventh aspect of the present invention, there is provided, a diaphragm device for light intensity adjustment using blade materials obtained by fabrication of the black light shading plate relevant to any one of the sixteenth to the thirty-fifth aspects.

In addition, according to a thirty-eighth aspect of the present invention, there is provided, a shutter using the blade materials obtained by fabrication of the black light shading plate relevant to any one of the sixteenth to the thirty-fifth aspects.

Still more, according to a thirty-ninth aspect of the present invention, there is provided, a heat resistant light shading tape having an adhesive layer placed at one surface or both surfaces of the black light shading plate relevant to any one of the sixteenth to the thirty-fifth aspects.

The black coating film of the present invention is useful for a black coating of various optical members, because of containing Ti and O as main components, an oxygen content of from 0.7 to 1.4, as atomicity ratio O/Ti, a constitution of fine columnar crystals assembled, where the longitudinal direction of the crystal extends in a film thickness direction, protrusions at the film surface, and a film thickness of equal to or thicker than 50 nm, and having low reflection property at a visible light region (a wavelength of from 380 to 780 nm) and black property. The black coating film of the present invention does not impair characteristics thereof, even under a high temperature environment of 300° C. in air, because of still more containing carbon, and the carbon content is equal to or higher than 0.7, as atomicity ratio C/Ti. Therefore, it is extremely useful as a surface coating material of various optical parts having heat resistance around lamp light of a projector.

In addition, the black light shading plate, where the black coating film of the present invention is formed on a resin film, is superior in lightweight property as compared with a light shading plate based on a conventional metal thin plate, because of using a resin film as a substrate. In addition, use of a film of a heat resistant resin such as polyimide as the base substrate is capable of attaining a lightweight light shading plate having heat resistant, even under a high temperature environment of 300° C. in air, and does not impair any of low reflection property, black property and light shading property, and enables to be utilized as the diaphragm blade material of the diaphragm device for light intensity adjustment of a liquid crystal projector, or the fixed diaphragm material and the shutter blades material which enables to correspond to assembly by the reflow step, therefore industrial value is extremely high.

In addition, the black light shading plate of the present invention is effectives also for shutter blades of a high-speed shutter, because of no impairment of sufficient light shading property, even when thickness of the base film substrate is made thin to equal to or thinner than 38 μm to reduce weight. Therefore, it is capable of making compact sizing of a drive motor, and has merit of attaining compact sizing of the diaphragm device for light intensity adjustment or the mechanical-type shutter.

Still more, the heat resistant light shading tape having an adhesive layer placed at one surface or both surfaces of the black light shading plate of the present invention is capable of absorbing light leaked from the rear surface of the image sensor such as CCD or CMOS, and inhibiting its passing through, by pasting onto the FPC. Therefore, it is capable of suppressing re-incident of the leaked light to the image sensor, and contributing to stabilization of quality of imaging.

NOTATION

Figure 1:
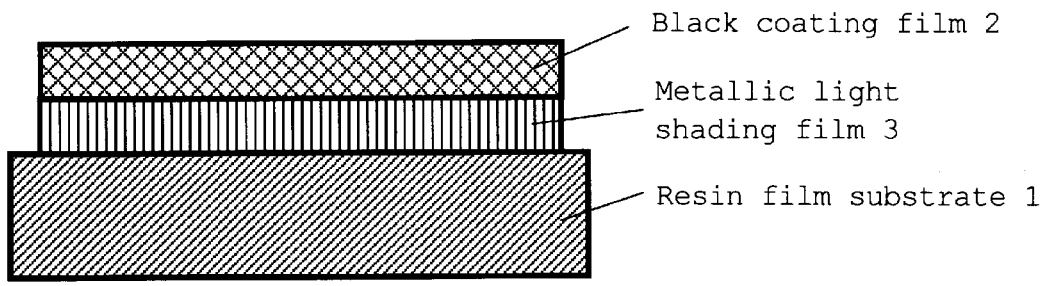
FIG. 1 is a schematic diagram showing a cross-section of the black light shading plate of the present invention, where a light shading thin film is formed on one surface of a resin film.

1. Resin film substrate
2. Black coating film
3. Metallic light shading film

DETAILED DESCRIPTION OF THE INVENTION

Explanation will be given below on the black coating film, the black light shading plate of the present invention, and applications thereof, with reference to drawings.
1. The Black Coating Film (A)

The black coating film of the present invention is characterized by containing Ti and O as main components, an oxygen content of from 0.7 to 1.4, as atomicity ratio O/Ti, a constitution of fine columnar crystals assembled, where the longitudinal direction of the crystal extends in a film thickness direction, protrusions at the film surface, and a film thickness of equal to or thicker than 50 nm.

The black coating film of the present invention should have Ti and O as main components, and an oxygen content of from 0.7 to 1.4. It is because in the case where the atomicity ratio O/Ti is below 0.7, the titanium oxide film expresses metallic color, resulting in deteriorated low reflection property or black property, and in the case where the atomicity ratio O/Ti is over 1.4, transmittance of the film becomes too high, resulting in deteriorated light absorption function and impairment of low reflection property or black property.

In addition, it is preferable that the black coating film of the present invention still more contains carbon in addition to the above titanium oxide film, and the carbon content is equal to or higher than 0.7, as atomicity ratio C/Ti. It is because the carbon content of equal to or higher than 0.7, as the atomicity ratio C/Ti, provides superior heat resistance at 300° C. The carbon content of below 0.7, as the atomicity ratio C/Ti, results in discoloring of the film and decreased black property, under heating at 270° C. in air, and thus not preferable.

The atomicity ratio O/Ti or the atomicity ratio C/Ti in the above black coating film can be analyzed by using, for example, an XPS (X-ray photoelectron spectral instrument). Because high quantity of oxygen is bonded at the most front surface of the film, by measurement after shaving the surface to the depth of several tens nm by sputtering in vacuum, the atomicity ratio O/Ti or the atomicity ratio C/Ti in the film can be determined quantitatively.

Even in the above film composition, low reflection property or black property of the film depends on a film thickness, and when the film thickness is equal to or, thicker than 50 nm, light absorption by the film is performed sufficiently, and low reflection property and black property can be exerted. The film thickness is equal to or thicker than 80 nm, preferably equal to or thicker than 100 nm, more preferably equal to or thicker than 150 nm, and most preferably equal to or thicker than 200 nm.

Still more, the black coating film of the present invention is required to have a constitution of fine columnar crystals assembled, where the longitudinal direction of the crystal extends in a film thickness direction, and low reflection property can be secured by forming surface irregularity by protrusions at the film surface, so as to scatter reflected light.

Crystallite diameter (width) of fine columnar crystals is from 10 to 40 nm and preferably from 15 to 35 nm. The crystallite diameter (width) of below 10 nm makes difficult to generate clearance between adjacent crystals, while the diameter of over 40 nm decreases low reflection property or black property of the film, and thus not preferable. In addition, as long as the object of the present invention is not impaired, when fine columnar crystals are assembled, a clearance part may be left among the fine columnar crystals, or the fine columnar crystals may be in an assembled and bundled state.

The black coating film of the present invention, as described above, has a constitution of fine columnar crystals assembled, where the longitudinal direction of the crystal extends in a film thickness direction, and has surface irregular property. As for the surface irregular property, an arithmetic average height (Ra) in a region of 1 μm×1 μm of the surface of said black coating film measured with anatomic force microscope, is equal to or higher than 1.8 nm, preferably equal to or higher than 2.4 nm. In this way, low reflection property can be secured by scattering the reflected light, and provides one useful as optical members.

The black coating film of the present invention can make a parallel light transmittance (Tp) of the film itself, in a wavelength of from 380 to 780 nm, from 13 to 35% in average, because of having the above characteristics.

The black coating film of the present invention may contain elements other than Ti, C and O, in a degree that the above characteristics are not impaired. In general, in a sputtering target to be used as a raw material for sputtering film-formation, a sintering co-agent is added to improve sintering density of a sintered body which becomes a material thereof. Specifically, elements such as Fe, Ni, Co, Zn, Cu, Mn, In, Sn, Nb and Ta are added, as the sintering co-agent, to a sintered body target, and the elements added are also contained in the black coating film. The containment of the above elements in said black coating film in this way may be allowed, as long as characteristics of the above black coating film are not impaired.

The black coating film of the present invention is formed on the surface of a substrate such as a metal thin film such as SUS, SK, Al, Ti, a ceramic thin film of a metal oxide such as alumina, magnesia, silica as a main component, or a glass plate, a resin plate or a resin film, and can be used effectively as the black coating film which is capable of providing low reflection property and black property. In the case where a transparent substrate, that is, non-colored glass plate or a resin film, a resin plate or the like, is used, it becomes useful as a surface coating film of the optical member. In addition, in the case of using a colored glass plate or a resin film, a resin plate or the like, it becomes useful as the black light shading film.

In addition, by providing irregularity onto the surface of a substrate for forming said black coating film, surface irregular property can be increased still more, and matting effect can also be obtained. In the case where the substrate is a metal thin film, a ceramic thin film of a metal oxide of alumina, magnesia, silica or the like as a main component, or a glass plate, predetermined surface irregularity can be formed by etching, nano-imprinting processing, or by matte processing using a shot material. In the case of the matte processing, matte processing by using sand, as the shot material, is general, however, the shot material is not limited thereto. In the case where a resin film or a resin plate is used as a substrate, it is effective that the substrate surface is furnished with irregularity, in advance, by the above method.

The black coating film of the present invention has a structure where a titanium oxide film or a titanium oxy-carbide film is formed with a film thickness of equal to or thicker than 50 nm, on one surface or both surfaces of the above substrate.

2. A Formation Method for the Black Coating Film

A formation method for the black coating film of the present invention is not especially limited, and a known method such as a vacuum deposition method, an ion beam assisted deposition method, a gas cluster-ion beam assisted deposition method, an ion plating method, an ion beam sputtering method, a magnetron sputtering method, a bias sputtering method, an ECR (Electron Cyclotron Resonance) sputtering method, a radio-frequency (RF) sputtering method, a thermal CVD (Chemical Vapor Deposition) method, a plasma CVD method, an photo CVD method can be adopted as appropriate. Among them, production by a sputtering method is preferable. Production by a sputtering method is capable of forming the black coating film having high adhesion strength, on a substrate.

A production apparatus by a sputtering method is not especially limited, and a roll to roll type sputtering apparatus can be used, which takes such constitution that, for example, a roll-like resin film substrate is set on a winding-off roll, a vacuum chamber of a film-formation room is evacuated with a vacuum pump such as a turbo molecular pump, and then film carried out from the winding-off roll passes the surface of a cooling can roll, in the midway, and is wound with a winding roll. At the opposite side of the surface of the cooling can roll, a magnetron cathode is installed, and at this cathode, a target to become a raw material of a film is attached. It should be noted that a film carrying part, which is constituted by the winding-off roll, the cooling can roll and the winding roll, is isolated from the magnetron cathode by a partition wall.

Figure 7:
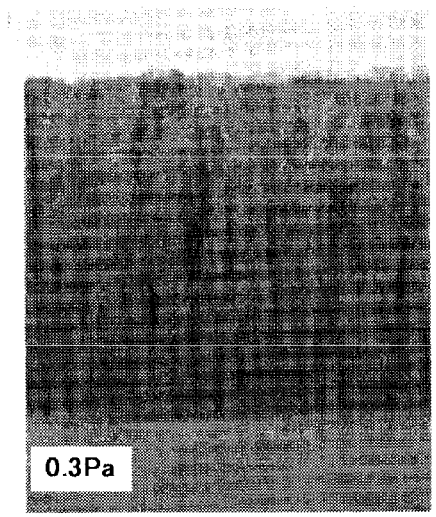
FIG. 7 is a photograph showing a cross-sectional constitution, when the film of the black light shading plate, obtained in Comparative Example 1, is observed with a transmission electron microscope.
Figure 8:
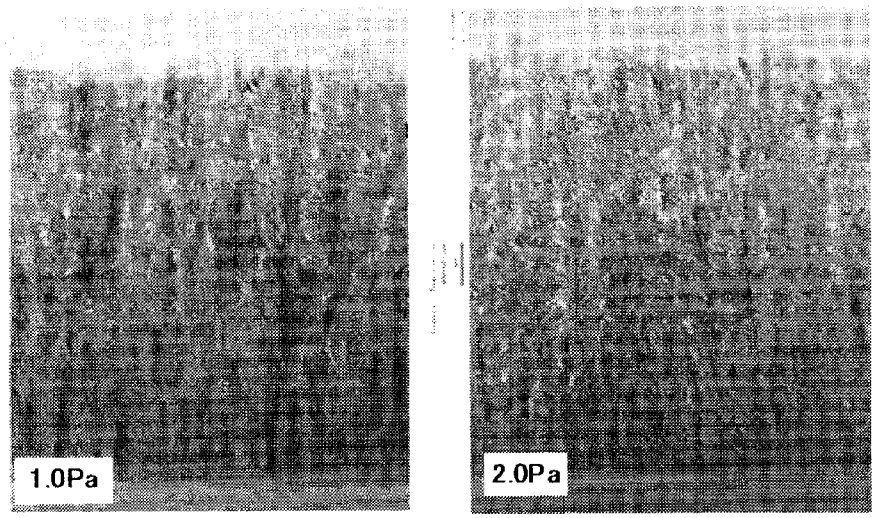
FIG. 8 at the left and at the right are photographs showing cross-sectional structures, when the films of the black light shading plate obtained in Comparative Example 4 and Example 2, respectively, are observed with a transmission electron microscope.
Figure 9:
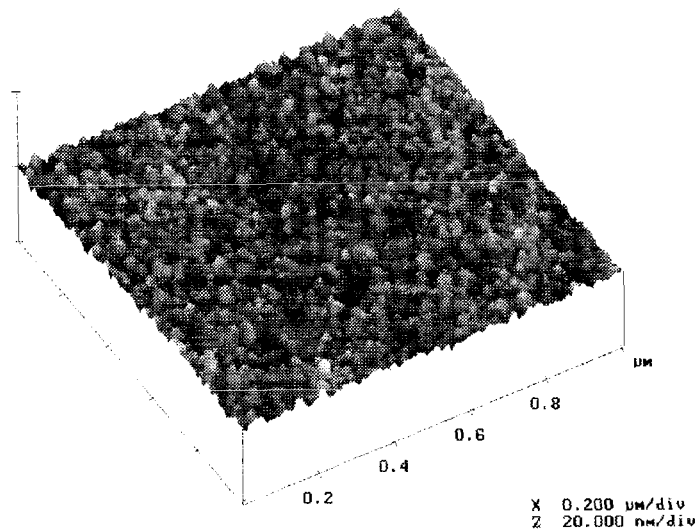
FIG. 9 is a photograph of a film surface of the black light shading plate obtained in Comparative Example 1, observed with an AFM.
Figure 10:
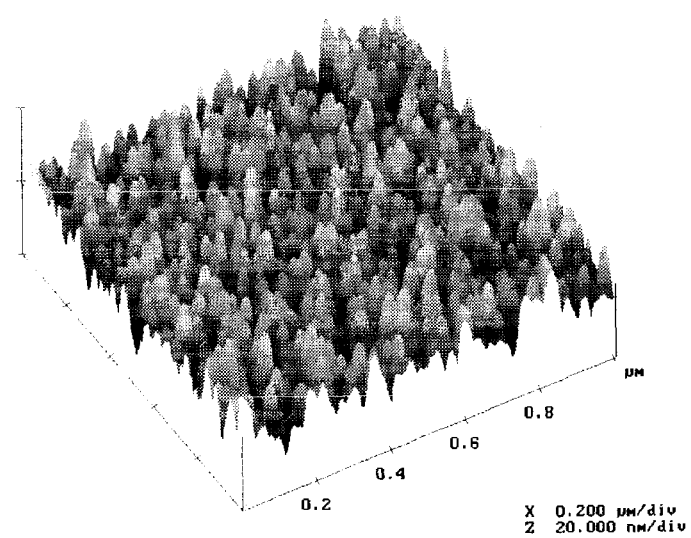
FIG. 10 is a photograph of a film surface of the black light shading plate obtained in Example 2, observed with an AFM.

Usually, sputtering film-formation is performed under a sputtering gas pressure of from 0.2 to 0.8 Pa, in many cases, and under such a condition, as shown in FIG. 7 and FIG. 8 (left Figure), the surface becomes relatively flat. The black coating film of the present invention is produced by sputtering film-formation under a high sputtering gas pressure of equal to or higher than 1.5 Pa, by using a sintered body target of titanium oxide, a mixture of titanium oxide and titanium carbide, or titanium oxy-carbide, and becomes a high quality titanium oxide film or a titanium oxy-carbide film having protrusions at the surface as shown in FIG. 8 (right Figure) and the above composition and constitution.

That is, by sputtering film-formation under a sputtering gas pressure of equal to or higher than 1.5 Pa, by using a sintered body target of titanium oxide, the black coating film, containing Ti and O as main components, an oxygen quantity of from 0.7 to 1.4, as atomicity ratio O/Ti, a constitution of fine columnar crystals assembled, where the longitudinal direction of the crystal extends in a film thickness direction, and protrusions at the film surface, can be obtained. In addition, by sputtering film-formation similarly by using a sintered body target composed of titanium oxide and titanium carbide, or a sintered body target of titanium oxy-carbide, or a sintered body target composed of titanium oxide, titanium carbide and titanium oxy-carbide, the black coating film, containing Ti and O as main components and an oxygen quantity of from 0.7 to 1.4, as atomicity ratio O/Ti, still more containing carbon, with a content thereof of equal to or higher than 0.7, as atomicity ratio C/Ti, and having a constitution of fine columnar crystals assembled, where the longitudinal direction of the crystal extends in a film thickness direction, can be obtained. In both cases, film-formation can be performed by mixing $O_2$ gas into Ar gas in film-formation, so as to introduce oxygen in relatively large quantity into the film.

As described above, in order to improve sintering density of a sintered body of a sputtering target to be used as a raw material for sputtering film-formation, a sintering co-agent is added in many cases. Elements such as Fe, Ni, Co, Zn, Cu, Mn, In, Sn, Nb and Ta may be added, as the sintering co-agent, to the above sintered body target to be used in film-formation of the black coating film of the present invention, in a quantity not to impair characteristics of the above black coating film of the present invention.

In the present invention, it is preferable that the film-formation gas is inert gas containing mainly argon or helium, and a content of oxygen gas is equal to or lower than 0.8% by volume. The content of oxygen gas of over 0.8% by volume may decrease black property of the film.

In addition, in the present invention, the black coating film can be produced as well by using only inert gas containing mainly argon or helium, as the film-formation gas, without supplying oxygen gas at all. As for oxygen in the film in this case, oxygen contained in a sintered body target and/or oxygen in residual gas in a film-formation room are effectively utilized. Oxygen contained in a sintered body target and/or oxygen in residual gas in a film-formation room is very trace quantity. Increase in film-formation gas pressure increases uptake ratio of oxygen in the film-formation room into the film. When quantity of oxygen contained in a sintered body target and/or oxygen in residual gas in a film-formation room is too low, oxygen is not contained sufficiently in the film in sputtering film-formation, under a usual pressure of from 0.2 to 0.8 Pa, and in such a case, by increasing the film-formation gas pressure to 1.5 Pa or higher, a black film can be obtained by making oxygen sufficiently contained.

A film-formation method utilizing oxygen contained in a sintered body target and/or oxygen in residual gas in a film-formation room is an extremely effective method in formation of color uniformly in large area. In a usual film-formation method by supplying oxygen gas and under usual gas pressure, non-uniform supply of oxygen gas easily generates color unevenness caused by unevenness of oxygen content into the film, in the case of film-formation in large area. However, in a film-formation method utilizing oxygen contained in a sintered body target and/or oxygen in residual gas in a film-formation room, color unevenness little generates even in film-formation in large area, because of uniform presence of oxygen at the film-formation surface.

Film-formation temperature is difficult to specify because it depends on kind of a substrate, however, for a metal thin film, a ceramic thin film of a metal oxide such as alumina, magnesia, silica as a main component, or a glass plate, it can be set, for example, at equal to or lower than 400° C., and for a resin plate or a resin film, it can be set, for example, at equal to or lower than 300° C.

3. The Black Light Shading Plate

Figure 2:
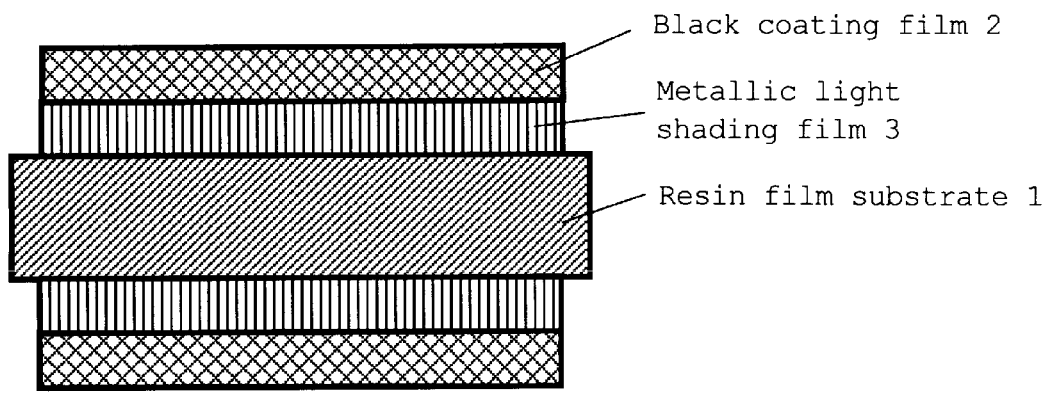
FIG. 2 is a schematic diagram showing a cross-section of the black light shading plate of the present invention, where a light shading thin film is formed on both surfaces of a resin film.

A structure of the black light shading plate of the present invention is shown in FIG. 1 and FIG. 2. It is a structure, where the metallic light shading film 3, having a film thickness of equal to or thicker than 40 nm, and the above black coating film 2 are formed sequentially onto one surface or both surfaces of a substrate 1 selected from a resin film, a resin plate, a metal thin plate or a ceramic thin plate. This is referred to here as the first black light shading plate.

Figure 3:
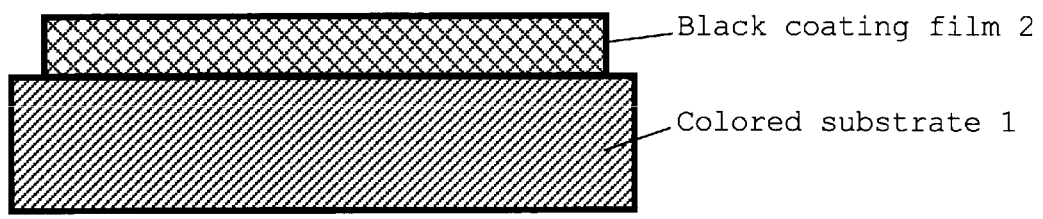
FIG. 3 is a schematic diagram showing a cross-section of the black light shading plate of the present invention, where a light shading thin film is formed on one surface of a colored substrate.
Figure 4:
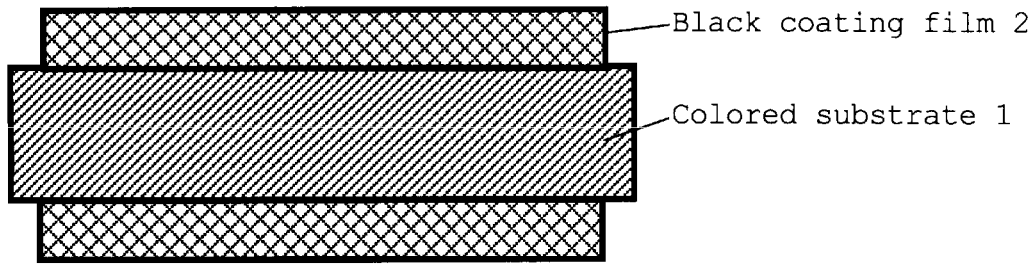
FIG. 4 is a schematic diagram showing a cross-section of the black light shading plate of the present invention, where a light shading thin film is formed on both surfaces of a colored substrate.

In addition, the black light shading plate of the present invention includes one having a structure where the black coating film 2, having a film thickness of equal to or thicker than 20 nm, is formed onto one surface or both surfaces of a colored substrate 1. The structure thereof is shown in FIG. 3 and FIG. 4. This is referred to as hereinafter as the second black light shading plate.

Figure 5:
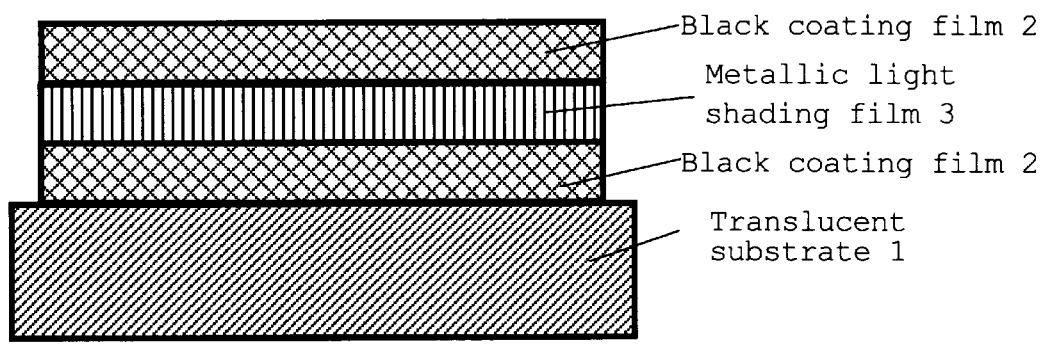
FIG. 5 is a schematic diagram showing a cross-section of the black light shading plate of the present invention, where a light shading thin film is formed on one surface of a translucent substrate.

Still more, the black light shading plate of the present invention includes one having a structure where the above black coating film 2, the metallic light shading film 3, having a film thickness of equal to or thicker than 100 nm, and the above black coating film 2 are sequential formed, at one surface of a translucent substrate 1. The structure thereof is shown in FIG. 5. This is referred to as hereinafter as the third black light shading plate.

By having such a structure, an average optical density, in a visible light region, that is, in a wavelength of from 380 to 780 nm, becomes equal to or higher than 4.0, and a direct optical reflectance at the surface of the black coating film, in a wavelength of from 380 to 780 nm, becomes equal to or lower than 18%, and can attain optical members. The average optical density of equal to or higher than 4.0 provides a transmittance of nearly zero, showing complete light shading property. Here, optical density (OD) is a function of transmittance (T(%)), represented by the following expression. In addition, direct optical reflectance at the surface of the black coating film represents reflectance of reflected light which obeys the law of reflection and reflects from the surface in the same angle as incident angle of incident light.

$$OD = \log(100/T)$$

It should be noted that, the first, the second and the third black light shading plates of the present invention may utilize thin film-formation of other thin film (for example, an organic film, a carbon film, a diamond-like carbon film containing fluorine, etc.) having lubrication property or low friction property, on the surface of the above black coating film, as long as characteristics of the present invention are not impaired. The carbon film or the diamond-like carbon film can be formed by sputtering, therefore, the metallic light shading film, the black coating film of the present invention, the carbon film, or the diamond-like carbon film can be formed continuously, by mounting a carbon target on a sputtering apparatus, and is thus useful.

Explanation will be given below in detail on the first black light shading plate, the second black light shading plate and the third black light shading plate.

(1) The First Black Light Shading Plate

In the first black light shading plate of the present invention, as a resin film to be used as a substrate, a film constituted by one or more kinds of materials selected from, for example, polyethylene terephthalate (PET), polycarbonate (PC), polyethylene naphthalate (PEN), polyimide (PI), aramid (PA), polyphenylene sulfide (PPS), or polyether sulfone (PES), or a film having acrylic hard coating at the surface of these films can be utilized.

Because these resin films generally have light transmitting property, it is necessary to form the black coating film of the present invention, after forming the metallic light shading film, with a film thickness of equal to or thicker than 40 nm, at the surface, in order to furnish complete light shading property. In this way, the black light shading plate excellent in lightweight, having sufficient light shading property and black property and low reflection property can be attained.

A film thickness of the black coating film, to be formed on such a substrate, is equal to or thicker than 50 nm, preferably equal to or thicker than 80 nm or 100 nm, and more preferably equal to or thicker than 150 nm. The film thickness of the black coating film of below 50 nm provides an average value of direct optical reflectance at the surface of the black coating film, in a wavelength of from 380 to 780 nm, of over 18%, and an optical density of below 4.0, and does not provide complete light shading property. On the other hand, the case where the film thickness is over 200 nm provides the black coating film with complete light shading property, however, raises a problem of making sputtering time longer and cost higher.

In addition, a lightness (hereinafter described as L*) of the black light shading plate, where the black coating film is formed on the surface of the metallic light shading film, is preferably from 25 to 45, more preferably equal to or smaller than 40. Here the L* value represents brightness (black-and-white degree) shown by a CIE color specification system of color, and is determined by spectral reflectance in a visible light region, and the smaller L* value means the higher black degree. In order to attain the L* value of the black light shading plate below 25, film thickness of the black light shading plate must be relatively thicker. In this way, because film thickness of the black coating film becomes over 200 nm, black degree becomes higher and low reflection property can be attained, resulting in complete light shading property, however, it raises a problem of making sputtering time longer and cost higher. On the other hand, the case where the L* value is over 45 provides a reversed state from the above, and raises a problem of insufficient black degree and increased direct optical reflectance at the surface of the black coating film, and thus not preferable.

In order to attain a lightweight black light shading plate usable even under high temperature environment, it is preferable to use a ply resin film having heat resistance as a substrate. In the case of furnishing heat resistance of equal to or higher than 200° C. to the black light shading plate, a film constituted by one or more kinds of heat resistant materials selected from polyimide (PI), aramid (PA), polyphenylene sulfide (PPS), or polyether sulfone (PES) is preferable, and among them a polyimide film is a particularly preferable film, because of having the highest heat resistance temperature of equal to or higher than 300° C.

A film thickness of the above resin film is preferably in a range of from 5 to 200 µm, more preferably from 10 to 150 µm and most preferably from 20 to 125 µm. The resin film thinner than 5 µm provides poor handling property and is difficult to be handled, and easily gives surface defect such as scratch or folding mark to the film, and thus not preferable. The resin film thicker than 200 µm makes impossible for a plurality of light shading blade pieces to be mounted on the diaphragm device or the apparatus for light intensity adjustment, where compact sizing has been progressing, resulting in unsuitable depending on applications.

In addition, when the resin film has surface irregular property and generates irregularity at the surface of the black coating film, direct optical reflectance of light is reduced, that is, matting effect can be provided, therefore, it becomes a preferable one as optical members. In particular, a surface roughness (arithmetic average height) of the black coating film of from 0.05 to 0.7 µm, provides a direct optical reflectance at the surface of the black coating film, in a wavelength of from 380 to 780 nm, of equal to or lower than 0.8%, and can attain the black light shading plate with very low reflection, and thus preferable. Here arithmetic average height is called also as arithmetic average roughness, and is a value obtained by extracting by standard length from a roughness curve in a direction of an average line thereof, and by summing and averaging absolute values of deviations from the average line to a measurement line of this extracted portion.

Irregularity of the substrate surface can be formed to the predetermined surface irregularity by nano-imprinting processing, or matte processing using a shot material. In the case of the matte processing, matte processing by using sand, as the shot material, is general, however, the shot material is not limited thereto. In the case where the metallic light shading film is formed by using a resin film, as a substrate, it is effective that the surface of the resin film is furnished with irregularity, in advance, by the above method.

In addition, in the black light shading plate of the present invention, in the case where a resin film is used as a substrate, because the resin film is soft, it is easily deformed by receiving influence of stress of the film to be formed at the surface. In order to avoid this, it is effective to form a film with the same configuration and the same film thickness symmetrically to the film at the both surfaces of the resin film. That is, the black light shading plate, obtained by forming, onto the both surfaces of the resin film, the metallic light shading film, having the same composition and the same film thickness and, and then forming, onto the both surfaces (onto the metallic light shading film), the above black coating film, having the same composition and the same film thickness, provides one with small deformation and is thus preferable.

On the other hand, as a substrate of other than the resin film, a thin film of a metal such as SUS, SK, Al or Ti, a ceramic thin film composed of a metal oxide such as alumina, magnesia, silica, a glass plate, a resin plate or the like can be used.

(2) The Second Black Light Shading Plate

As for the second black light shading plate of the present invention, it has a structure where a colored resin film is used as a substrate 1, and the black coating film 2, with a film thickness of equal to or thicker than 20 nm, is formed at one surface or both surfaces thereof.

The colored resin film is desirable to be colored to black, brown or blackish brown or the like. As the colored resin film, a film constituted by one or more kinds of materials selected from, for example, polyethylene terephthalate (PET), polycarbonate (PC), polyethylene naphthalate (PEN), polyimide (PI), aramid (PA), polyphenylene sulfide (PPS), or polyether sulfone (PES) is used as a base, and a film with reduced transmittance by impregnation the black fine particles such as carbon black or titanium black into the inside, is utilized. In addition, by making the surface of said colored resin film irregular, surface irregular property of the black coating film increases still more, and effect of matting can be obtained as well.

A film thickness of the above resin is preferably in a range of from 5 to 200 μm, more preferably from 10 to 150 μm and most preferably from 20 to 125 μm. The resin film thinner than 5 μm provides poor handling property and is difficult to be handled, and easily gives surface defect such as scratch or folding mark to the film, and thus not preferable. The resin film thicker than 200 μm makes impossible for a plurality of light shading blade pieces to be mounted on the diaphragm device or the apparatus for light intensity adjustment, where compact sizing has been progressing, resulting in unsuitable, depending on applications.

Still more, because the colored resin film is not transparent, light transmittance decreases more and light shading property increases, in a wavelength of from 380 to 780 nm, which is a visible light region, as compared with a transparent resin plate or a transparent resin film having high transmittance. Therefore, it is capable of making film thickness of the black coating film formed on the substrate thinner. The colored resin film preferably has light transmittance, in a wavelength of from 380 to 780 nm, of equal to or less than 1%, and more preferable equal to or less than 0.1%.

A film thickness of the black coating film formed on such a substrate is preferably in a range of from 20 to 200 nm, and more preferably from 30 to 150 nm. The film thickness of the black coating film of equal to or thinner than 20 nm provides an optical density of below 4, in a wavelength of from 380 to 780 nm, even by using the colored resin film having an optical transmittance, in a wavelength of from 380 to 780 nm, of equal to or lower than 0.1%, and cannot provide complete light shading property. On the other hand, the film thickness of over 200 nm provides the black coating film with complete light shading property, however, raises a problem of making sputtering time longer and cost higher.

The $L^*$ value of the black light shading plate, where the black coating film is formed on the colored resin film, is from 25 to 45, and more preferably from 25 to 40. The $L^*$ value of the black light shading plate of below 25 provides higher black degree and lower reflection property, and provides complete light shading property, however, makes film thickness of the black coating film over 200 nm. Therefore, it raises a problem of making sputtering time longer and cost higher. On the other hand, the case where the $L^*$ value is over 45 raises a problem of insufficient black degree and increased direct optical reflectance at the surface of the black coating film, and thus not preferable.

(3) The Third Black Light Shading Plate

Explanation will be given next in detail on the third black light shading plate of the present invention. The third black light shading plate takes a structure where the above black coating film (A), the metallic light shading film (B) having a film thickness of equal to or thicker than 100 nm, and the black coating film (A) similar to the above, are laminated and formed sequentially onto one surface of a translucent substrate such as a resin film or a resin plate, or a glass plate.

Here, reason for specifying the film thickness of the metallic light shading film (B) at equal to or thicker than 100 nm is because the thickness of below 100 nm does not show complete light shading property of an optical density of equal to or higher than 4.

In addition, because the above film is formed only at one surface of the substrate, it has advantage of easy production and enabling of low cost production as compared with the case of formation at both surfaces. The first black light shading plate includes a structure where a film is formed at one surface, however, when the substrate is translucent, because color of the substrate side of the surface, which is not formed with the film, reflects color of the metallic light shading film (B), reflectance becomes high and black degree becomes low. However, in the case of a structure of this third black light shading plate, because color of the black coating film at the first layer from the substrate side is reflected, even in the case of the translucent substrate, black degree and low reflection property can be increased also at the substrate side of the surface, which is not formed with the film. That is, the third black light shading plate results in having performance equivalent to the black coating film having black degree and low reflection property at both surfaces, even in one surface film-formation which is easy to produce.

In the case of using a resin film or a resin plate as a substrate, for applications requiring heat resistance of equal to or higher than 200° C., it is preferable that one or more kinds of materials selected from polyimide (PI), aramid (PA), polyphenylene sulfide (PPS), or polyether sulfone (PES) is used, as a base. In the case where heat resistance of equal to or higher than 200° C. is not necessary, a film constituted by one or more kinds of materials selected from polyethylene terephthalate (PET), polycarbonate (PC), polyethylene naphthalate (PEN)) may be used.

This translucent substrate may be colored to black, brown, yellowish brown, blackish brown or the like, other than transparent color. As for the colored resin film or the colored resin plate, those obtained by impregnating the colorants such as organic pigments or fine particles with various colors to inside may be used.

In addition, by making the substrate surface irregular, surface gloss is decreases, and effect of matting can be obtained.

A film thickness of the above resin is preferably in a range of from 5 to 200 μm, more preferably from 10 to 150 μm and most preferably from 20 to 125 μm. The resin film thinner than 5 μm provides poor handling property and is difficult to be handled, and easily gives surface defect such as scratch or folding mark to the film, and thus not preferable. The resin film thicker than 200 μm makes impossible for a plurality of light shading blade pieces to be mounted on the diaphragm device or the apparatus for light intensity adjustment, where compact sizing has been progressing, becomes to be unsuitable, depending on applications, therefore, it is not preferable.

A film thickness of the black coating film is preferably in a range of from 20 to 200 nm, and more preferably from 30 to 150 nm. The film thickness of the black coating film of below 20 nm leaves strong influence of color viewed from the rear surface of the substrate, because of thin film thickness. The case where the film thickness is over 200 nm provides black color viewed from the rear surface of the substrate, however, raises a problem of making sputtering time longer and production cost higher because film thickness is very thick.

Lightness ($L^*$) at the film surface side of the black light shading plate, formed with the laminated body of a black light shading thin film, is from 25 to 45, and in addition, lightness ($L^*$) at the translucent substrate surface side of the black light shading plate, formed with the laminated body of a black light shading thin film, is from 25 to 45. The lightness ($L^*$) is preferably equal to or lower than 40.

4. The Laminated Body of a Black Light Shading Thin Film

In addition, in the third black light shading plate of the present invention, the laminated body of a black light shading thin film, where the black coating film (A), the metallic light shading film (B) having a film thickness of equal to or thicker than 100 nm, and the black coating film (A), similar to the above, are laminated and formed sequentially, is used.

Light shading function of low reflection property can be furnished to this laminated body of a black light shading thin film, by directly forming this at the surface of transparent optical members such as an optical lens. In particular, when a fixed diaphragm is desired to be formed directly at the surface of a lens, use of this thin film laminated body is effective. This thin film laminated body can be formed at the surface of the optical members accurately in an arbitrary shape, by using a photoresist method. In the case of use under environment requiring heat resistance, like an optical lens of a projector, or a lens to be used in the reflow step etc. a titanium oxy-carbide film, having an atomicity ratio O/Ti of from 0.7 to 1.4, and an atomicity ratio C/Ti of equal to or higher than 0.7, is preferable for the black light shading plate (A), while for the metallic light shading film (B), it is preferable to be a titanium carbide film or a titanium oxy-carbide film, having an atomicity ratio C/Ti of equal to or higher than 0.6, and an atomicity ratio O/Ti of equal to or lower than 0.9. By adopting such a composition, heat resistance at 300° C. can be exerted.

5. The Metallic Light Shading Film (B)

The metallic light shading film is one formed onto a substrate of the above first black light shading plate, or onto a substrate plate of the above third black light shading plate, and onto the black coating film of the above laminated body of a black light shading thin film, and a metal material containing one or more kinds of elements selected from titanium, tantalum, tungsten, cobalt, nickel, niobium, iron, zinc, copper, aluminum, or silicon, as main components, can be used. Among them a metal material such as Ti, Ni, Cu, Al or NiTi alloy is preferable.

In addition, a nitride, a carbide, a carbonitride, a carboxide, a nitroxide, and a carbonitroxide of these metals can be used. In particular, a metal carbide material such as a titanium carbide, a tungsten carbide and a molybdenum carbide is preferable due to having excellent oxidation resistance and heat resistance under high temperature environment. Among them, titanium carbide is particularly preferable due to having relatively high black degree and excellently low reflection property of the surface, and thus increases effect of making black property. In addition, a titanium oxy-carbide film can be utilized as the metallic light shading film having excellent heat resistance. When the metallic light shading film is the titanium carbide film or the titanium oxy-carbide film, it is preferable that a carbon content is equal to or higher than 0.6, as atomicity ratio C/Ti in said film. In the case of the titanium oxy-carbide film, it is important that an oxygen content in the film is equal to or lower than 0.4, as atomicity ratio O/Ti, to exert sufficient light shading property.

Such a film is common to the above black coating film (A) in view of carbon content and oxygen content, however, different points from the black coating film (A) are that it has an assembled constitution of not a constitution of protruded fine columnar crystals, where the tip extends in a film thickness direction, but relatively flat columnar crystals. It should be noted that surface of the metallic light shading film formed has the same degree of irregularity as that of the substrate.

As for the metallic light shading film to be used in the present invention, for example, in noticing the adhesion to a resin film substrate, bonding of atoms constituting the film, that is, ratio of metallic bonding and ratio of ionic bonding gives influence on adhesive strength to the resin film. When the metallic light shading film has an atomicity ratio O/Ti of equal to or lower than 0.4, ionic bonding is generated with the film substrate and adhesive strength is increased, due to higher ratio of ionic bonding to bonding of atoms configuring the film, and is thus preferable.

In addition, the metallic light shading film to be used in the present invention may be one where the titanium oxy-carbide films having different composition of carbon content and/or oxygen content are laminated, or may be the titanium oxy-carbide film where carbon content and/or oxygen content change continuously in a film thickness direction, as long as average composition of the whole film is within a composition range specified by the present invention.

In general, bonding between a resin film, which is an organic substance, and a metal film or the like, which is an inorganic substance, is weak. The situation is the same, in forming the light shading thin film of the present invention at the surface of the resin film. In addition, in order to increase adhesive strength of the film, it is effective to increase film surface temperature in film-formation. However, because increase in temperature to equal to or higher than 130° C. may be over glass transition point or decomposition temperature in some cases, depending on kind of the resin film, as in the case of PET, it is desirable that the surface temperature of the resin film in film-formation is set as low temperature as possible, for example, equal to or lower than 100° C. In order to form the metallic light shading film, in high adhesion force, at the surface of the resin, film with a surface temperature of equal to or lower than 100° C., it is indispensable that the titanium oxy-carbide film having set an atomicity ratio O/Ti at equal to or lower than 0.4 in the film, is used and still more a crystalline film is formed.

As for the light shading thin film in the present invention, in noticing optical characteristics of the film, the case where oxygen content is below 0.2 as an atomicity ratio O/Ti is not preferable, because the titanium oxy-carbide film gives metallic color and low reflective property or black property becomes inferior. In addition, the case where oxygen content is over 0.4, as an atomicity ratio O/Ti, is not preferable, because transmittance of the film becomes too high and light absorption function becomes poor, resulting in impairment of low reflection property or light shading property.

The atomicity ratio C/Ti or the atomicity ratio O/Ti in the light shading thin film can be analyzed, for example, by an XPS. Because large amount of oxygen is bonded at the most front surface of the film, by measurement after shaving the most front surface to the depth of several tens nm in vacuum by sputtering, the atomicity ratio C/Ti or the atomicity ratio O/Ti in the film can be determined quantitatively.

The metallic light shading thin film in the present invention has a sum of film thickness of equal to or thicker than 40 nm. However, the film thickness of thicker than 250 nm is not preferable, because film-formation of the light shading thin film takes long period of time, production cost increases, or material cost increases due to increase in necessary film-formation material.

In order to produce the metallic light shading thin film in the present invention, similarly as in the case of the above black coating film, sputtering film-formation can be utilized. As a production apparatus, a substrate fixing-type sputtering apparatus can be used when the substrate is a plate-like body such as a resin plate, a metal thin plate or a ceramic thin plate, while a roll to roll type sputtering apparatus as described above can be used for the case of the resin film.

In sputtering film-formation, gas pressure differs also depending on kind of an apparatus, therefore, it is difficult to unconditionally specify, however, it must be set lower than the case of the above black coating film. For example, such a method can be adopted that uses Ar gas, or Ar gas mixed with $O_2$ within 0.05%, as sputtering gas, under sputtering gas pressure of equal to or lower than 1 Pa, preferably from 0.2 to 0.8 Pa.

Explanation will be given below in detail on the case of using the resin film as a substrate: because sputtered particles reaching the substrate have high energy, a crystalline film is formed onto the resin film substrate, and strong adhesion is expressed between the film and the resin film. The gas pressure in film-formation of below 0.2 Pa makes argon plasma in a sputtering method unstable, due to low gas pressure, and deteriorates film quality. In addition, the gas pressure of below 0.2 Pa enhances re-sputtering mechanism of the film, where recoil argon ions are deposited at the substrate, and easily inhibits formation of a dense film. In addition, the case where the gas pressure in film-formation is over 0.8 Pa makes crystal growth of the film difficult, because energy of sputtered particles reaching the substrate is low, makes particles of the metallic film coarse, and makes film quality of not dense crystalline property, resulting in weak adhesion strength to the resin film substrate and peeling of the film. Such a film cannot be used as the metallic light shading film for heat resistant applications. In this way, the metallic light shading film with an excellent crystalline property can be formed stably, by using pure Ar gas, or Ar gas mixed with trace quantity of $O_2$ (for example, within 0.05%). Mixing of $O_2$ in a content of equal to or more than 0.1% is not preferable, because it may deteriorate crystalline property of the thin film in some cases.

In addition, surface temperature of the resin film in film-formation influences crystalline property of the metal film. The higher film surface temperature in film-formation generates crystal alignment of the sputtered particles the more easily, and provides the better crystalline property. However, there is limitation also in heating temperature of the resin film, and the surface temperature should be set at equal to or lower than 400° C., even for a polyimide film having the most excellent heat resistance. Because increase in temperature to equal to or higher than 130° C. may be over glass transition point or decomposition temperature in some cases, depending on kind of the resin film, it is desirable that the surface temperature of the resin film in film-formation is set as low temperature as possible, for example, equal to or lower than 100° C., for example in PET or the like. In addition, in noticing production cost, in consideration of heating time or thermal energy for heating, it is effective for cost reduction that film-formation is performed at as low temperature as possible. Surface temperature of the film in film-formation is preferably equal to or lower than 90° C., and more preferably equal to or lower than 85° C.

In addition, the resin film substrate receives natural heating from plasma in film-formation. Surface temperature of the resin film substrate during film-formation can be maintained easily at predetermined temperature, by adjustment of gas pressure and input power to a target, or film carrying speed, and by thermal radiation from thermal electrons or plasma falling on the substrate from the target. The lower gas pressure, the higher input power or the slower film carrying speed provides the higher heating effect by natural heating from plasma. Even in the case of a sputtering apparatus, where the resin film is subjected to contacting with a cooling can in film-formation, film surface temperature becomes far higher temperature than cooling can temperature, due to influence of natural heating. However, in a sputtering apparatus, where the target is installed at the position opposing to the cooling can, the film is carried under cooling with the cooling can. Because temperature of the film surface by natural heating largely depends on can temperature as well, it is effective that temperature of the cooling can is set as high as possible, and carrying speed is set slow, to utilize effect of natural heating in film-formation. Film thickness of the metal film is controlled by carrying speed of the film in film-formation, and input power to the target, and the slower carrying speed and the higher input power to the target make it the thicker.

Explanation was given above on the case of forming a metal film as the metallic light shading film, however, similar condition can be adopted also in the case of forming a metal carbide film.

6. Applications of the Black Coating Film or the Black Light Shading Plate

The black coating film of the present invention can be applied as a surface coating film of optical members, and the black light shading plate can be utilized as a fixed diaphragm of a digital camera or a digital video camera, mechanical shutter blades, or a diaphragm for passing only certain constant light quantity (iris), still more diaphragm blades of the diaphragm device for light intensity adjustment of a liquid crystal projector (auto iris), or a heat resistant light shading tape for shading light, which enters from the rear surface of an image sensor such as CCD, or CMOS, by performing punching processing to a specific shape with caution not to generate a crack at the end surface.

By performing punching processing for the black coating film of the present invention in a state formed at the surface, or for the black light shading plate as it is, to a specific shape, they are used as a plurality of diaphragm blades of diaphragm blades of the diaphragm device for light intensity adjustment (auto iris), and applied to a mechanism which is capable of moving those diaphragm blades, and adjusting light quantity by changing diaphragm opening size.

Figure 6:
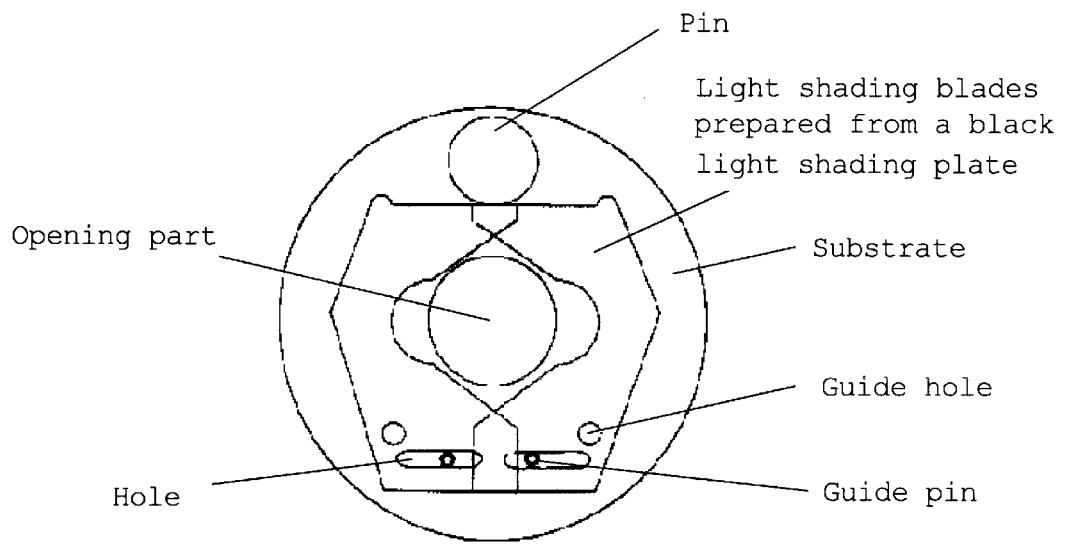
FIG. 6 is an exemplary diagram showing a diaphragm mechanism of a diaphragm device for light intensity adjustment mounted with black light shading blades, which are produced by punching process of a film-like light shading plate of the present invention.

FIG. 6 shows a diaphragm mechanism of the diaphragm device for light intensity adjustment, mounted with black light shading blades, which are produced by punching processing of the black light shading plate of the present invention. At the black light shading blades, which are produced by using the black light shading plate of the present invention, there are installed guide holes and holes for attaching a substrate installed with guide pins which are engaged with a drive motor, and a pin for controlling operated position of the light shading blades. In addition, at the center of the substrate, there is an opening part where lamp light passes, and light shading blades may take various shapes depending on a structure of the diaphragm device. The black light shading plate using the resin film as a base substrate can reduce weight and is capable of making compact sizing and reducing power consumption of a drive member for driving the light shading blades.

The diaphragm device for light intensity adjustment of a liquid crystal projector receives significant heating by irradiation of the lamp light. Therefore, the apparatus for light intensity adjustment mounted with the diaphragm blades superior in heat resistance and light shading, which are produced by processing the black light shading plate of the present invention, is useful. In addition, in order to produce a lens unit, even in the case of assembling a fixed diaphragm or a mechanical-type shutter by the reflow step, use of the fixed diaphragm or the shutter blades, obtained by processing the black light shading plate of the present invention, is very useful, because characteristics never change even under heating environment in the reflow step. Still more, the fixed diaphragm inside the lens unit of a video camera monitor mounted on a vehicle receives significant heating by the sun light in summer, therefore, application of the fixed diaphragm produced from the black light shading plate of the present invention is very useful, from the similar reason.

In addition, in the black light shading plate of the present invention, a heat resistant light shading tape or sheet can be obtained by installing an adhesive layer onto one surface or both surfaces of the light shading plate.

Adhesives for forming the adhesive layer is not especially limited, and adhesives suitable for use environment such as temperature and humidity can be selected, among conventionally used ones as adhesive sheets.

As the general adhesives, acryl-type adhesives, rubber-type adhesives, polyurethane-type adhesives, polyester-type adhesives, or silicone-type adhesives and the like can be used. In particular, in the case where the lens unit of a mobile phone is assembled in the re flow step, the acryl-type adhesives or silicone-type adhesives having high heat resistance, is preferable, because heat resistance is required.

In addition, as a method for forming the adhesive layer at the black light shading plate, the layer formation can be performed by a conventionally known method, for example, such as, a bar coating method, a roll coating method, a gravure coating method, an air doctor coating method, or a doctor blade coating method.

Thickness of the adhesive layer is not especially limited, however, from 2 to 60 μm is preferable. When this range is adopted, adhesion can be attained easily and peeling off of the layer is difficult, even in a compact sized and thin walled digital camera, or a camera-equipped mobile phone In a more compact and thinner digital camera, and a camera-equipped mobile phone, more compact and thinner ones are used also as component parts to be mounted. As described above, in the case where an image sensor such as CCD or CMOS, or a FPC mounted with the image sensor is a thin type, leaked light increases which transmits the FPC and enters into the rear surface of the image sensor, in addition to leaked light from the front surface of the image sensor. This leaked light to the rear surface of the image sensor causes viewing of an image of a wiring circuit of the FPC in an imaging region, resulting in deterioration of quality of the imaging. Because a heat resistant light shading tape, where the adhesive layer is installed at one surface or both surfaces of the black light shading plate of the present invention, can be adhered onto the peripheral part of the rear surface side of the image sensor such as CCD or CMOS, with the adhesive layer, it is useful to shade light which enters from the rear surface of the image sensor such as CCD or CMOS.

EXAMPLES (A Target for Sputtering)

Titanium oxide targets were produced from a mixture of powders of titanium oxide and metal titanium, by a hot press sintering method. Atomicity ratio O/Ti of the sintered body target was controlled in response to blending ratio of titanium oxide and metal titanium.

In addition, targets of titanium oxy-carbide were produced from a mixture of powders of titanium oxide, titanium carbide and metal titanium by a hot press method. The targets of titanium oxy-carbide having the above atomicity ratio C/Ti and atomicity ratio O/Ti were produced by changing blending ratio of each raw material. Composition of the sintered body thus produced was analyzed quantitatively with XPS (ESCALAB220i-XL, manufactured by VG Scientific Co., Ltd.), after shaving the surface of the cross-section of the sintered body in vacuum by a sputtering method.

Still more, metal targets such as a NiTi target (containing 3% by weight of Ti), a Cu target, an Al target, and a Ti target were also used.

(Preparation of the Black Coating Film)

Titanium oxide films or titanium oxy-carbide films were produced by the following procedure, by a sputtering method, by using sintered body targets (6 inch Φ×5 mmt, purity 9N) of titanium oxy-carbide or titanium oxide, having different compositions in a range of an atomicity ratio C/Ti of from 0.34 to 0.99, and an atomicity ratio O/Ti of from 0.05 to 0.81 (refer to Table 1).

The above targets for sputtering were attached at a cathode for a target of a non-magnetic substance of a direct current magnetron sputtering apparatus (SPF503K, manufactured by TOKKI CORP.), and a substrate was attached so as to oppose to said target.

In sputtering film-formation, distance between said target and the substrate was set at 60 mm, and when vacuum degree inside a chamber reached $2\times10^{-5}$ to $4\times10^{-5}$ Pa, Ar gas with a purity of 99.9999% by mass was introduced to the inside of chamber to attain a gas pressure of from 0.3 to 4.0 Pa, and a direct current power of 300 W was input between the target and the substrate to generate direct current plasma. Films with predetermined thickness were formed onto the substrate without heating the substrate. In addition, film-formation by introducing relatively large quantity of oxygen into the film was also performed, by mixing $O_2$ gas into Ar gas in film-formation.

(Direct Optical Reflectance and Parallel Light Transmittance of the Black Coating Film)

Direct optical reflectance and parallel light transmittance, in a wavelength of from 380 to 780 nm, of the obtained black coating film were measured with a spectrophotometer (V-570, manufactured by JASCO CORP.), and optical density (represented by OD) was calculated from the parallel light transmittance (T), according to the following expression:

$$OD=\log(100/T)$$

Direct optical reflectance of light at the black coating film represents reflectance of reflected light which obeys the law of reflection and reflects from the surface in the same angle as incident angle of incident light. It was measured under the incident angle of 5°. In addition, the parallel light transmittance means a parallel component of light ray transmitting through the black coating film, and represented by the following expression:

$$T(\%)=(I/I_0)\times100$$

(wherein T is parallel light transmittance represented by percent; $I_0$ is intensity of parallel irradiation light injected to a sample; and I is intensity of transmitted light of a component parallel to the above irradiation light, in transmitted light through the sample.)

(Composition, Crystalline Property, Surface Irregularity, Surface Resistance and Heat Resistance of the Black Coating Film)

Composition (atomicity ratio O/Ti, atomicity ratio C/Ti) of the obtained black coating film was analyzed quantitatively with XPS (ESCALAB220i-XL, manufactured by VG Scientific Co., Ltd.). It should be noted that, in the quantitative analysis, composition analysis inside the film was performed after sputter-etching the surface of the obtained black coating film by about 20 nm.

Crystalline property of the black coating film was investigated by X-ray diffraction measurement by utilization of CuKα ray. Cross-sectional constitution of the film was observed by using a high resolution transmission electron microscope (it may be described as TEM). In addition, crystallite diameter (width) of a fine columnar crystal was calculated by the Scherrer method, by using half width of a TiC (111) peak and diffraction angle (2θ deg.) of the peak, in measurement of X-ray diffraction.

Surface irregularity of the black coating film was measured by using an atomic force microscope (it may be described as AFM). Surface resistance of the black coating film was measured by a four probe method.

In addition, as for heat resistance of the black coating film, presence or absence of color change of the film was checked by performing heating treatment at 200° C. for 1 hr or at 270° C. for 1 hr in an air oven.

(L* Value of the Black Light Shading Plate)

L* value of the obtained black light shading plate was measured with a colorimeter (Product name: Spectroguide, manufactured by BYK-Gardner GmbH), under condition of a light source of D65, and a viewing angle of 10°)

Examples 1 to 4 and Comparative Examples 1 to 4

Sputtering film-formation was performed by using a sintered body target of titanium oxy-carbide with an atomicity ratio O/Ti of 0.05, onto a glass substrate (Corning 7059) with a thickness of 1.1 mm, as a substrate, under various film-formation gas pressures. Measurement results of characteristics of the produced films are shown in Table 1.

In Comparative Examples 1 to 4, film-formation was performed under the film-formation gas pressure of from 0.3 to 1.0 Pa, and under the condition wherein a mixing quantity of oxygen to be introduced into Ar gas is equal to or lower than 0.05%, and films were obtained having film composition of 0.98 to 1.01 as the atomicity ratio C/Ti and equal to or lower than 0.67 as the atomicity ratio O/Ti, and having high optical reflectance and metallic color. Such films can be utilized as a metallic light shading film of the black light shading plate to be described later, because of having low transmittance, however, it is difficult to be utilized as a surface coating film of optical members, because of having high reflectance.

Figure 11:
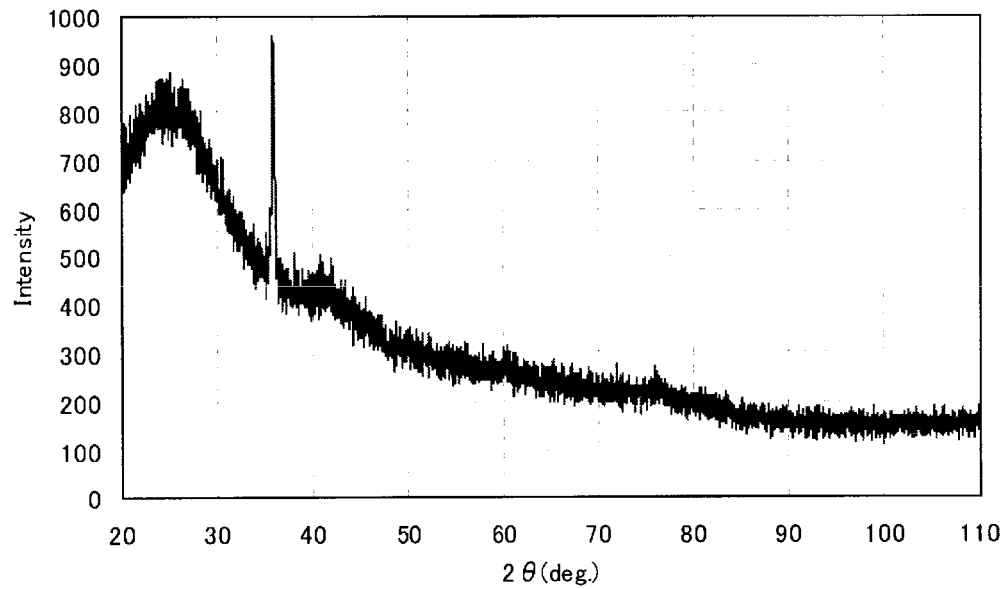
FIG. 11 is a chart showing measurement result of an X-ray diffraction pattern of the black coating film obtained under condition of Comparative Example 1.
Figure 12:
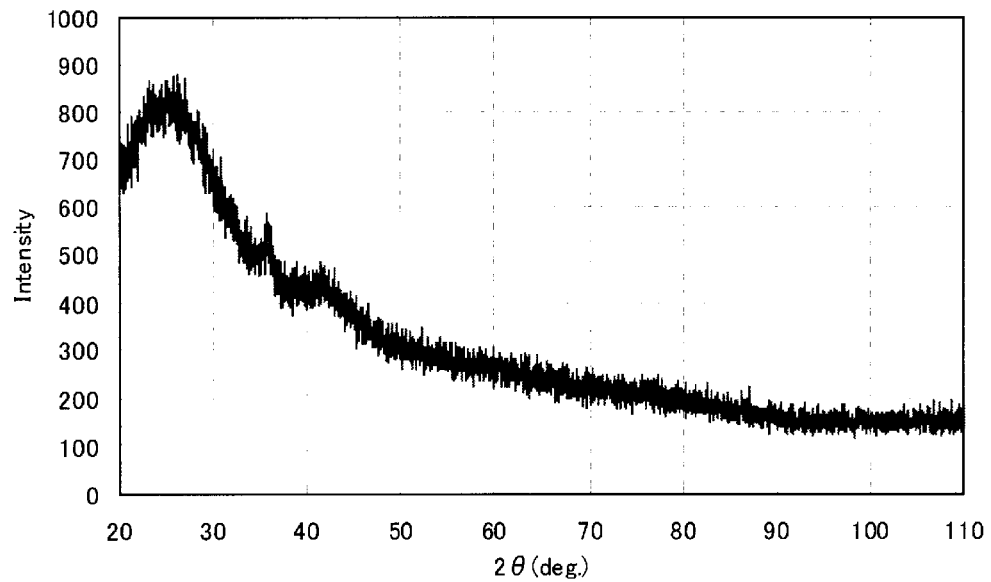
FIG. 12 is a chart showing measurement result of an X-ray diffraction pattern of the black coating film obtained in Example 2.

In Examples 1 to 4, films were formed by sputtering film-formation under the high gas pressures of from 1.5 to 4.0 Pa. As compared with the films of Comparative Examples 1 to 4, which were formed under the gas pressures of equal to or lower than 1.0 Pa, oxygen quantity incorporated in the film was high, and the higher content ratio thereof (O/Ti) was provided by the higher Ar gas pressure. It is because the high Ar gas pressure increases number of collision of sputtered particles, jumped out from the surface of the target, with gas molecules till reaching the substrate, resulting in easy incorporation of the sputtered particles into the film by reaction with oxygen. Probably due to containing more quantity of oxygen in the film, color of the film showed black, and average reflectance of the film itself, in a wavelength of from 380 to 780 nm, decreased to equal to or lower than 18%. As for crystalline property of the film evaluated by X-ray diffraction measurement, all of the films of Comparative Examples 1 to 4 and Examples 1 to 4 were crystalline properties (an X-ray diffraction pattern of Comparative Example 1 was shown in FIG. 11, and an X-ray diffraction pattern of Example 2 was shown in FIG. 12). In Examples 1 to 4, any of titanium oxy-carbide films formed had a crystallite diameter (width) of the fine columnar crystal of from 15 to 35 nm.

Constitutions of cross-sections of the films observed with a transmission electron microscope were different between the case of Comparative Examples 1 to 4 and Examples 1 to 4. Films of Comparative Examples 1 to 4 had a constitution of a structure with dense films without protrusions at the film surface, however, films of Examples 1 to 4 had a constitution of fine columnar crystals assembled, extending in a film thickness direction, and protrusions at the film surface, and clearance was observed among each of adjacent crystal grains (a photo of cross-sectional constitution of Comparative Example 1 was shown in FIG. 7, and a photo of cross-sectional constitution of Example 2 was shown in FIG. 8 (right Figure)).

In addition, caused by difference of this constitution, there was observed difference also in arithmetic average height (Ra) of the film surface measured with AFM, and film surface of Examples 1 to 4 had larger irregularity as compared with Comparative Examples 1 to 4 (a photo of cross-sectional constitution of Comparative Example 1 was shown in FIG. 7, and a photo of cross-sectional constitution of Example 2 was shown in FIG. 8). This means that at the film surface of Examples 1 to 4, reflected light becomes scattered easily, that is, it contributes to reduction of direct optical reflectance. Therefore, because of providing effect of matting or the like, it is very effective as a surface coating film of optical members.

In addition, a heating test was performed on the film of Examples 1 to 4, under condition of 200° C. or 270° C. in air for 30 minutes, and there was no change observed in film color and little change of optical characteristics such as reflectance and transmittance. In addition, there was observed also no change of film constitution or surface roughness. Therefore, these films are useful as surface coating films of optical members requiring heat resistance.

In Table 1, there are summarized composition of sintered body targets used in preparation of the black coating films and preparation conditions thereof, compositions, colors, average values of direct optical reflectance in a wavelength of from 380 to 780 nm, of the obtained film, average transmittances of the films themselves, crystalline properties, surface irregularity, arithmetic average heights (Ra) and discolorations in heating in air of the film. It should be noted that surface roughness of the film is represented by arithmetic average height (Ra) (the same hereinafter in Tables 2 to 6).

TABLE 1

| | Production condition | | | | Film composition | | | | Average optical reflectance |
|---|---|---|---|---|---|---|---|---|---|
| | Target composition | | Film-formation gas pressure | Oxygen mixing quantity into film formation | C/Ti Atomicity | O/Ti Atomicity | Film thickness | Film | of film in wavelength |
| | C/Ti | O/Ti | (Pa) | Ar gas (%) | ratio | ratio | (nm) | color | 380-780 nm (%) |
| Com. Ex. 1 | 0.99 | 0.05 | 0.3 | 0.00 | 0.99 | 0.05 | 197 | Metalic | 33.7 |
| Com. Ex. 2 | | | | 0.05 | 1.01 | 0.21 | 201 | Metalic | 31.3 |
| Com. Ex. 3 | | | 0.6 | | 0.99 | 0.43 | 203 | Metalic | 29.5 |
| Com. Ex. 4 | | | 1.0 | | 0.98 | 0.67 | 195 | Metalic | 28.0 |
| Example 1 | | | 1.5 | | 0.99 | 0.87 | 200 | Black | 17.9 |
| Example 2 | | | 2.0 | | 1.00 | 1.02 | 203 | Black | 17.2 |
| Example 3 | | | 3.0 | | 0.97 | 1.24 | 201 | Black | 17.0 |
| Example 4 | | | 4.0 | | 0.81 | 1.40 | 206 | Black | 16.9 |

TABLE 1-continued

| | | | | | | | | | |
|---|---|---|---|---|---|---|---|---|---|
| Example 5 | 0.89 | 0.23 | 2.0 | 0.00 | 0.85 | 0.89 | 201 | Black | 16.9 |
| Example 6 | 0.78 | 0.52 | | | 0.75 | 1.26 | 194 | Black | 17.0 |
| Com. Ex. 5 | 0.73 | 0.75 | | | 0.71 | 1.53 | 198 | Gray | 25.1 |
| Com. Ex. 6 | 0.00 | 0.12 | 2.0 | 0.00 | 0.00 | 0.55 | 201 | Metalic | 26.9 |
| Example 7 | | 0.26 | | | 0.00 | 0.89 | 203 | Black | 17.2 |
| Example 8 | | 0.51 | | | 0.00 | 1.38 | 194 | Black | 17.4 |
| Com. Ex. 7 | | 0.81 | | | 0.00 | 1.56 | 198 | Gray | 25.1 |
| Example 9 | 0.00 | 0.26 | 1.5 | 0.00 | 0.00 | 0.73 | 201 | Black | 17.6 |
| Example 10 | | | 3.5 | | | 1.27 | 200 | Black | 16.8 |
| Com. Ex. 8 | | | 1.0 | | 0.00 | 0.59 | 203 | Metalic | 24.5 |
| Example 11 | 0.72 | 0.04 | 2.0 | 0.05 | 0.71 | 1.00 | 197 | Black | 17.3 |
| Example 12 | 0.52 | 0.06 | | | 0.56 | 0.97 | 203 | Black | 17.8 |
| Example 13 | 0.34 | 0.05 | | | 0.32 | 1.04 | 205 | Black | 18.1 |
| Com. Ex. 9 | 0.99 | 0.05 | 0.3 | 1.00 | 0.75 | 0.39 | 203 | Metalic | 30.5 |
| Com. Ex. 10 | | | | 2.00 | 0.61 | 0.73 | 203 | Black | 22.1 |
| Com. Ex. 11 | | | | 2.50 | 0.53 | 0.90 | 196 | Black | 23.5 |
| Com. Ex. 12 | | | | 3.00 | 0.42 | 1.52 | 203 | Gray | 24.9 |
| Com. Ex. 13 | | | | 4.00 | 0.37 | 1.75 | 206 | Colorless | 25.5 |
| Com. Ex. 14 | 0.00 | 0.41 | 0.3 | 0.50 | 0.00 | 0.65 | 195 | Metalic | 30.5 |
| Com. Ex. 15 | | | | 1.00 | 0.00 | 0.71 | 200 | Black | 22.1 |
| Com. Ex. 16 | | | | 1.50 | 0.00 | 0.87 | 194 | Black | 23.5 |
| Com. Ex. 17 | | | | 2.00 | 0.00 | 1.45 | 201 | Gray | 25.3 |
| Com. Ex. 18 | | | | 3.00 | 0.00 | 1.77 | 200 | Colorless | 26.2 |
| Example 14 | 0.89 | 0.23 | 2.0 | 0.00 | 0.85 | 0.89 | 152 | Black | 16.9 |
| Example 15 | | | | | 0.83 | 0.88 | 102 | Black | 17.4 |
| Example 16 | | | | | 0.84 | 0.84 | 82 | Black | 18.6 |
| Example 19 | | | | | 0.84 | 0.84 | 52 | Black | 28.6 |
| Com. Ex. 17 | | | | | 0.83 | 0.88 | 31 | Gray | 28.6 |
| Example 18 | 0.00 | 0.26 | 2.0 | 0.00 | 0.85 | 0.89 | 150 | Black | 17.5 |
| Example 19 | | | | | 0.83 | 0.88 | 110 | Black | 17.9 |
| Example 20 | | | | | 0.84 | 0.84 | 88 | Black | 18.8 |
| Example 21 | | | | | 0.84 | 0.85 | 55 | Black | 29.2 |
| Com. Ex. 20 | | | | | 0.83 | 0.87 | 29 | Gray | 29.2 |

| | Average transmittance of film itself in wavelength 380-780 nm (%) | Film crystalline property | Film surface irregularity | Film surface roughness [Ra] (nm) | Discoloration in heating for 30 min in air | |
|---|---|---|---|---|---|---|
| | | | | | 200° C. | 270° C. |
| Com. Ex. 1 | 1.05 | Crystal | Flat | 0.55 | — | — |
| Com. Ex. 2 | 1.65 | Crystal | Flat | 0.61 | — | — |
| Com. Ex. 3 | 2.21 | Crystal | Flat | 0.57 | — | — |
| Com. Ex. 4 | 4.32 | Crystal | Flat | 0.52 | — | — |
| Example 1 | 15.61 | Crystal | Protrusion | 1.86 | No charge | No charge |
| Example 2 | 16.48 | Crystal | Protrusion | 1.98 | No charge | No charge |
| Example 3 | 17.32 | Crystal | Protrusion | 3.26 | No charge | No charge |
| Example 4 | 17.81 | Crystal | Protrusion | 3.51 | No charge | No charge |
| Example 5 | 15.12 | Crystal | Protrusion | 3.13 | No charge | No charge |
| Example 6 | 18.41 | Crystal | Protrusion | 3.32 | No charge | No charge |
| Com. Ex. 5 | 67.12 | Crystal | Protrusion | 3.21 | — | — |
| Com. Ex. 4 | 2.74 | Crystal | Protrusion | 2.41 | — | — |
| Example 7 | 14.32 | Crystal | Protrusion | 2.98 | No charge | Charged |
| Example 8 | 16.21 | Crystal | Protrusion | 3.24 | No charge | Charged |
| Com. Ex. 7 | 75.22 | Crystal | Protrusion | 3.41 | — | — |
| Example 9 | 13.86 | Crystal | Protrusion | 2.36 | No charge | Charged |
| Example 10 | 15.70 | Crystal | Protrusion | 2.91 | No charge | Charged |
| Com. Ex. 8 | 4.53 | Crystal | Protrusion | 0.61 | — | — |
| Example 11 | 17.17 | Crystal | Protrusion | 2.91 | No charge | No charge |
| Example 12 | 16.61 | Crystal | Protrusion | 2.58 | No charge | No charge |
| Example 13 | 17.03 | Crystal | Protrusion | 2.43 | No charge | Charged |
| Com. Ex. 9 | 2.71 | Amorphous | Flat | 0.55 | — | — |
| Com. Ex. 10 | 15.63 | Amorphous | Flat | 0.61 | — | — |
| Com. Ex. 11 | 19.72 | Amorphous | Flat | 0.59 | — | — |
| Com. Ex. 12 | 65.36 | Amorphous | Flat | 0.53 | — | — |
| Com. Ex. 13 | 79.95 | Amorphous | Flat | 0.48 | — | — |
| Com. Ex. 14 | 2.71 | Amorphous | Flat | 0.46 | — | — |
| Com. Ex. 15 | 15.63 | Amorphous | Flat | 0.58 | — | — |
| Com. Ex. 16 | 19.72 | Amorphous | Flat | 0.61 | — | — |
| Com. Ex. 17 | 65.36 | Amorphous | Flat | 0.59 | — | — |
| Com. Ex. 18 | 80.55 | Amorphous | Flat | 0.49 | — | — |
| Example 14 | 17.25 | Crystal | Protrusion | 3.01 | No charge | No charge |
| Example 15 | 29.80 | Crystal | Protrusion | 2.86 | No charge | No charge |
| Example 16 | 34.12 | Crystal | Protrusion | 2.15 | No charge | No charge |
| Example 19 | 43.51 | Crystal | Protrusion | 1.31 | — | — |
| Com. Ex. 17 | 43.51 | Crystal | Protrusion | 1.31 | No charge | Charged |
| Example 18 | 17.04 | Crystal | Protrusion | 2.94 | No charge | Charged |

TABLE 1-continued

| | | | | | | |
|---|---|---|---|---|---|---|
| Example 19 | 28.52 | Crystal | Protrusion | 2.81 | No charge | Charged |
| Example 20 | 34.59 | Crystal | Protrusion | 2.25 | No charge | Charged |
| Example 21 | 34.59 | Crystal | Protrusion | 1.29 | No charge | Charged |
| Com. Ex. 20 | 42.15 | Crystal | Protrusion | 1.29 | — | — |

Eamples 5 to 6 and Comparative Example 5

Sputtering film-formation of the black coating films was performed similarly as in Examples 1 to 4, except that oxygen quantity contained in the sintered body target of titanium oxy-carbide was changed. The film-formation was performed under high gas pressure (2.0 Pa), wherein cross-section of obtained films has a constitution of fine columnar crystals assembled extending in a film thickness direction, and surface irregularity are easily obtained. As shown in Table 1, the higher oxygen quantity in the target showed tendency of the higher oxygen quantity in the obtained film.

Examples 5 to 6 satisfy the atomicity ratio O/Ti of the films in a range of 0.7 to 1.4, and the films provided black color and also low average reflectance of the film itself, in a wavelength of from 380 to 780 nm. In addition, the films had a needle-like constitution, large surface irregularity and also heat resistance at 270° C., and thus showed excellent characteristics useful as a coating film of optical member, similarly as Example 2 to 4.

However, in Comparative Example 5, the obtained film contained oxygen quantity as the atomicity ratio O/Ti of as high as 1.53, reflecting the high oxygen quantity in the target, therefore, film color gave transparent gray color. In addition, average reflectance of the film, in a wavelength of from 380 to 780 nm, was very high as compared with Examples 1 to 4. Such a film with high average reflectance is difficult to be applied as a surface coating film of optical members.

In Examples 5 to 6, all of the titanium oxy-carbide films formed had a crystallite diameter (width) of the fine columnar crystal of from 20 to 40 nm.

Examples 7 to 8 and Comparative Examples 6 to 7

Titanium oxide films with various oxygen contents were produced similarly as in Examples 1 to 4, except that targets of titanium oxide sintered bodies, not containing carbon and containing oxygen in various contents, were used. The sputtering film-formation of films was performed under high gas pressure (2.0 Pa), wherein cross-section of films has a constitution of fine columnar crystals assembled extending in a film thickness direction, and a film with surface irregularity is easily obtained. The higher oxygen quantity in the target showed tendency of the higher oxygen quantity in the obtained film.

Films of Examples 7 to 8 have oxygen content in the films of in a range of 0.7 to 1.4 as the atomicity ratio O/Ti, however the films provided black color and also low average reflectance of the films themselves, in a wavelength of from 380 to 780 nm. In addition, the films had a needle-like constitution, and large surface irregularity, and thus showed excellent characteristics useful as a coating film of optical member, similarly as Example 2 to 4.

In Table 1, heat resistance characteristics of the films of Examples 7 and 8 were also shown. They showed heat resistance in a heating test at 200° C. in air for 30 minutes, however, as for heat resistance in heating at 270° C. in air for 30 minutes, decrease in black degree and increase in reflectance of the film were observed by oxidation of the films and thus can not be said good. Therefore, the films are useful as optical members requiring heat resistance of 200° C., however, not suitable for members requiring heat resistance of 270° C. For optical members requiring heat resistance of 270° C., the titanium oxy-carbide films containing carbon of equal to or higher than 0.7, as atomicity ratio C/Ti, are useful as shown in Example 1 to 6.

On the other hand, films of Comparative Examples 6 to 7 are not useful as a surface coating film of optical members because of high reflectance. In Comparative Example 6, oxygen quantity contained in the film as the atomicity ratio O/Ti of was as low as 0.55, the film showed metallic color, and average reflectance of the film, in a wavelength of from 380 to 780 nm, was high as compared with Examples 1 to 8. In Comparative Example 7, reflected by high oxygen quantity in the target, the obtained film had oxygen content of 1.56 as the atomicity ratio O/Ti. Probably due to containing excess oxygen, film color gave transparent gray color. In addition, average reflectance of the film, in a wavelength of from 380 to 780 nm, was very high as compared with Examples 1 to 8. Such a film with high average reflectance is difficult to be applied as a surface coating film of optical members.

In Examples 7 to 8, all of the titanium oxide films formed had a crystallite diameter (width) of the fine columnar crystal of from 18 to 38 nm.

Examples 9 to 10 and Comparative Example 8

Characteristics of films, produced by using the target used in Example 7, and by changing film-formation gas pressure, were measured.

Examples 9 to 10 are films obtained by sputtering film-formation under film-formation gas pressure of 1.5 Pa and 3.5 Pa, respectively, and as shown in Table 1, characteristics equivalent to those of Example 7 were shown. Therefore they are useful as surface coating films of optical members. However, a film of Comparative Example 8, produced under film-formation gas pressure of 1.0 Pa, probably due to containing low quantity of oxygen incorporated in the film, showed metallic color and also high reflectance, and was thus not suitable for a surface coating film of optical members.

Examples 11 to 13

Three kinds of titanium oxy-carbide films having nearly the same oxygen content (atomicity ratio O/Ti) as in Examples 1 to 4, but different carbon content (atomicity ratio C/Ti) were formed.

These titanium oxy-carbide films are those produced by using targets of titanium oxy-carbide sintered bodies with different carbon content, under the same film-formation gas pressure of 2.0 Pa, and with decrease in carbon content in the target, carbon content in the obtained films showed tendency to decrease.

The films of Examples 11 to 13 all showed black color, and because film-formation was performed under high gas pressure, the films had a constitution of fine columnar crystals assembled, where a cross-sectional structure of the film extends in a film thickness direction, and had large surface irregularity. Therefore, average reflectance, in a wavelength of from 380 to 780 nm, was low. In Examples 11 to 13, all of the titanium oxy-carbide films formed had a crystallite diameter (width) of the fine columnar crystal of from 25 to 35 nm.

In Table 1, heat test results of the films of Examples 11 and 13 were also shown. The film of Example 11, having atomicity ratio C/Ti of 0.71 showed no change of constitution or optical characteristics or the like, even in air heating at 270° C. for 30 minutes, however, the film of Example 12, having atomicity ratio C/Ti of 0.56, and the film of Example 13, having atomicity ratio C/Ti of 0.32 showed significant discoloration in a heating test at 270° C. Therefore, the film of Example 11 is useful as a surface coating film of optical members requiring heat resistance of 270° C., however, the films of Example 12 to 13 are not suitable for a surface coating film of optical members requiring heat resistance of 270° C. However, the films of Example 12 to 13 showed no change of constitution or in optical characteristics or the like, in an air heating test at 200° C. for 30 minutes, and thus can be utilized as a surface coating film of optical members requiring heat resistance of equal to or lower than 200° C.

Comparative Examples 9 to 13

Film-formation was performed by using a sintered body target of titanium oxy-carbide, having the atomicity ratio C/Ti of 0.99 and the atomicity ratio O/Ti of 0.05, under a low gas pressure of 0.3 Pa, and by changing oxygen mixing quantity into film-formation Ar gas in a range of from 1 to 4%.

Figure 13:
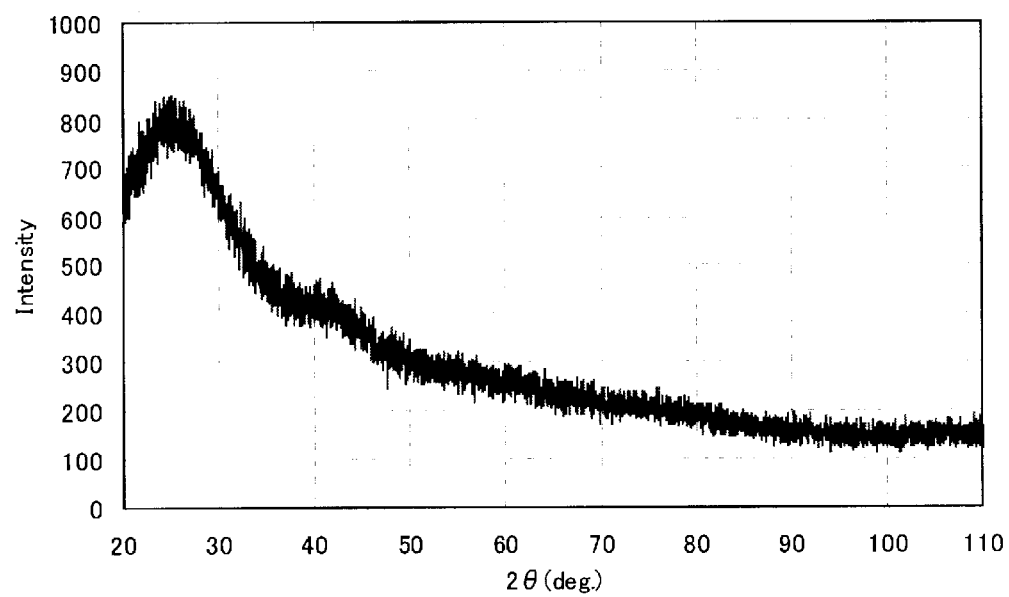
FIG. 13 is a chart showing measurement result of an X-ray diffraction pattern of the black coating film obtained under condition of Comparative Example 10.

Because any of the films was formed under low film-formation gas pressure mixed with oxygen, by a reactive sputtering method, they were all amorphous films, and had a columnar constitution without surface irregularity (an X-ray diffraction pattern of Comparative Example 10 was shown in FIG. 13).

A film of Comparative Example 9 is a film obtained by setting oxygen mixing quantity into Ar gas at 1%, and gives metallic color, and high average reflectance, in a wavelength of from 380 to 780 nm, and is thus not suitable for a surface coating film of optical members.

In addition, a film of Comparative Example 10 is a film having the atomicity ratio C/Ti of 0.61 and the atomicity ratio O/Ti of 0.73, and a film of Comparative Example 11 is a film having the atomicity ratio C/Ti of 0.53 and the atomicity ratio O/Ti of 0.90. Any of the films provided black color, however, because they were produced by film-formation under low gas pressure, had an amorphous structure.

Because of this reason, average reflectance in a wavelength of from 380 to 780 nm, was higher as compared with the films of Examples 1 to 13, and are thus difficult to be utilized as surface coating film of optical members.

A film of Comparative Example 12 is a film having the atomicity ratio C/Ti of 0.42 and the atomicity ratio O/Ti of 1.52, and a film of Comparative Example 13 is a film having the atomicity ratio C/Ti of 0.37 and the atomicity ratio O/Ti of 1.75. Any of the films had the atomicity ratio O/Ti of over 1.4, and very high average reflectance, in a wavelength of from 380 to 780 nm, and are thus difficult to be utilized as surface coating films of optical members.

Comparative Examples 14 to 18

Film-formation was performed by using a sintered body target of titanium oxide, having the atomicity ratio O/Ti of 0.41, under a low gas pressure of 0.3 Pa, and by changing oxygen mixing quantity into film-formation Ar gas in a range of from 0.50 to 3.00%.

Because any of the films was formed under low gas pressure mixed with oxygen, by a reactive sputtering method, they were all amorphous films.

A film of Comparative Example 19 is a film, having the atomicity ratio O/Ti of film composition of 0.65, obtained by setting oxygen mixing quantity into Ar gas at 0.5%, and gives metallic color, and high average reflectance, in a wavelength of from 380 to 780 nm, and is thus not suitable for a surface coating film of optical members.

In addition, a film of Comparative Example 15 is a film having the atomicity ratio O/Ti of film composition of 0.71, and a film of Comparative Example 16 is a film having the atomicity ratio O/Ti of film composition of 0.87. Any of the films provided black color, however, because they were produced by film-formation under low gas pressure, had an amorphous film structure of a flat columnar structural constitution without irregularity at the film surface.

Because of this reason, average reflectance in a wavelength of from 380 to 780 nm, was higher as compared with the films of Examples 1 to 13, and they are thus difficult to be utilized as surface coating film of optical members.

A film of Comparative Example 17 is a film having the atomicity ratio O/Ti of film composition of 1.45, and a film of Comparative Example 18 is a film having the atomicity ratio O/Ti of film composition of 1.77. Any of the films had the atomicity ratio O/Ti in the film of over 1.4, and very high average reflectance of the film in a wavelength of from 380 to 780 nm, and is thus difficult to be utilized as a surface coating film of optical members.

Examples 14 to 21 and Comparative Examples 19 to 20

Titanium oxy-carbide films of Examples 14 to 17 were produced similarly, under the same condition, except that film thickness of the titanium oxy-carbide film of Example 5 (film thickness of 201 nm) was changed. Film thickness of Example 14 was set at 152 nm, film thickness of Example 15 at 102 nm, film thickness of Example 16 at 82 nm, film thickness of Example 17 at 52 nm, and film thickness of Comparative Example 19 at 31 nm.

With decrease in the film thickness, surface irregularity of the film decreased. In addition, with decrease in the film thickness, light absorption quantity in the film decreased, and average transmittance increased as well. Films of Examples 14 to 17, having a film thickness of equal to or thicker than 50 nm, shows black color and low reflection characteristics, and thus can be utilized as surface coating film of optical members. However, a film of Comparative Example 19, having a film thickness of 31 nm, has small surface irregularity, high reflectance, and low light absorption quantity in the film, and was thus a gray transparent film. Such a film cannot be utilized as a surface coating film of optical members.

In addition, titanium oxide films of Examples 18 to 21 were produced similarly, under the same condition, except that film thickness of the titanium oxide film of Example 7 (film thickness of 203 nm) was changed. Film thickness of Example 18 was set at 150 nm, film thickness of Example 19 at 110 nm, film thickness of Example 20 at 85 nm, film thickness of Example 21 at 55 nm, and film thickness of Comparative Example 20 at 29 nm. With decrease in the film thickness, surface irregularity of the film decreased. In addition, with decrease in the film thickness, light absorption quantity in the film decreased, and average transmittance increased as well. Films of Examples 18 to 21, having a film thickness of equal to or thicker than 50 nm, shows black color and low reflection characteristics, and thus can be utilized as surface coating film of optical members. However, a film of Comparative Example 20, having a film thickness of 29 nm, has small surface irregularity, high reflectance, and low light absorption quantity in the film, and was thus a gray transparent film. Such a film cannot be utilized as a surface coating film of optical members.

Such tendency is the same for films of Examples 1 to 4, Example 6 and Examples 8 to 13, and the case having a film thickness of equal to or thicker than 50 nm increases surface irregularity and provides low reflection property, therefore, can be utilized as surface coating films of optical members.

In Examples 14 to 17, all of the titanium oxy-carbide films and in Examples 18 to 21, all of the titanium oxide films formed had a crystallite diameter (width) of the fine columnar crystal of from 13 to 35 nm.

In (1) to (4) of Table 2, characteristics were shown when films of Comparative Example 19, Example 16, Example 15 and Example 5, were formed, by changing kind of a substrate to a SUS substrate having a thickness of 75 μm, and an arithmetic average height (Ra) of 0.12 μm, and the films were formed at the surface thereof.

When a film of Comparative Example 19 was formed, (1) did not show black color, however, when films of Example 16, Example 15 and Example 5 were formed, (2) to (4) showed the surfaces of black color and low reflection characteristics, and thus were able to make superior optical members. In a heating test at 270° C. in air, there was no discoloration observed, and thus they can be utilized as optical members requiring heat resistance at 270° C.

In addition, in (5) to (8) of Table 2, characteristics were shown when films of Comparative Example 19, Example 16, Example 15 and Example 5, were formed, by changing kind of a substrate to a Ti substrate having a thickness of 200 μm, and an arithmetic average height (Ra) of 0.23 μm, and the films were formed at the surface thereof. Similar results as in (1) to (4) were obtained, that is, when a film of Comparative Example 19 was formed, (5) did not show black color, however, when films of Example 5, Example 15 and Example 16 were formed, optical members with low reflection property and black color as shown by (6) to (8) were able to be obtained. In a heating test at 270° C. in air, there was no discoloration observed, and thus they can be utilized as optical members requiring heat resistance at 270° C.

In addition, in (9) to (12) of Table 2, characteristics were shown when films of Comparative Example 20, Example 20, Example 19 and Example 7, were formed onto a surface of a Ti substrate having a thickness of 200 μm, and an arithmetic average height (Ra) of 0.23 μm. When a film of Comparative Example 20 was formed, (9) did not show black color, however, when films of Example 20, Example 19 and Example 7 were formed, (10) to (12) showed a surface with black color and low reflection characteristics, and excellent optical members was able to be obtained. In a heating test at 270° C. in air, discoloration was observed, however, in a heating test at 200° C., discoloration was not observed. Therefore, they can provide optical members requiring heat resistance at 200° C.

In addition, in (13) to (16) of Table 2, characteristics were shown when films of Comparative Example 20, Example 20, Example 19 and Example 7, were formed onto a surface of an Al substrate having a thickness of 100 μm, and an arithmetic average height (Ra) of 0.11 μm. Similar results as in (9) to (12) were obtained, that is, when a film of Comparative Example 20 was formed, (13) did not show black color, however, when films of Example 20, Example 19 and Example 7 were formed, (14) to (16) was able to provide optical members with low reflection property and black color. In a heating test at 270° C. in air, discoloration was observed, however, in a heating test at 200° C., discoloration was not observed. Therefore, they can provide optical members requiring heat resistance at 200° C.

Still more, in (17) to (19) of Table 2, characteristics were shown when a substrate kind was changed to a black polyimide film substrate, having a thickness of 25 μm and 75 μm, and an arithmetic average height (Ra) of 0.5 μm, and a film of Example 15 was formed onto both surfaces of the film substrate. It should be noted that, optical transmittance, in a wavelength of from 380 to 780 nm, of the black polyimide film was 1% at maximal for 25 μm, and 0.1% at maximal for 75 μm. Film-formation condition of the films was the same as in Example 15, except that film thickness was changed.

(17) and (18) used a black PI film having light transmittance of equal to or lower than 1%, where surfaces showed black color even when film thickness of Example 15 for coating was 20 nm, and lower reflection characteristics, and thus was able to make excellent optical members. There was no discoloration in a heating test at 270° C. in air, and thus can be utilized as optical members and the black light shading plate requiring heat resistance at 270° C.

On the other hand, in (19) of Table 2, kind of the black polyimide film and components of a coating film were set the same as in (17) of Table 2, except the thickness of the coating film was changed to 18 nm. In (19), it was clarified that black optical members with low reflection can be obtained, and there is no discoloration of the film observed even in a heating test at 270° C. in air, and thus has heat resistance of 270° C. However, because optical density, in a wavelength of from 380 to 780 nm, is below 4, it is not suitable for the black light shading plate of optical applications.

TABLE 2

| | Kind of substrate | | | Coating film | | | Average optical reflectance in wavelength 390-790 (%) | Film surface roughness [Ra] (μm) | Discoloration in heating for 30 min in air | | Remark |
|---|---|---|---|---|---|---|---|---|---|---|---|
| | Material | Thickness (μm) | Surface roughness Ra (μm) | Kind of film | Film thickness (nm) | Film color | | | 200° C. | 270° C. | |
| (1) | SUS | 75 | 0.12 | Film of Com. Ex. 19 | 60 | Gray | 2.54 | 0.11 | No change | No change | Coated onto one surface of substrate |
| (2) | | | | Film of Ex. 16 | 82 | Black | 1.02 | | No change | No change | |
| (3) | | | | Film of Ex. 15 | 102 | Black | 0.93 | | No change | No change | |
| (4) | | | | Film of Ex. 5 | 201 | Black | 0.84 | | No change | No change | |
| (5) | Ti | 200 | 0.23 | Film of Com. Ex. 19 | 60 | Gray | 1.78 | | No change | No change | |
| (6) | | | | Film of Ex. 17 | 52 | Black | 0.64 | | So change | No change | |
| (7) | | | | Film of Ex. 15 | 102 | Black | 0.52 | | No change | No change | |
| (8) | | | | Film of Ex. 5 | 201 | Black | 0.46 | | No change | No change | |
| (9) | Ti | 200 | 0.23 | Film of Com. Ex. 20 | 59 | Gray | 1.78 | 0.21 | No change | Changed | |
| (10) | | | | Film of Ex. 21 | 55 | Black | 0.64 | | No change | Changed | |
| (11) | | | | Film of Ex. 19 | 110 | Black | 0.52 | | No change | Changed | |

TABLE 2-continued

| | Kind of substrate | | | Coating film | | | Average optical reflectance in wavelength 390-790 (%) | Film surface roughness [Ra] (μm) | Discoloration in heating for 30 min in air | | Remark |
|---|---|---|---|---|---|---|---|---|---|---|---|
| | Material | Thickness (μm) | Surface roughness Ra (μm) | Kind of film | Film thickness (nm) | Film color | | | 200° C. | 270° C. | |
| (12) | | | | Film of Ex. 7 | 203 | Black | 0.46 | | No change | Changed | |
| (13) | Al | 100 | 0.11 | Film of Com. Ex. 20 | 59 | Gray | 2.39 | 0.10 | No change | Changed | |
| (14) | | | | Film of Ex. 21 | 55 | Black | 1.01 | | No change | Changed | |
| (15) | | | | Film of Ex. 19 | 110 | Black | 0.89 | | No change | Changed | |
| (16) | | | | Film of Ex. 7 | 203 | Black | 0.82 | | No change | Changed | |
| (17) | | 25 | 0.5 | Film of Ex. 15 | 20 | Black | 0.42 | 0.40 | No change | No change | Coated |
| (18) | Black | 75 | 0.5 | Film of Ex. 15 | 20 | Black | 0.25 | 0.40 | No change | No change | onto both |
| (19) | PI | 25 | 0.5 | Film of Ex. 15 | 18 | Black | 0.50 | 0.40 | No change | No change | surfaces of substrate |

Examples 22 to 26 and Comparative Examples 21 to 25

On the surface of a transparent polyimide film having an arithmetic average height (Ra) of 0.07 μm, and a thickness of 38 μm, the following light shading film 1: a titanium oxy-carbide film (film thickness of 100 nm) was formed as a metallic light shading film. Then, on the surface of the light shading film thereof, the film of Example 1 was formed by a thickness of 105 nm (Example 22), or the film of Example 3 was formed by a thickness of 100 nm (Example 23), or the film of Example 5 was formed by a thickness of 105 nm (Example 24), or the film of Example 6 was formed by a thickness of 95 nm (Example 25), or the film of Example 8 was formed by a thickness of 105 nm (Example 26), as a film of the second layer, to produce the black light shading plates. In any of the cases, film-like light shading plates without warpage were produced, by forming at the both surfaces of the polyimide film, in a symmetric way, the first layer film with the same film thickness, and the second layer film with the same kind and the same film thickness.

In addition, similarly, the following light shading film 1: a titanium oxy-carbide film (film thickness of 100 nm) was formed as a metallic light shading film, and on the surface of the light shading film thereof, the film of Comparative Example 4 was formed by a thickness of 100 nm (Comparative Example 21), or the film of Comparative Example 5 was formed by a thickness of 110 nm (Comparative Example 22), or the film of Comparative Example 6 was formed by a thickness of 110 nm (Comparative Example 23), or the film of Comparative Example 7 was formed by a thickness of 110 nm (Comparative Example 24), or the film of Comparative Example 1 was formed by a thickness of 110 nm (Comparative Example 25), as a film of the second layer.

The light shading film 1: It was formed under condition shown in Comparative Example 1, that is, by using a target of titanium oxy-carbide (the atomicity ratio C/Ti of 0.99 and the atomicity ratio O/Ti of 0.05), under film-formation gas pressure of 0.3 Pa, without introducing oxygen into Ar gas. Composition of the film was the atomicity ratio C/Ti of 0.99 and the atomicity ratio O/Ti of 0.05.

Any of the obtained light shading plates had an optical density, in a wavelength of from 380 to 780 nm, of equal to or higher than 4.0, and showed complete light shading property. However, average reflectance, in a wavelength of from 380 to 780 nm, was different between Examples 22 to 26 and Comparative Examples 21 to 25, and the light shading plates of Examples 22 to 26 showed lower reflection, and black color. In addition, L* value was also different between Examples 22 to 26 and Comparative Examples 21 to 25, and the light shading plates of Examples 22 to 26 showed smaller values of 40 to 44.

A heat test was performed on the black film-like light shading plates of Examples 22 to 26. These light shading plates of Examples 22 to 25 did not show change of color or reflectance or the like in a heating test at 270° C. in air for 30 minutes. Therefore they can be utilized as the light shading plates requiring heat resistance of equal to or lower than 270° C. It should be noted that, the light shading plate of Example 26 showed discoloration in the heating test at 270° C., however, in the heating test at 200° C., did not show discoloration, and maintained a black color state and low reflection characteristics. Therefore, the light shading plate of Example 26 can be utilized as applications requiring heat resistance of equal to or lower than 200° C. Surface resistance of the films was 250 to 400Ω/□ (it is pronounced as ohm per square) in Examples, and 200 to 500Ω/□ in Comparative Examples.

Example 27 and Comparative Examples 26 to 27

By using a transparent polyimide film having an arithmetic average height (Ra) at the film surface of 0.23 μm, and a thickness of 25 μm, a black light shading plate was produced similarly as in Examples 22 to 26. The arithmetic average height of the above film, was formed in matte processing by sandblast. On the surface of this film, the following light shading film 2 with a film thickness of 105 nm: a titanium oxy-carbide film was formed as a metallic light shading film of the first layer. Onto the surface of this light shading film, the titanium oxy-carbide film of Example 5 with a thickness of 105 nm was formed (Example 27), or the titanium oxy-carbide film of Comparative Example 12 with a thickness of 105 nm was formed (Comparative Example 26), or the titanium oxy-carbide film of Comparative Example 1 with a thickness of 105 nm was formed (Comparative Example 27). In any of the cases, film-like light shading film without warpage was produced, by forming symmetrically onto both surfaces of the film, the first layer film with the same film thickness, and the second layer film with the same kind and the same film thickness. It should be noted that, in Comparative Example 27, a film was formed under condition that oxygen mixing quantity to be introduced into Ar gas was 0.0%. Composition of the film was the atomicity ratio C/Ti of 0.99 and the atomicity ratio O/Ti of 0.05.

The light shading film 2: It was formed under condition shown in Comparative Example 2, that is, by using a target of the above titanium oxy-carbide (the atomicity ratio C/Ti of 0.99 and the atomicity ratio O/Ti of 0.05), under film-formation gas pressure of 0.3 Pa, and an oxygen mixing quantity to be introduced into Ar gas of 0.05%. Composition of the film was the atomicity ratio C/Ti of 1.01 and the atomicity ratio O/Ti of 0.21.

In any cases, an optical density, in a wavelength of from 380 to 780 nm, was equal to or higher than 4.0, showing sufficient light shading property. In addition, the light shading plates of Example 27 did not show discoloration in a heating test at 270° C., and had excellent heat resistance. As for lightness, Example 27 showed the L* value of 40 and showed black color, however, Comparative Examples 26 and 27 showed the L* value of 48 and 49, respectively, higher as compared with Example 27, small black degree and still more blue color. In addition, Example 27 showed lower average reflectance, in a wavelength of from 380 to 780 nm. Therefore, Example 27 is useful as optical members requiring a black light shading plate. Surface resistance of the films was 400Ω/□ in Example 27, and 200 to 400Ω/□² in Comparative Examples 26 and 27.

Example 28 and Comparative Examples 28 to 29

By using a transparent polyimide film having an arithmetic average height (Ra) at the film surface of 0.40 μm, and a thickness of 38 μm, a black light shading plate was produced similarly as in Examples 22 to 26. Surface roughness of the film was formed in matte processing by sandblast. On the surface of this film, the above light shading film 2 with a film thickness of 105 nm: a titanium oxy-carbide film was formed as a metallic light shading film of the first layer. Onto the surface of this light shading film, the titanium oxy-carbide film of Example 5 with a thickness of 105 nm was formed (Example 28), or the titanium oxy-carbide film of Comparative Example 11 with a thickness of 105 nm was formed after forming the above light shading film 2 with a thickness of 105 nm: the titanium oxy-carbide film, as the light shading film of the first layer (Comparative Example 28), or the titanium oxy-carbide film of Comparative Example 11 with a thickness of 105 nm was formed (Comparative Example 29). In any of the cases, a film-like light shading film without warpage was produced, by forming symmetrically onto both surfaces of the film, the first layer film with the same film thickness, and the second layer film with the same kind and the same film thickness.

In any cases, an optical density, in a wavelength of from 380 to 780 nm, was equal to or higher than 4.0, showing sufficient light shading property. In addition, the light shading plates of Example 28 did not show discoloration in a heating test at 270° C., and had excellent heat resistance. As for lightness, Example 28 showed the L* value of 44 and showed black color, however, Comparative Examples 28 and 29 showed the L* value of 50 and 49, respectively, small black degree and still more blue color. In addition, Example 28 showed lower average reflectance, in a wavelength of from 380 to 780 nm. Therefore, Example 26 is useful as optical applications as a black light shading plate. Surface resistance of the films was 200Ω/□ in Example 28, and 200 to 500Ω/□ in Comparative Examples 28 and 29.

Example 29 and Comparative Examples 30 to 31

By using a transparent polyimide film having an arithmetic average height (Ra) at the film surface of 0.95 μm, and a thickness of 50 μm, a black light shading plate was produced similarly as in Examples 20 to 24. Surface roughness of the film was formed in matte processing by sandblast. On the surface of this film, the above light shading film 2 with a film thickness of 105 nm: a titanium oxy-carbide film was formed as a metallic light shading film of the first layer. Onto the surface of this light shading film, the titanium oxy-carbide film of Example 5 with a thickness of 105 nm was formed (Example 29), or the titanium oxy-carbide film of Comparative Example 12 with a thickness of 105 nm was formed after forming the above light shading film 2 with a thickness of 105 nm: the titanium oxy-carbide film, as the light shading film of the first layer (Comparative Example 30), or the titanium oxy-carbide film of Comparative Example 1 with a thickness of 105 nm was formed (Comparative Example 31). In any of the cases, a film-like light shading film without warpage was produced, by forming symmetrically onto both surfaces of the film, the first layer film with the same film thickness, and the second layer film with the same kind and the same film thickness.

In any cases, an optical density, in a wavelength of from 380 to 780 nm, was equal to or higher than 4.0, showing sufficient light shading property. In addition, the light shading plates of Example 29 did not show discoloration in a heating test at 270° C., and had excellent heat resistance. As for lightness, Example 29 showed the L* value of 40 and showed black color, however, Comparative Examples 30 and 31 showed the L* value of 47 and 49, respectively, small black degree and still more blue color. In addition, Example 29 showed lower average reflectance, in a wavelength of from 380 to 780 nm. Therefore, Example 29 is useful as optical applications as a black light shading plate. Surface resistance of the films was 500Ω/□ in Example 29, and 400 to 600Ω/□ in Comparative Examples 30 and 31.

Examples 30 to 31 and Comparative Example 32

Light shading plates were produced by changing only film thickness of the film of the first layer formed at each surface of the film, in the black light shading plate of Example 29. In Example 30, film thickness of the above light shading film 2 of the first layer was changed to 40 nm, and in Example 31, film thickness of the first layer was changed to 250 nm. Any of the films had reflectance or optical density and L* value equivalent to those of Example 29, and can be utilized as the black coating film.

However, Comparative Example 32, which is one produced by changing the film thickness of the film of the first layer to 28 nm, had an average optical density, in a wavelength of from 380 to 780 nm, of 3.85 and does not have sufficient light shading property. Therefore it cannot be utilized as a light shading plate. Surface resistance of the films was 400 to 600Ω/□ in Example 30 and 31, and 500Ω/□ in Comparative Example 32.

Examples 32 to 34 and Comparative Example 33

Light shading plates were produced by changing only film thickness of the film formed at the second layer of each surface of the film, in Example 25. In Example 32, film thickness of the second layer was changed to 53 nm, in Example 33, film thickness of the second layer was changed to 110 nm, and in Example 34, film thickness of the second layer was changed to 250 nm, however, any of the films had reflectance or optical density and L* value equivalent to those of Example 29, and can be utilized as the black coating film.

However, Comparative Example 33, which is one produced by changing film thickness of the second layer to 42 nm, had sufficient light shading property, but had higher average reflectance, in a wavelength of from 380 to 780 nm, and also higher L* value of 53 as compared with Examples 32 to 34, therefore, it was clarified not suitable for a light shading plate. Surface resistance of the films was 90 to 200Ω/□ in Example 32 to 34, and 200Ω/□ in Comparative Example 33.

Examples 35 to 36 and Comparative Examples 34 to 36

By using a transparent polyimide film having an arithmetic average height (Ra) at the film surface of 0.07 μm, and a thickness of 75 μm, black light shading plates were produced similarly as in Examples 22 to 26. On the surface of film, the first layer film, the following light shading film 3 (a film thickness of 100 nm) was formed. Then, onto the surface of this light shading film, the film of Example 7 was formed by a thickness of 106 nm (Example 35), or the film of Example 8 was formed by a thickness of 101 nm (Example 36), or the film of Comparative Example 17 was formed by a thickness of 100 nm (Comparative Example 34) or the film of Comparative Example 18 was formed by a thickness of 105 nm (Comparative Example 35), or the film of Comparative Example 14 was formed by a thickness of 105 nm (Comparative Example 36), as the second later film.

The light shading film 3: A titanium oxide film (the first layer film, with a film thickness of 100 nm) was formed under condition shown in Comparative Example 14, that is, by using a target of the titanium oxide (the atomicity ratio O/Ti of 0.41), under film-formation gas pressure of 0.3 Pa, and an oxygen mixing quantity to be introduced into Ar gas of 0.50%. Composition of the film was the atomicity ratio C/Ti of 0.00 and the atomicity ratio O/Ti of 0.65.

In any of the cases, a film-like light shading film without warpage was produced, by forming symmetrically onto both surfaces of the film, the first layer film with the same film thickness, and the second layer film with the same kind and the same film thickness. Surface resistance of the films was 100 to 300Ω/□ in Examples 35 and 36, and 200 to 300Ω/□ in Comparative Examples 34 to 36.

Any of these light shading plates had an optical density, in a wavelength of from 380 to 780 nm, of equal to or higher than 4.0, showing complete light shading property. However, average reflectance, in a wavelength of from 380 to 780 nm, was different between Examples 35 to 36, and Comparative Examples 34 to 36, and the light shading plates of Examples 35 to 36 showed lower reflection, the L* value of 39 to 40, and black color.

A heat test was performed on the black film-like light shading plates obtained in Examples 35 to 36. The light shading plates of Examples 35 to 36 showed change of color or reflectance or the like in a heating test at 270° C. in air for 30 minutes. However, there was no change of color or reflectance or the like in a heating test at 200° C. in air for 30 minutes. Therefore, Examples 35 to 36 can be utilized as the black light shading plates requiring heat resistance of equal to or lower than 200° C.

Example 37 and Comparative Examples 37 to 38

By using a transparent polyimide film having a surface roughness (Ra) of 0.40 μm, and a thickness of 50 μm, black light shading plates were produced similarly as in Examples 22 to 26. On the surface of film, the above light shading film 3: the titanium oxide film (the first layer film, a film thickness of 105 nm) was formed as a metallic light shading film. Then, onto the surface of this light shading film, the film of Example 10 was formed by a thickness of 105 nm (Example 37), or the film of Comparative Example 16 was formed by a thickness of 105 nm on the above light shading film 3 (Comparative Example 37), or the film of Comparative Example 9 was formed by a thickness of 105 nm (Comparative. Example 38), as the second layer film. In any of the cases, a film-like light shading film without warpage was produced, by forming symmetrically onto both surfaces, of the film, the first layer film with the same film thickness, and the second layer film with the same kind and the same film thickness.

Any of these light shading plates of Example 37, and Comparative Examples 37 and 38 had an optical density, in a wavelength of from 380 to 780 nm, of equal to or higher than 4.0, showing complete light shading property. However, average reflectance, in a wavelength of from 380 to 780 nm, was different, and the light shading plate of Examples 37 showed lower reflection, the L* value of 43, and black color.

A heat test was performed on the black film-like light shading plate obtained in Example 37. The light shading plate of Example 37 showed change of color or reflectance or the like in a heating test at 270° C. in air for 30 minutes. However, there was no change of color or reflectance or the like in a heating test at 200° C. in air for 30 minutes. Therefore, Example 37 can be utilized as the black light shading plate requiring heat resistance of equal to or lower than 200° C. Surface resistance of the films was 200Ω/□.

Example 38 and Comparative Examples 39 to 40

By using a transparent polyimide film having a surface roughness (Ra) of 0.95 μm, and a thickness of 38 μm, black light shading plates were produced similarly as in Examples 22 to 26. On the surface of film, the following light shading film 4: the titanium oxide film (the first layer film, a film thickness of 45 nm) was formed as a metallic light shading film. Then, onto the surface of light shading film thereof, the titanium oxide film of Example 9 was formed by a thickness of 105 nm (Example 38), or the titanium oxide file of Comparative Example 16 was formed by a thickness of 105 nm (Comparative Example 39), or the titanium oxide film of Comparative Example 14 was formed by a thickness of 105 nm (Comparative Example 40), as the second layer film. In any of the cases, a film-like light shading film without warpage was produced, by forming symmetrically onto both surfaces of the film, the first layer film with the same film thickness, and the second layer film with the same kind and the same film thickness.

Any of these light shading plates had an optical density, in a wavelength of from 380 to 780 nm, of equal to or higher than 4.0, showing complete light shading property. However, average reflectance, in a wavelength of from 380 to 780 nm, was different, and the light shading plate of Examples 38 showed lower reflection, the L* value of 38, and black color.

A heat test was performed on the black film-like light shading plate obtained in Example 38. The light shading plate of Example 38 showed change of color or reflectance or the like in a heating test at 270° C. in air for 30 minutes. However, there was no change of color or reflectance or the like in a heating test at 200° C. in air for 30 minutes. Therefore, Example 38 can be utilized as the black light shading plate requiring heat resistance of equal to or lower than 200° C. Surface resistance of the films was 400Ω/□ in Example 38, and 300 to 600Ω/□ in Comparative Examples 39 and 40.

The light shading film 4: It was formed under condition shown in Comparative Example 6, that is, by using a target of the titanium oxide sintered body not containing carbon, and containing oxygen in various contents, under high gas pressure (2.0 Pa). Oxygen quantity contained in the film was as small as 0.55, as the atomicity ratio O/Ti.

TABLE 3

| | Kind of substrate | | | First layer film | | Second layer film | | Average optical reflectance in wavelength 380-780 nm (%) |
|---|---|---|---|---|---|---|---|---|
| | Material | Thickness (μm) | Surface roughness Ra (μm) | Kind of film | Film thickness (nm) | Kind of film | Film thickness (nm) | |
| Example 22 | Polyimide | 38 | 0.07 | Light-shading film 3 | 100 | Film of Ex. 1 | 105 | 17.5 |
| Example 23 | | | | | | Film of Ex. 3 | 100 | 17.4 |
| Example 24 | | | | | | Film of Ex. 5 | 105 | 17.0 |
| Example 25 | | | | | | Film of Ex. 6 | 95 | 16.5 |
| Example 26 | | | | | | Film of Ex. 8 | 105 | 16.8 |
| Com. Ex. 21 | | | | | | Film of Com. Ex. 4 | 100 | 30.2 |
| Com. Ex. 22 | | | | | | Film of Com. Ex. 6 | 110 | 21.0 |
| Com. Ex. 23 | | | | | | Film of Com. Ex. 6 | 110 | 32.4 |
| Com. Ex. 24 | | | | | | Film of Com. Ex. 7 | 110 | 22.5 |
| Com. Ex. 25 | | | | | | Film of Com. Ex. 1 | 110 | 35.4 |
| Example 27 | Polyimide | 25 | 0.23 | Light-shading film 2 | 105 | Film of Ex. 6 | 105 | 1.23 |
| Com. Ex. 26 | | | | | | Film of Com. Ex. 12 | 105 | 1.98 |
| Com. Ex. 27 | | | | | | Film of Com. Ex. 1 | 105 | 2.03 |
| Example 28 | | 38 | 0.40 | | | Film of Ex. 6 | 105 | 0.57 |
| Com. Ex. 28 | | | | | | Film of Com. Ex. 11 | 105 | 0.92 |
| Com. Ex. 29 | | | | | | Film of Com. Ex. 1 | 105 | 1.84 |
| Example 29 | | 50 | 0.95 | | | Film of Ex. 6 | 105 | 0.24 |
| Com. Ex. 30 | | | | | | Film of Com. Ex. 12 | 105 | 0.31 |
| Com. Ex. 31 | | | | | | Film of Com. Ex. 1 | 105 | 1.00 |
| Com. Ex. 32 | Polyimide | 50 | 0.55 | Light-shading film 2 | 28 | Film of Ex. 6 | 105 | 0.36 |
| Example 30 | | | | | 40 | Film of Ex. 6 | 105 | 0.31 |
| Example 31 | | | | | 250 | Film of Ex. 6 | 105 | 0.31 |
| Com. Ex. 33 | Polyimide | 38 | 0.07 | Light-shading film 1 | 100 | Film of Ex. 6 | 42 | 29.0 |
| Example 32 | | | | | | Film of Ex. 6 | 53 | 18.4 |
| Example 33 | | | | | | Film of Ex. 6 | 110 | 17.5 |
| Example 34 | | | | | | Film of Ex. 6 | 250 | 15.3 |
| Example 35 | Polyimide | 75 | 0.07 | Light-shading film 3 | 100 | Film of Ex. 7 | 106 | 17.5 |
| Example 36 | | | | | | Film of Ex. 8 | 101 | 17.4 |
| Com. Ex. 34 | | | | | | Film of Com. Ex. 17 | 100 | 20.1 |
| Com. Ex. 35 | | | | | | Film of Com. Ex. 18 | 105 | 25.4 |
| Com. Ex. 36 | | | | | | Film of Com. Ex. 14 | 105 | 29.4 |
| Com. Ex. 37 | | 50 | 0.40 | | 105 | Film of Ex. 10 | 105 | 0.57 |
| Com. Ex. 37 | | | | | | Film of Com. Ex. 16 | 105 | 0.92 |
| Com. Ex. 38 | | | | | | Film of Com. Ex. 9 | 105 | 1.25 |
| Example 38 | | 38 | 0.95 | Light-shading film 4 | 45 | Film of Ex. 9 | 105 | 0.27 |
| Com. Ex. 39 | | | | | | Film of Com. Ex. 16 | 105 | 0.35 |
| Com. Ex. 40 | | | | | | Film of Com. Ex. 14 | 105 | 1.29 |

| | Average optical density in wavelength 380-780 nm | Film surface roughness [Ra] (μm) | Film surface resistance (Ω/□) | Discoloration in heating for 30 min in air | | Lightness L* |
|---|---|---|---|---|---|---|
| | | | | 200° C. | 270° C. | |
| Example 22 | >4.0 | 0.05 | 250 | No change | No change | 44 |
| Example 23 | | | 250 | No change | No change | 42 |
| Example 24 | | | 300 | No change | No change | 41 |
| Example 25 | | | 400 | No change | No change | 40 |
| Example 26 | | | 400 | No change | Changed | 40 |
| Com. Ex. 21 | | | 200 | — | — | 46 |
| Com. Ex. 22 | | | 200 | — | — | 47 |
| Com. Ex. 23 | | | 300 | — | — | 48 |
| Com. Ex. 24 | | | 500 | — | — | 50 |
| Com. Ex. 25 | | | 400 | — | — | 55 |
| Example 27 | >4.0 | 0.16 | 400 | No change | No change | 40 |
| Com. Ex. 26 | | 0.16 | 400 | — | — | 43 |
| Com. Ex. 27 | | 0.16 | 200 | — | — | 49 |
| Example 28 | | 0.38 | 200 | No change | No change | 44 |
| Com. Ex. 28 | | 0.38 | 500 | — | — | 50 |
| Com. Ex. 29 | | 0.38 | 200 | — | — | 49 |
| Example 29 | | 0.70 | 500 | No change | No change | 40 |
| Com. Ex. 30 | | 0.70 | 600 | — | — | 47 |
| Com. Ex. 31 | | 0.70 | 400 | — | — | 49 |
| Com. Ex. 32 | 3.85 | 0.38 | 500 | — | — | 46 |
| Example 30 | >4.0 | 0.38 | 400 | — | — | 40 |
| Example 31 | | 0.36 | 600 | No change | No change | 39 |
| Com. Ex. 33 | >4.0 | 0.05 | 200 | — | — | 53 |
| Example 32 | | | 200 | No change | No change | 44 |
| Example 33 | | | 100 | No change | No change | 43 |
| Example 34 | | | 90 | No change | No change | 42 |
| Example 35 | >4.0 | 0.05 | 100 | No change | Changed | 40 |
| Example 36 | | | 300 | No change | Changed | 39 |
| Com. Ex. 34 | | | 200 | — | — | 46 |
| Com. Ex. 35 | | | 300 | — | — | 48 |

TABLE 3-continued

| | | | | | |
|---|---|---|---|---|---|
| Com. Ex. 36 | | 200 | — | — | 45 |
| Com. Ex. 37 | 0.28 | 200 | No change | Changed | 43 |
| Com. Ex. 37 | | 200 | — | — | 46 |
| Com. Ex. 38 | 1.33 | 200 | — | — | 49 |
| Example 38 | 0.69 | 400 | No change | Changed | 38 |
| Com. Ex. 39 | | 600 | — | — | 46 |
| Com. Ex. 40 | | 300 | — | — | 47 |

Examples 39 to 43

On the surface of a transparent polyimide film having an arithmetic average height (Ra) of 0.07 μm and a thickness of 25 μm, light shading films of various metal materials were formed by 110 nm, to produce the black light shading plate similarly as in Examples 22 to 26. As shown in Table 4, in Example 39, a NiTi film (Ti content of 2.98% by weight) with a thickness of 110 nm was formed by using a NiTi target (Ti content of 3% by weight). In Example 40, a Cu film with a thickness of 110 nm was formed by using a Cu target. In Example 41, an Al film with a thickness of 110 nm was formed by using an Al target. In Examples 42 to 43, a Ti film with a thickness of 110 nm was formed by using a Ti target.

These light shading films were formed by a direct current sputtering method under film-formation condition by sputtering (film-formation gas pressure, oxygen mixing quantity into film-formation Ar gas) shown in Comparative Example 1. Then, as the second layer film, the titanium oxy-carbide film of Example 5 was formed by a thickness of 105 nm in Examples 39 to 42. In addition, as the second layer film, the titanium oxide film of Example 7 was formed by a thickness of 105 nm in Example 43.

In any of the cases, a film-like light shading film without warpage was produced, by forming symmetrically onto both surfaces of the film, the first layer film with the same film thickness, and the second layer film with the same kind and the same film thickness.

Any of these light shading plates had an optical density, in a wavelength of from 380 to 780 nm, of equal to or higher than 4.0, showing complete light shading property. In addition, average reflectance, in a wavelength of from 380 to 780 nm, was very low, providing black color.

Then, a heat test was performed on the obtained film-like black light shading plates. In any cases, they showed change of color or reflectance or the like in a heating test at 270° C. in air for 30 minutes. In a heating test at 200° C. in air for 30 minutes, there was observed change of color in Examples 40 to 41, however, there was no change of color or reflectance or the like in Examples 39, 42 and 43. Therefore, Examples 39, 42 and 43 can be utilized as the black light shading plate requiring heat resistance of equal to or lower than 200° C. In addition, the light shading plates of Examples 40 to 41 did not show discoloration in a heating test at 150° C. for 30 minutes. Therefore, they can be utilized as light shading plates requiring heat resistance of equal to or lower than 150° C.

Cross-sectional TEM observation was performed on samples which showed discoloration in a heat test, among the light shading plates of Examples 39 to 43. It was clarified that the first layer films of all of the samples which showed discoloration were oxidized, or reacted with the second layer films. It can be predicted that the discoloration was observed caused by this. Surface resistance of the films was equal to lower than 500Ω/□.

Comparative Examples 41 to 44

On the surface of a transparent polyimide film having a surface roughness (Ra) of 0.07 μm and a thickness of 25 μm, first, light shading films of various metal materials were formed by 110 nm, and similarly as in Examples 22 to 26, to produce the black light shading plate. As shown in Table 4, in Comparative Example 41, a NiTi film (Ti content of 2.98% by weight) with a thickness of 110 nm was formed by using a NiTi target (Ti content of 3% by weight). In Comparative Example 42, a Cu film with a thickness of 110 nm was formed by using a Cu target. In Comparative Example 43, an Al film with a thickness of 110 nm was formed by using an Al target. In Comparative Examples 44, a Ti film with a thickness of 110 nm was formed by using a Ti target. These light shading films were formed by a direct current sputtering method under film-formation condition by sputtering (film-formation gas pressure, oxygen mixing quantity into film-formation Ar gas) shown in Comparative Example 1.

Then, as the second layer film, the titanium oxy-carbide film of Comparative Example 1 was formed by a thickness of 105 nm in Comparative Examples 41 to 44. In any of the cases, a film-like light shading film without warpage was produced, by forming symmetrically onto both surfaces of the film, the first layer film with the same film thickness, and the second layer film with the same kind and the same film thickness.

Any of these light shading plates had an optical density, in a wavelength of from 380 to 780 nm, of equal to or higher than 4.0, showing complete light shading property. In addition, average reflectance, in a wavelength of from 380 to 780 nm, was very high as compared with Examples 39 to 43, providing color of small black degree such as the L* value of from 50 to 52.

Examples 44 to 47

Kind of a film was changed and on the surface of a transparent PET film having a surface roughness (Ra) of 0.42 μm and a thickness of 75 μm, first, light shading films of various metal materials were formed by 110 nm, to produce the black light shading plates similarly as in Examples 39 to 43. As shown in Table 4, in Examples 44 to 45, a Ti film was formed, as the first layer film, by using a Ti target. In Example 46, an Al film was formed, as the first layer film, by using an Al target. In Example 47, a NiTi film (Ti content of 2.98% by weight) was formed by using a NiTi target (Ti content of 3% by weight). These light shading films were formed by a direct current sputtering method under film-formation condition by sputtering (film-formation gas pressure, oxygen mixing quantity into film-formation Ar gas) shown in Comparative Example 1.

Then, as the second layer film, the titanium oxy-carbide film of Example 5 was formed by a thickness of 105 nm in Examples 44 and 47. In addition, as the second layer film, the titanium oxide film of Example 7 was formed by a thickness of 105 nm, in Examples 45 to 46.

In any of the cases, a film-like light shading film without warpage was produced, by forming symmetrically onto both surfaces of the film, the first layer film with the same film thickness, and the second layer film with the same kind and the same film thickness.

Any of these light shading plates of Examples 44 to 47 had an optical density, in a wavelength of from 380 to 780 nm, of equal to or higher than 4.0, showing complete light shading property. In addition, average reflectance, in a wavelength of from 380 to 780 nm, was very low, providing the L* value of from 34 to 36 and black color, and thus useful as optical applications. Surface resistance of the films was 200 to 400Ω/□.

Comparative Examples 45 to 47

Kind of a film was changed and on the surface of a transparent PET film having a surface roughness (Ra) of 0.42 μm and a thickness of 75 μm, light shading films of various metal materials were formed by 110 nm, to produce the black light shading plates similarly as in Examples 39 to 43. As shown in Table 4, in Comparative Example 45, a Ti film was formed, as the first layer film, by using a Ti target. In Comparative Example 46, an Al film was formed, as the first layer film, by using an Al target. In Comparative Example 47, a NiTi film (Ti content of 2.98% by weight) was formed by using a NiTi target (Ti content of 3% by weight). These light shading films were formed by a direct current sputtering method under film-formation condition by sputtering (film-formation gas pressure, oxygen mixing quantity into film-formation Ar gas) shown in Comparative Example 1.

Then, as the second layer film, the titanium oxy-carbide film of Comparative Example 1 was formed by a thickness of 105 nm.

Any of these light shading plates had an optical density, in a wavelength of from 380 to 780 nm, of higher than 4.0, showing complete light shading property. In addition, average reflectance, in a wavelength of from 380 to 780 nm, was very high, providing the L* value of from 48 to 50 and color of small black degree.

Examples 48 to 51

Kind of a film was changed and on the surface of a transparent PEN film having a surface roughness (Ra) of 0.95 μm and a thickness of 100 μm, light shading films of various metal materials were formed by 110 nm, to produce the black light shading plates similarly as in Examples 39 to 43. As shown in Table 4, in Examples 48 to 49, a Ti film was formed, as the first layer film, by using a Ti target. In Example 50, an Al film was formed, as the first layer film, by using an Al target. In Example 51, a NiTi film (Ti content of 2.98% by weight) was formed by using a NiTi target (Ti content of 3% by weight). These light shading films were formed by a direct current sputtering method under film-formation condition by sputtering (film-formation gas pressure, oxygen mixing quantity into film-formation Ar gas) shown in Comparative Example 1. Then, as the second layer film, the film of Example 5 was formed by a thickness of 105 nm in Example 48 and Example 51. In addition, as the second layer film, the film of Example 7 was formed by a thickness of 105 run in Examples 49 to 50.

In any of the cases, a film-like light shading film without warpage was produced, by forming symmetrically onto both surfaces of the film, the first layer film with the same film thickness, and the second layer film with the same kind and the same film thickness.

Any of these light shading plates of Examples 48 to 51 had an optical density, in a wavelength of from 380 to 780 nm, of equal to or higher than 4.0, showing complete light shading property. In addition, average reflectance, in a wavelength of from 380 to 780 nm, was very low, providing the L* value of from 28 to 32 and black color, and is thus useful as optical applications. Surface resistance of the films was 300 to 400Ω/□.

Comparative Examples 48 to 50

Kind of a film was changed and on the surface of a transparent PEN film having a surface roughness (Ra) of 0.95 μm and a thickness of 100 μm, light shading films of various metal materials were formed by 110 nm, to produce the black light shading plates similarly as in Examples 39 to 43. As shown in Table 4, in Comparative Example 48, a Ti film was formed, as the first layer film, by using a Ti target. In Comparative Example 49, an Al film was formed, as the first layer film, by using an Al target. In Comparative Example 50, a NiTi film (Ti content of 2.98% by weight) was formed by using a NiTi target (Ti content of 3% by weight). These light shading films were formed by a direct current sputtering method under film-formation condition by sputtering (film-formation gas pressure, oxygen mixing quantity into film-formation Ar gas) shown in Comparative Example 1.

Then, as the second layer film, the titanium oxy-carbide film of Comparative Example 1 was formed by a thickness of 105 nm. Any of these light shading plates had an optical density, in a wavelength of from 380 to 780 nm, of higher than 4.0, showing complete light shading property. In addition, average reflectance, in a wavelength of from 380 to 780 nm, was very high, as compared with Examples 48 to 51, providing the L* value of from 46 to 47 and color of small black degree.

Example 52 and Comparative Example 51

Kind of a substrate was changed, and on the surface of a SUS foil having a surface roughness (Ra) of 0.12 μm and a thickness of 70 μm, the following light shading film 1 was formed by 110 nm, as the first layer film.

Production condition of the first layer film was set at a film-formation gas pressure of from 0.3 to 1.0 Pa, and an oxygen mixing quantity to be introduced into Ar gas of equal to or lower than 0.05%. As the second layer film, the film of Example 5 was formed by about 105 nm (Example 52), or the film of Comparative Example 1 was formed by about 105 nm (Comparative Example 51). The second layer film was formed by a direct current sputtering method under the production condition of the same sputtering condition (target composition, gas pressure, oxygen mixing quantity into film-formation Ar gas) shown in Example 5, except that film thickness was changed in Example 52. In addition, in Comparative Example 51, the film was formed by the same direct current sputtering method under the sputtering condition (target composition, gas pressure, oxygen mixing quantity into film-formation Ar gas) shown in Comparative Example 1.

The light shading film 1: It was formed by using a target of titanium oxy-carbide (the atomicity ratio C/Ti of 0.99 and the atomicity ratio O/Ti of 0.05), under film-formation gas pressure of 0.3 Pa, without introducing oxygen into Ar gas. Composition of the film was the atomicity ratio C/Ti of 0.99 and the atomicity ratio O/Ti of 0.05.

In any of the cases, a light shading plate without warpage was produced, by forming symmetrically onto both surfaces of the SUS foil, the first layer film with the same film thickness, and the second layer film with the same film thickness.

The light shading plate of Example 52 had an optical density, in a wavelength of from 380 to 780 nm, of higher than 4.0, showing complete light shading property. In addition, average reflectance, in a wavelength of from 380 to 780 nm, was 0.30%, and still more the L* value was also 34, showing very low reflectance and color with high black degree as compared with Comparative Example 51, and is thus useful as optical applications. Surface resistance of the films was 300Ω/□.

Comparative Example 52

On the surface of a transparent polyimide film having an arithmetic average height (Ra) of 0.40 μm by matte processing by sandblast, and a thickness of 38 μm, the titanium oxy-carbide film of Comparative Example 2 was formed by 150 nm, as a metallic light shading film. As production condition of the metallic light shading film, similar one as in Comparative Example 2 was used. A film-like light shading plate without warpage was produced, by forming symmetrically onto both surfaces of the film, the films with the same film thickness.

The optical density, in a wavelength of from 380 to 780 nm, was equal to or higher than 4.0, showing sufficient light shading property. In addition, in a heating test at 270° C., there was no discoloration, showing to have excellent heat resistance. In addition, average reflectance, in a wavelength of from 380 to 780 nm, was 0.95%. As for Lightness, the L* value was 60, showing gray color with small black degree. Surface resistance of the film was 200Ω/□. Therefore, the gray light shading plate of Comparative Example 52, having high L* value and reflectance, is not suitable for optical applications, among them, in particular, in the fields requiring black color.

Example 53

On one surface of a film, under similar condition of kind of a film, the arithmetic average height (Ra) and the film thickness as in Example 28, the titanium oxy-carbide film of Comparative Example 2 was formed by a film thickness of 130 nm, as a metallic light shading film.

The metallic light shading film was formed under production condition by a direct current sputtering method, under sputtering condition (target composition, gas pressure, oxygen mixing quantity into film-formation Ar gas) shown in Comparative Example 2. Still more, at the surface of the metallic light shading film, the titanium oxy-carbide film of the Example 5 was formed by 105 nm, as the second layer to form the black light shading plate. Production condition of the second layer film was the same as sputtering condition (target composition, gas pressure, oxygen mixing quantity into film-formation Ar gas) shown in Example 5.

The optical density, in a wavelength of from 380 to 780 nm, was equal to or higher than 4.0, showing sufficient light shading property. In addition, in a heating test at 270° C., there was no discoloration, showing to have excellent heat resistance. In addition, average reflectance, in a wavelength of from 380 to 780 nm, was 0.30%. As for lightness, the L* value was 30, showing black color. Surface resistance of the film was 200Ω/□.

At the both surfaces of the obtained black light shading plate, an adhesive layer with a thickness of 50 μm was formed, by using acryl-based, silicone-based adhesives (product name: 9079, manufactured by Sumitomo 3M Co., Ltd.) having high heat resistance, to produce a heat resistant light shading tape.

The light shading plate of Example 53 has an average optical density of equal to or higher than 4.0, showing complete light shading property, and low reflectance such as an average reflectance of 0.3%, and has an adhesive layer formed at both surfaces, and thus can be adhered onto the peripheral part of the rear surface side of the image sensor such as CCD or CMOS, therefore, it is useful as the black light shading plate to shade leaked light which injects to the rear surface of the image sensor.

TABLE 4

| | Kind of substrate | | | First layer film | | Second layer film | | Average optical reflectance in wavelength 380-780 nm (%) | Average optical density in wavelength 380-780 nm |
|---|---|---|---|---|---|---|---|---|---|
| | Material | Thickness (μm) | Surface roughness Ra (μm) | Kind of film | Film thickness (nm) | Kind of film | Film thickness (nm) | | |
| Example 39 | Polyimide | 25 | 0.07 | NiTi | 110 | Film of Ex. 6 | 105 | 18.5 | >4.0 |
| Example 40 | | | | Cu | | Film of Ex. 6 | 105 | 18.4 | |
| Example 41 | | | | Al | | Film of Ex. 6 | 105 | 18.6 | |
| Example 42 | | | | Ti | | Film of Ex. 6 | 105 | 18.7 | |
| Exmaple 43 | | | | Ti | | Film of Ex. 7 | 105 | 18.7 | |
| Com. Ex. 41 | | | | NiTi | | Film of Com. Ex. 1 | 105 | 30.4 | |
| Com. Ex. 42 | | | | Cu | | | 105 | 31.5 | |
| Com. Ex. 45 | | | | Al | | | 105 | 30.6 | |
| Con. Ex. 44 | | | | Ti | | | 105 | 31.0 | |
| Example 44 | PET | 75 | 0.42 | Ti | 110 | Film of Ex. 6 | 105 | 0.74 | |
| Example 45 | | | | Tl | | Film of Ex. 7 | 105 | 0.69 | |
| Example 46 | | | | Al | | Film of Ex. 7 | 105 | 0.68 | |
| Example 47 | | | | NiTi | | Film of Ex. 6 | 105 | 0.65 | |
| Com. Ex. 45 | | | | Tl | | Film of Com. Ex. 1 | 105 | 1.56 | |
| Com. Ex. 46 | | | | Al | | | 105 | 1.66 | |
| Cam. Ex. 47 | | | | NiTi | | | 105 | 1.95 | |
| Example 48 | PEN | 100 | 0.95 | Tl | 110 | Film of Ex. 6 | 105 | 0.28 | |
| Example 49 | | | | Ti | | Film of Ex. 7 | 105 | 0.29 | |
| Example 50 | | | | Al | | Film of Ex. 7 | 105 | 0.32 | |
| Example 51 | | | | NiTi | | Film of Ex. 6 | 105 | 0.31 | |
| Cam. Ex. 48 | | | | Tl | | Film of Com. Ex. 1 | 105 | 1.08 | |
| Com. Ex. 49 | | | | Al | | | 105 | 1.06 | |
| Com. Ex. 50 | | | | NiTi | | | 105 | 1.00 | |
| Example 52 | SUS | 70 | 0.12 | TlCO | 110 | Film of Ex. 1 | 105 | 0.30 | >4.0 |
| Com. Ex. 51 | | | | | | Film of Com. Ex. 1 | 105 | 1.03 | |
| Com. Ex. 52 | Polyimide | 38 | 0.4 | TlCO | 150 | — | — | 0.95 | >4.0 |

TABLE 4-continued

| Example 53 | Polyimide | 38 | 0.4 | TiCO | 130 | Film of Ex. 5 | 105 | 0.34 | >4.0 |
|---|---|---|---|---|---|---|---|---|---|

| | | Film surface roughness [Ra] (μm) | Film surface resistance (Ω/□) | Discoloration in heating for 30 min in air | | | Lightness L* |
|---|---|---|---|---|---|---|---|
| | | | | 150° C. | 200° C. | 270° C. | |
| | Example 39 | 0.05 | 100 | No change | No change | Changed | 34 |
| | Example 40 | | 200 | No change | Changed | Changed | 33 |
| | Example 41 | | 200 | No change | Changed | Changed | 36 |
| | Example 42 | | 300 | No change | No change | Changed | 39 |
| | | | 500 | No change | No change | Changed | 39 |
| | Com. Ex. 41 | | 100 | No change | No change | Changed | 50 |
| | Com. Ex. 42 | | 200 | No change | Changed | Changed | 52 |
| | Com. Ex. 45 | | 200 | No change | Changed | Changed | 50 |
| | Con. Ex. 44 | | 300 | No change | No change | Changed | 52 |
| | Example 44 | 0.38 | 400 | — | — | — | 36 |
| | Example 45 | | 400 | — | — | — | 35 |
| | Example 46 | | 300 | — | — | — | 35 |
| | Example 47 | | 200 | — | — | — | 34 |
| | Com. Ex. 45 | | 400 | — | — | — | 49 |
| | Com. Ex. 46 | | 300 | — | — | — | 48 |
| | Cam. Ex. 47 | | 200 | — | — | — | 50 |
| | Example 48 | 0.68 | 300 | — | — | — | 32 |
| | Example 49 | | 300 | — | — | — | 30 |
| | Example 50 | | 400 | — | — | — | 30 |
| | Example 51 | | 400 | — | — | — | 28 |
| | Cam. Ex. 48 | | 300 | — | — | — | 46 |
| | Com. Ex. 49 | | 400 | — | — | — | 46 |
| | Com. Ex. 50 | | 400 | — | — | — | 47 |
| | Example 52 | 0.86 | 300 | No change | No change | No change | 34 |
| | Com. Ex. 51 | | 300 | No change | No change | No change | 48 |
| | Com. Ex. 52 | 0.30 | 200 | No change | No change | No change | 60 |
| | Example 53 | 0.30 | 200 | No change | No change | No change | 30 |

Example 54

A laminated body of a black light shading thin film was formed non one surface of a glass plate (7059, manufactured by Corning Inc.) having a thickness of 1.1 mm, with changing the kind of a substrate. As the black light shading film of the first layer of this laminated body of a black light shading thin film, the titanium oxy-carbide film of Example 5 was formed by thickness of 70 nm on the surface of the glass plate, and as the black light shading film of the second layer, the titanium oxy-carbide film of Comparative Example 1 was, formed by thickness of 190 nm, and as the black light shading film of the third layer, the titanium oxy-carbide film of Example 5 was formed by about thickness of 70 nm, sequentially, to produce the black light shading plate.

The production condition of films of the first layer and the third layer were formed by the same direct current sputtering method as sputtering condition (target composition, film-formation gas pressure, oxygen mixing quantity into film-formation Ar gas) shown in Example 5. The production condition of film of the second layer was formed by the same direct current sputtering method as sputtering condition (target composition, film-formation gas pressure, oxygen mixing quantity into film-formation Ar gas) shown in Comparative Example 1.

As shown in Table 5, the light shading plate of Example 54 had an optical density, in a wavelength of from 380 to 780 nm, of higher than 4.0, showing complete light shading property.

In addition, average reflectance, in a wavelength of from 380 to 780 nm, when light enters from the film surface side, was 13.0% and the L* value of the film surface was 39 as well.

In addition, average reflectance, in a wavelength of from 380 to 780 nm, when light enters from the glass substrate surface side, not formed with the film, was 10.0% and the L* value of the glass substrate surface was 25, showing small L* value for both the film surface and glass substrate surface, and a color with high black degree. In addition, in a heating test at 270° C., there was no change of the average optical density, the average reflectance or the L* value, showing to have excellent heat resistance. Surface resistance of the film was 200Ω/□.

Therefore, the light shading plate of Example 54 has a complete light shading property with an average optical density of equal to or higher than 4.0, and an average reflectance of the film surface and the glass plate surface has a low reflection of equal to or lower than 18%, and shows a color with high black degree, therefore, it is useful as optical applications, and the laminated body of a black light shading thin film of Example 54 is useful, because it can be formed directly, as a fixed diaphragm material, onto the surface of an optical lens of a projector, or a lens to be used in the reflow step, requiring heat resistance, or the like.

Examples 55 and 56

A laminated body of a black light shading thin film was formed on one surface of a glass substrate to produce a black light shading plate, under similar sputtering film-formation condition (target composition, film-formation gas pressure, oxygen mixing quantity into film-formation Ar gas) of films of the first, the second and the third layer, or similar film thickness of the first and the third layer, and similar kind of the substrate, as in Example 54, except that film thickness of the titanium oxy-carbide film of the second layer in the laminated body of a black light shading thin film of Example 54, was changed to 100 nm (Example 55) and 240 nm (Example 56).

As shown in Table 5, the light shading plate of Example 55 had average reflectance, in a wavelength of from 380 to 780 nm, when light enters from the film surface side, of 13.8% and the L* value of the film surface of 42. In addition, average reflectance, in a wavelength of from 380 to 780 nm, when light enters from the glass substrate surface side, was 11.0% and the L* value of the glass substrate surface of 30. The film surface and the glass substrate surface both showed color with high black degree, and an average optical density, in a wavelength of from 380 to 780 nm, of equal to or higher than 4.0, showing to have complete light shading property.

As shown in Table 5, the light shading plate of Example 56 had, similarly as in Example 54, an average optical density of equal to or higher than 4.0, average reflectance of the film surface side, of 15.0%, average reflectance of the glass substrate surface side, of 12.4%. In addition, the L* value of the film surface was 37, and the L* value of the glass substrate surface of 33, showing color with high black degree, similarly as in Example 54.

In a heating test at 270° C., there was no change of the average optical density, the average reflectance or the L* value in Example 55 to 56, showing to have excellent heat resistance, similarly as in Example 54.

It should be noted that surface resistance of the films was 300Ω/□ in Example 55, and 200Ω/□ in Example 56.

Therefore, the light shading plate of Example 55 and 56 has a complete light shading property with an average optical density of equal to or higher than 4.0, and an average reflectance of the film surface and the glass plate surface has a low reflection of equal to or lower than 18%, and shows a color with high black degree, it is useful as optical applications. In addition, the laminated body of a black light shading thin film of Example 55 and 56 is useful, because it can be formed directly, as a fixed diaphragm material, onto the surface of an optical lens of a projector, or a lens to be used in the reflow step, requiring heat resistance, or the like.

Examples 57 to 59

A laminated body of a black light shading thin film was formed on one surface of a glass substrate to produce a black light shading plate, under similar sputtering film-formation condition (target composition, film-formation gas pressure, oxygen mixing quantity into film-formation Ar gas) of films of the first, the second and the third layer, or similar film thickness of the second and the third layer, and similar kind of the substrate, as in Example 54, except that film thickness of the black coating film of the first layer, in the laminated body of a black light shading thin film of Example 54, was changed to 30 nm (Example 57), 50 nm (Example 58) and 100 nm (Example 59).

As shown in Table 5, average reflectance, in a wavelength of from 380 to 780 nm, when light enters from the film surface side, was 13.5% in Example 57, 14.4% in Example 58, and 15.7% in Example 59. Average reflectance, in a wavelength of from 380 to 780 nm, when light enters from the glass substrate surface, was 10.5% in Example 57, 11.4% in Example 58, and 12.7% in Example 59.

In addition, an average optical density, in a wavelength of from 380 to 780 nm, was equal to or higher than 4.0, in any of Examples 57 to 59, showing complete light shading property.

The L* value of the film surface was 41 in Example 57, 40 in Example 58 and 38 in Example 59, and the L* value of the glass substrate surface was 31 in Example 57, 33 in Example 58 and 34 in Example 59.

In a heating test at 270° C., there was no change of the average optical density, the average reflectance or the L* value in Examples 57 to 59, showing to have excellent heat resistance, similarly as in Example 54. It should be noted that surface resistance of the films was 100 to 400Ω/□ in Examples 57 to 59.

Therefore, the light shading plate of Example 57 to 59 has a complete light shading property with an average optical density of equal to or higher than 4.0, and an average reflectance of the film surface and the glass plate surface has a low reflection of equal to or lower than 18%, and shows a color with high black degree, it is useful as optical applications. In addition, the laminated body of a black light shading thin film of Example 57 to 59 is useful, because it can be formed directly, as a fixed diaphragm material, onto the surface of an optical lens of a projector, or a lens to be used in the reflow step, requiring heat resistance, or the like.

Examples 60 to 62

A laminated body of a black light shading thin film was formed on one surface of a glass substrate to produce a black light shading plate, under similar sputtering film-formation condition (target composition, film-formation gas pressure, oxygen mixing quantity into film-formation Ar gas) of films of the first, the second and the third layer, or similar film thickness of the first and the second layer, and similar kind of the substrate, as in Example 54, except that film thickness of the black coating film of the third layer, in the laminated body of a black light shading thin film of Example 54, was changed to 30 nm (Example 60), 50 nm (Example 61) and 100 nm (Example 62).

As shown in Table 5, average reflectance, in a wavelength of from 380 to 780 nm, when light enters from the film surface side, was 17.0% in Example 60, 16.1% in Example 61, and 13.4% in Example 62. In addition, average reflectance, in a wavelength of from 380 to 780 nm, when light enters from the glass substrate surface, was 14.6% in Example 60, 13.2% in Example 61, and 10.3% in Example 62.

In addition, an average optical density, in a wavelength of from 380 to 780 nm, was equal to or higher than 4.0, in any of Examples 60 to 62, showing complete light shading property.

The L* value of the film surface was 42 in Example 60, 40 in Example 61 and 38 in Example 62, and the L* value of the glass substrate surface was 37 in Example 60, 33 in Example 61 and 32 in Example 62. It should be noted that surface resistance of the films was 200Ω/□ in Examples 60 to 62. In a heating test at 270° C., there was no change of the average optical density, the average reflectance or the L* value in Examples 60 to 62, showing to have excellent heat resistance, similarly as in Example 54.

Therefore, the light shading plate of Example 60 to 62 has a complete light shading property with an average optical density of equal to or higher than 4.0, and an average reflectance of the film surface and the glass plate surface has a low reflection of equal to or lower than 18%, and shows a color with high black degree, it is useful as optical applications. In addition, the laminated body of a black light shading thin film of Example 60 to 62 is useful, because it can be formed directly, as a fixed diaphragm material, onto the surface of an optical lens of a projector, or a lens to be used in the reflow step, requiring heat resistance, or the like.

Comparative Example 53

A laminated body of a black light shading thin film was formed on one surface of a glass substrate to produce a black light shading plate, under similar sputtering film-formation condition (target composition, film-formation gas pressure, oxygen mixing quantity into film-formation Ar gas) of films of the first, the second and the third layer, or similar film thickness of the first and the third layer, and similar kind of the substrate, as in Example 54, except that film thickness of the black coating film of the second layer, in the laminated body of a black light shading thin film of Example 54, was changed to 90 nm.

As shown in Table 5, the light shading plate of Comparative Example 53 had average reflectance, in a wavelength of from 380 to 780 nm, when light enters from the film surface side, of 13.5% and the L* value of the film surface of 38. In addition, average reflectance, in a wavelength of from 380 to 780 nm, when light enters from the glass substrate surface, was 12.0%, and the L* value of the glass substrate surface was 34. Color of the film surface and the glass substrate surface both showed high black degree. However, an average optical density, in a wavelength of from 380 to 780 nm, was 3.7, showing no complete light shading property. In a heating test at 270° C., there was no change of the average optical density, the average reflectance or the L* value, showing to have excellent heat resistance, similarly as in Example 54. It should be noted that surface resistance of the film was 200Ω/□.

Therefore, because the light shading plate of Comparative Example 53 has an average optical density of below 4.0, although showing a color with high black degree, having a low reflection and excellent heat resistance, it is not suitable for optical members, among them, in particular, applications requiring complete light shading property.

Comparative Example 54

On one surface of a glass substrate (7059, manufactured by Corning Inc.), the film of Comparative Example 1 was formed by a thickness of 190 nm, as the first layer film, and as the second layer film, the film of Example 5 was formed by a thickness of about 70 nm onto the first layer film to form the black light shading plate. Sputtering film-formation condition (target composition, film-formation gas pressure, oxygen mixing quantity into film-formation Ar gas) of films of the first layer and the second layer was the same as in Comparative Example 1 and Example 5. It should be noted that this film constitution corresponds to the case where the first layer film of Example 5, shown in Example 54, is not formed.

As shown in Table 5, the average optical density, in a wavelength of from 380 to 780 nm, became equal to or higher than 4.0, showing complete light shading property. The average reflectance, in a wavelength of from 380 to 780 nm, when light enters from the film surface side, was 13.5%, the same as in Example 54, however, the average reflectance, in a wavelength of from 380 to 780 nm, when light enters from the glass substrate surface, became 31.4% higher as compared with Example 54. In addition, the L* value of the film surface was 42, the same as in Example 54, however, the L* value of the glass substrate surface was very high as 60, showing color with low black degree. It should be noted that surface resistance was 200Ω/□. In a heating test at 270° C., there was no change of the average optical density, the average reflectance or the L* value, showing to have excellent heat resistance, similarly as in Example 54.

Therefore, because the light shading plate of Comparative Example 54 has high average reflectance at the glass substrate side, and color of low black degree, although has complete light shading property with the average optical density of equal to or higher than 4.0, and low reflection with the average reflectance of the film surface of equal to or lower than 18%, it cannot be formed directly as a fixed diaphragm material, onto the surface of an optical lens of a projector, or a lens to be used in the reflow step, requiring heat resistance, or the like.

Examples 63 and 65

A black light shading plate was formed under similar sputtering film-formation condition (target composition, film-formation gas pressure, oxygen mixing quantity into film-formation Ar gas) of the first layer, and similar the third layer, or film thickness, and similar kind of the substrate, as in Example 54, except that composition of the second layer film of Example 54 was changed to a Ti film (Example 63), a NiTi film (Example 64) and an Al film (Example 65).

As shown in Table 5, in Example 63, a Ti film with a thickness of 190 nm was formed, by using a Ti target. In Example 64, a NiTi film (Ti content of 2.98% by weight) with a thickness of 190 nm was formed by using a NiTi target (Ti content of 3% by weight). In Example 65, an Al film with a thickness of 190 nm was formed, by using an Al target.

As shown in Table 5, average reflectance, in a wavelength of from 380 to 780 nm, when light enters from the film surface side, was 15.3% in Example 63, 15.7% in Example 64, and 16.2% in Example 65. In addition, average reflectance, in a wavelength of from 380 to 780 nm, when light enters from the glass substrate surface, was 12.3% in Example 63, 11.4% in Example 64, and 13.7% in Example 65.

In addition, an average optical density, in a wavelength of from 380 to 780 nm, became equal to or higher than 4.0, in any of Examples 60 to 62, showing complete light shading property.

The L* value of the film surface became 43 in Example 63, 42 in Example 64 and 44 in Example 65, and the L* value of the glass substrate surface was 31 in Example 63, 30 in Example 64 and 33 in Example 65. It should be noted that surface resistance of the films was 200 to 300Ω/□ in Examples 63 to 65. In a heating test at 270° C., there was observed change of color or reflection or the like in Example 63 to 65. In a heating test at 200° C., there was observed discoloration in Example 65, however, in Examples 63 and 64 there was no change of color or discoloration. Therefore, Examples 63 and 64 can be utilized as the black light shading plate requiring heat resistance of equal to or lower than 200° C. In addition, the light shading plate of Example 65 showed no discoloration in a heating test at 150° C., therefore it can be utilized as the light shading plate requiring heat resistance of equal to or lower than 150° C.

Cross-sectional TEM observation was performed on samples which showed discoloration in a heat test, in the light shading plates of Examples 63 to 65. It was clarified that the second layer films of all of the samples which showed discoloration were oxidized. It can be predicted that the discoloration was observed caused by this.

Therefore, because the light shading plates of Examples 63 to 65 has complete light shading property with average optical density of equal to or higher than 4.0, and low reflection with average reflectance of the film surface and the glass plate surface of equal to or lower than 18%, and color with high black degree, it is useful as optical applications.

Comparative Examples 55 to 57

On one surface of a glass substrate (7059, manufactured by Corning Inc.), a Ti film (Comparative Example 55), a NiTi film (Comparative Example 56), and an Al film (Comparative Example 57) were formed, as the first layer film, and onto each of the films, the film of Example 5 was formed, as the second layer film to form the black light shading plate. Sputtering film-formation condition (target composition, film-formation gas pressure, oxygen mixing quantity into film-formation Ar gas) of the first layer film was the similar as in Examples 63 to 65. In Comparative Example 55, a Ti film was formed by 190 nm, in Comparative Example 56, a NiTi film was formed by 190 nm, and in Comparative Example 57, an Al film was formed by 190 nm. Sputtering film-formation condition (target composition, film-formation gas pressure, oxygen mixing quantity into film-formation Ar gas) of the second layer film was the same as film-formation condition of the first layer and the third layer of Examples 54.

As shown in Table 5, the average optical density, in a wavelength of from 380 to 780 nm, became equal to or higher than 4.0, showing complete light shading property.

The average reflectance, in a wavelength of from 380 to 780 nm, when light enters from the film surface side, was 13.3% in Comparative Example 55, 12.9% in Comparative Example 56 and 14.4% in Comparative Example 57. In addition, the average reflectance, in a wavelength of from 380 to 780 nm, when light enters from the glass substrate surface, became 29.7% in Comparative Example 55, 29.5% in Comparative Example 56 and 33.4% in Comparative Example 57, became higher as compared with Examples 63 to 65. In addition, the L* value of the film surface was 43 in Comparative Example 55, 42 in Comparative Example 56 and 43 in Comparative Example 57, however, the L* value of the glass substrate surface became 55 to 61 in Comparative Examples 55 to 57, becoming higher as compared with Examples 63 to 65, and showing color with low black degree. It should be noted that surface resistance was 200 to 400Ω/□. In a heating test at 270° C. in air, there was observed change of color, or reflectance or the like.

Therefore, because the light shading plates of Comparative Examples 55 to 57 have high average reflectance at the substrate side of equal to or higher than 18%, showing color of low black degree, although having the complete light shading property with the average optical density of equal to or higher than 4.0, it cannot be formed directly as a fixed diaphragm material, onto the surface of an optical lens of a projector, or a lens to be used in the reflow step, requiring heat resistance, or the like.

TABLE 5

| | Kind of substrate Material | First layer film | | Second layer film | | Third layer film | | Average optical reflectance at film surface in wavelength 380-780 nm (%) | Average reflectance at substrate surface in wavelength 380-780 nm (%) |
|---|---|---|---|---|---|---|---|---|---|
| | | Kind of film | Film thickness (nm) | Kind of film | Film thickness (nm) | Kind of film | Film thickness (nm) | | |
| Example 54 | Glass | Film of Ex. 6 | 70 | Film of Com. Ex. 1 | 190 | Film of Ex. 6 | 70 | 13.0 | 10.0 |
| Example 55 | | Film of Ex. 6 | 70 | Film of Com. Ex. 1 | 100 | Film of Ex. 6 | 70 | 19.6 | 11.0 |
| Example 56 | | Film of Ex. 6 | 70 | Film of Com. Ex. 1 | 240 | Film of Ex. 6 | 70 | 15.0 | 12.4 |
| Example 57 | | Film of Ex. 6 | 30 | Film of Com. Ex. 1 | 190 | Film of Ex. 6 | 70 | 13.5 | 10.5 |
| Example 58 | | Film of Ex. 6 | 50 | Film of Com. Ex. 1 | 190 | Film of Ex. 6 | 70 | 14.4 | 11.4 |
| Example 59 | | Film of Ex. 6 | 100 | Film of Com. Ex. 1 | 190 | Film of Ex. 6 | 70 | 15.7 | 12.7 |
| Example 60 | | Film of Ex. 6 | 70 | Film of Com. Ex. 1 | 190 | Film of Ex. 6 | 30 | 17.0 | 14.6 |
| Example 61 | | Film of Ex. 6 | 70 | Film of Com. Ex. 1 | 190 | Film of Ex. 6 | 50 | 14.1 | 13.2 |
| Example 62 | | Film of Ex. 6 | 70 | Film of Com. Ex. 1 | 190 | Film of Ex. 6 | 100 | 13.4 | 10.3 |
| Com. Ex. 63 | | Film of Ex. 6 | 70 | Film of Com. Ex. 1 | 80 | Film of Ex. 6 | 70 | 13.5 | 12.0 |
| Com. Ex. 64 | | Film of Com. Ex. 1 | 190 | Film of Ex. 6 | 70 | — | — | 13.5 | 31.4 |
| Example 63 | | Film of Ex. 6 | 70 | Ti | 190 | Film of Ex. 6 | 70 | 15.3 | 12.3 |
| Example 64 | | Film of Ex. 6 | 70 | Ni—Ti | 190 | Film of Ex. 6 | 70 | 15.7 | 11.4 |
| Example 65 | | Film of Ex. 6 | 70 | Al | 190 | Film of Ex. 6 | 70 | 16.2 | 13.7 |
| Com. Ex. 66 | | Ti | 190 | Film of Ex. 6 | 70 | — | — | 13.3 | 29.7 |
| Com. Ex. 69 | | Ni—Ti | 190 | Film of Ex. 6 | 70 | — | — | 12.3 | 29.5 |
| Com. Ex. 87 | | Al | 190 | Film of Ex. 6 | 70 | — | — | 14.4 | 33.4 |

| | Average optical density in wavelength 380-780 nm | Film surface roughness [Ra] (nm) | Film surface resistance (Ω/□) | Discoloration in heating for 30 min in air | | | Lightness | |
|---|---|---|---|---|---|---|---|---|
| | | | | 150° C. | 200° C. | 270° C. | Film surface L* | Substrate surface L* |
| Example 54 | >4.0 | 3.11 | 200 | No charge | No charge | No charge | 39 | 25 |
| Example 55 | >4.0 | 3.51 | 20 | No charge | No charge | No charge | 42 | 30 |
| Example 56 | >4.0 | 3.72 | 200 | No charge | No charge | No charge | 37 | 33 |
| Example 57 | >4.0 | 3.45 | 300 | No charge | No charge | No charge | 41 | 31 |
| Example 58 | >4.0 | 3.12 | 400 | No charge | No charge | No charge | 40 | 33 |
| Example 59 | >4.0 | 3.33 | 100 | No charge | No charge | No charge | 38 | 34 |
| Example 60 | >4.0 | 3.24 | 200 | No charge | No charge | No charge | 42 | 37 |
| Example 61 | >4.0 | 3.34 | 200 | No charge | No charge | No charge | 40 | 33 |
| Example 62 | >4.0 | 3.24 | 200 | No charge | No charge | No charge | 38 | 32 |
| Com. Ex. 63 | 3.7 | 3.41 | 200 | No charge | No charge | No charge | 30 | 34 |
| Com. Ex. 64 | >4.0 | 3.12 | 200 | No charge | No charge | No charge | 42 | 60 |
| Example 63 | >4.0 | 3.36 | 300 | No charge | No charge | Charged | 43 | 31 |
| Example 64 | >4.0 | 3.27 | 200 | No charge | No charge | Charged | 42 | 30 |
| Example 65 | >4.0 | 3.36 | 200 | No charge | Charged | Charged | 44 | 33 |
| Com. Ex. 66 | >4.0 | 3.01 | 400 | No charge | No charge | Charged | 43 | 37 |

TABLE 5-continued

| | | | | | | | | |
|---|---|---|---|---|---|---|---|---|
| Com. Ex. 69 | >4.0 | 2.95 | 300 | No charge | No charge | Charged | 42 | 33 |
| Com. Ex. 87 | >4.0 | 2.87 | 200 | No charge | Charged | Charged | 43 | 61 |

Example 66

By using a polyimide film having an arithmetic average height (Ra) of 0.4 μm, and a thickness of 25 μm, a laminated body of a black light shading thin film was formed onto one surface of the polyimide film to produce a black light shading plate.

Onto one surface of the polyimide film, the film of Example 5 as a black coating film of the first layer, the film of Comparative Example 1 as a black coating film of the second layer, and the film of Example 5 as a black coating film of the third layer were sequentially formed to produce the laminated body of a black light shading thin film.

As shown in Table 6, the average reflectance, in a wavelength of, from 380 to 780 nm, when light enters from the film surface side, was 0.31%, and the average reflectance, when light enters from the substrate surface not formed with the film, was 0.24%. Lightness of the film surface as the L* value was 41, and the L* value of the film substrate surface was 38. In addition, an average optical density, in a wavelength of from 380 to 780 nm, became equal to or higher than 4.0, showing to have complete light shading property. In a heating test at 270° C., there was no change of the average optical density, the average reflectance and the L* value, similarly as in Example 54, showing to have excellent heat resistance.

Therefore, because the light shading plate of Examples 66 has complete light shading property with average optical density of equal to or higher than 4.0, low average reflectance of the film surface and the glass plate surface of equal to or lower than 0.8%, and color with high black degree, it is useful as optical applications.

Examples 67 and 68

On one surface of a polyimide film substrate, a laminated body of a black light shading thin film was formed to produce a black light shading plate, under similar sputtering film-formation condition (target composition, film-formation gas pressure, oxygen mixing quantity into film-formation Ar gas) of films of the first, the second and the third layer, or similar film thickness of the first and the third layer, and similar kind of the substrate, as in Example 66, except that film thickness of the second layer in the laminated body of a black light shading thin film of Example 66, was changed to 100 nm (Example 67) and 240 nm (Example 68).

As shown in Table 6, the light shading plate of Example 67 had average reflectance, in a wavelength of from 380 to 780 nm, when light enters from the film surface side, of 0.27% and the L* value of the film surface of 40. In addition, average reflectance, in a wavelength of from 380 to 780 nm, when light enters from the film substrate surface, became 0.22%, and the L* value of the film substrate surface was 37. Color of the film surface and the film substrate surface both showed high black degree. An average optical density, in a wavelength of from 380 to 780 nm, became equal to or higher than 4.0, showing complete light shading property.

As shown in Table 6, the light shading plate of Example 68, similarly as in Example 66, had an average optical density of equal to or higher than 4.0, an average reflectance at the film surface side of 0.26%, and an average reflectance at the film substrate surface side of 0.20%. In addition, the L* value of the film surface became 38, and the L* value of the film substrate surface became 31, showing color with high black degree, similarly as in Example 66. In a heating test at 270° C., Examples 67 and 68 showed no change of the average optical density, the average reflectance or the L* value, showing to have excellent heat resistance, similarly as in Example 66. It should be noted that surface resistance of the films was 200Ω/☐ in Examples 67 and 68.

Therefore, because the light shading plates of Examples 67 to 68, showed the color with high black degree, had complete light shading property with average optical density of equal to or higher than 4.0, and a low average reflectance of the film surface and the film plate surface of equal to or lower than 0.8%, they are useful as optical applications.

Examples 69 to 71

On one surface of a polyimide film substrate, a laminated body of a black light shading thin film was formed to produce a black light shading plate, under similar sputtering film-formation condition (target composition, film-formation gas pressure, oxygen mixing quantity into film-formation Ar gas) of films of the first, the second, and the third layer, or similar film thickness of the second and the third layer, and similar kind of the substrate, as in Example 66, except that film thickness of the first layer in the laminated body of a black light shading thin film of Example 66, was changed to 30 nm (Example 69), 50 nm (Example 70) and 100 nm (Example 71).

As shown in Table 6, an average reflectance, in a wavelength of from 380 to 780 nm, when light enters from the film surface side, was 0.26% in Example 69, 0.27% in Example 70 and 0.25% in Example 71. An average reflectance, in a wavelength of from 380 to 780 nm, when light enters from the film substrate surface, was 0.25% in Example 69, 0.23% in Example 70 and 0.21% in Example 71.

In addition, an average optical density, in a wavelength of from 380 to 780 nm, became equal to or higher than 4.0, in any of Examples 69 to 71, showing complete light shading property.

The L* value of the film surface became 42 in Example 69, 41 in Example 70 and 38 in Example 71, and the L* value of the film substrate surface was 34 in Example 69, 32 in Example 70 and 27 in Example 71.

In a heating test at 270° C., Examples 69 to 71 showed no change of the average optical density, the average reflectance and the L* value, showing to have excellent heat resistance, similarly as in Example 66. It should be noted that surface resistance of the films was 200 to 300Ω/☐ in Examples 69 to 71.

Therefore, because the light shading plates of Examples 69 to 71 have complete light shading property with average optical density of equal to or higher than 4.0, and low average reflectance of the film surface and the film plate surface, and showed color with high black degree, they are useful as optical applications.

Examples 72 to 74

On one surface of a polyimide film substrate, a laminated body of a black light shading thin film was formed to produce a black light shading plate, under similar sputtering film-formation condition (target composition, film-formation gas pressure, oxygen mixing quantity into film-formation Ar gas) of films of the first, the second, and the third layer, or similar film thickness of the first and second layer, and similar kind of the substrate, as in Example 66, except that film thickness of the third layer in the laminated body of a black light shading thin film of Example 66, was changed to 30 nm (Example 72), 50 nm (Example 73) and 100 nm (Example 74).

As shown in Table 6, an average reflectance, in a wavelength of from 380 to 780 nm, when light enters from the film surface side, was 0.32% in Example 72, 0.30% in Example 73 and 0.27% in Example 74. An average reflectance, in a wavelength of from 380 to 780 nm, when light enters from the film substrate surface, was 0.24% in Example 72, 0.23% in Example 73 and 0.22% in Example 74.

In addition, an average optical density, in a wavelength of from 380 to 780 nm, became equal to or higher than 4.0, in any of Examples 72 to 74, showing complete light shading property.

The L* value of the film surface became 42 in Example 72, 41 in Example 73, and 38 in Example 74, and the L* value of the film substrate surface was 28 in Example 72, 28 in Example 73 and 27 in Example 74.

In addition, an average optical density, in a wavelength of from 380 to 780 nm, was equal to or higher than 4.0, in any of Examples 72 to 74.

It should be noted that surface resistance was 200 to 400Ω/□ in Examples 72 to 74. In a heating test at 270° C., Examples 72 to 74 showed no change of the average optical density, the average reflectance and the L* value, showing to have excellent heat resistance, similarly as in Example 66.

Therefore, because the light shading plates of Examples 72 to 74 have complete light shading property with the average optical density of equal to or higher than 4.0, and low average reflectance of the film surface and the film plate surface, and showed color with high black degree, they are useful as optical applications.

Comparative Example 58

On one surface of a polyimide film substrate, a laminated body of a black light shading thin film was formed to produce a black light shading plate, under similar sputtering film-formation condition (target composition, film-formation gas pressure, oxygen mixing quantity into film-formation Ar gas) of films of the first, the second, and the third layer, or similar film thickness of the first and third layer, and similar kind of the substrate, as in Example 66, except that film thickness of the second layer in the laminated body of a black light shading thin film of Example 66 was changed to 90 nm.

As shown in Table 6, in Comparative Example 58, an average reflectance, in a wavelength of from 380 to 780 nm, when light enters from the film surface side, was 0.30%, and the L* value of the film surface was 39. In addition, an average reflectance, in a wavelength of from 380 to 780 nm, when light enters from the film substrate surface side, became 0.24%, and the L* value of the film substrate surface was 29. The film surface and the film substrate surface both showed color with high black degree, and an average optical density, in a wavelength of from 380 to 780 nm, became 3.8, not having complete light shading property. In a heating test at 270° C., the average optical density, the average reflectance and the L* value did not change, showing to have excellent heat resistance, similarly as in Example 66. It should be noted that surface resistance was 300Ω/□.

Therefore, the light shading plate of Comparative Example 58, because of having the average optical density of below 4.0, although having color with high black degree, low reflection and excellent heat resistance, it is not suitable for applications requiring complete light shading property, among optical members.

Comparative Example 59

Onto one surface of a polyimide film having an arithmetic average height (Ra) of 0.4 μm and a thickness of 25 μm, the film of Comparative Example 1 was formed by a film thickness of 190 nm as the first layer film, and onto the first layer film, the film of Example 5 was formed by a film thickness of about 70 nm as the second layer film to produce a black light shading plate. Sputtering film-formation condition (target composition, film-formation gas pressure, oxygen mixing quantity into film-formation Ar gas) of the first layer is the same as in Comparative Example 1. In addition, sputtering film-formation condition (target composition, film-formation gas pressure, oxygen mixing quantity into film-formation Ar gas) of the second layer film is the same as in Example 5. It should be noted that this film constitution corresponds to the case where the first layer film of Example 5, shown in Example 66, was not formed.

As shown in Table 6, the average optical density, in a wavelength of from 380 to 780 nm, became equal to or higher than 4.0, showing complete light shading property.

The average reflectance, in a wavelength of from 380 to 780 nm, when light enters from the film surface side, was 0.32%, the same as in Example 66, however, the average reflectance, in a wavelength of from 380 to 780 nm, when light enters from the film substrate surface, became 1.13%, higher as compared with Example 66. In addition, the L* value of the film surface was 42, the same as in Example 66, however, the L* value of the film substrate surface was as high as 50, showing color with low black degree. It should be noted that surface resistance was 200Ω/□. In a heating test at 270° C., there was no change of the average optical density, the average reflectance or the L* value, showing to have excellent heat resistance, similarly as in Example 66.

Therefore, because the light shading plate of Comparative Example 59 has high average reflectance at the film substrate surface side of 1.13%, and color of low black degree, although having complete light shading property with the average optical density of equal to or higher than 4.0, and the low average reflectance of the film surface of equal to or lower than 0.8%, it is not suitable for optical members.

Examples 75 to 77

A black light shading plate was produced under the same production condition (target composition, film-formation gas pressure, oxygen mixing quantity into film-formation Ar gas) and the same film thickness as in Examples 63 to 65, except kind of the substrate was changed to a polyimide film having an arithmetic average height (Ra) of 0.4 μm, and a thickness of 25 μm.

Composition of the second layer film was changed to a Ti film (Example 75), a NiTi film (Example 76) and an Al film (Example 77).

As shown in Table 6, the average reflectance, in a wavelength of from 380 to 780 nm, when light enters from the film surface side, was 0.31% in Example 75, 0.28% in Example 76, 0.27% in Example 77. In addition, the average reflectance, when light enters from the film substrate surface, was 0.24% in Example 75, 0.24% in Example 76, 0.23% in Example 77.

In addition, an average optical density, in a wavelength of from 380 to 780 nm, became equal to or higher than 4.0, in any of Examples 75 to 77, showing complete light shading property.

The L* value of the film surface was 43 in Example 75, 40 in Example 76, 42 in Example 77, and the L* value of the film substrate surface was 34 in Example 75, 30 in Example 76, 36 in Example 77.

It should be noted that surface resistance was 200 to 300Ω/□ in Examples 75 to 77. In a heating test at 270° C., there was observed change of color, or reflectance or the like in Examples 75 to 77. In a heating test at 200° C., discoloration was observed in Example 77, however, there was no change of color, or reflectance or the like in Examples 75 and 76. Therefore, Examples 75 and 76 can be utilized as the black light shading plate requiring heat resistance of equal to or lower than 200° C. In addition, the light shading plate of Example 77 showed no discoloration in a heating test at 150° C. Therefore it can be utilized as the light shading plate requiring heat resistance of equal to or lower than 150° C.

Cross-sectional TEM observation was performed on samples which showed discoloration in the heat test, in the light shading plates of Examples 75 to 77. It was clarified that the second layer films of all of the samples which showed discoloration were oxidized. It can be predicted that the discoloration was observed caused by this.

Therefore, because the light shading plates of Examples 75 to 77 have complete light shading property with an average optical density of equal to or higher than 4.0, and low average reflectance of the film surface and the film substrate surface, and showed the color with high black degree, they are useful as optical applications.

Comparative Examples 60 to 62

Onto one surface of a polyimide film, a Ti film (Comparative Example 60), a NiTi film (Comparative Example 61) and an Al film (Comparative Example 62) were formed as the first layer film, and onto each of the films, the film of Example 5 was formed, as the second layer film, to produce a black light shading plate. Sputtering film-formation condition (target composition, film-formation gas pressure, oxygen mixing quantity into film-formation Ar gas) of the first layer is set similar to that in Examples 75 to 77. In Comparative example 60, a Ti film was formed by 190 nm, in Comparative example 61, a NiTi film was formed by 190 nm, and in Comparative example 62, an Al film was formed by 190 nm. Sputtering film-formation condition (target composition, film-formation gas pressure, oxygen mixing quantity into film-formation Ar gas) of the second layer was the same as sputtering film-formation condition of the first and the third layer of Examples 75 to 77.

As shown in Table 6, the average optical density, in a wavelength of from 380 to 780 nm, became equal to or higher than 4.0, showing complete light shading property.

The average reflectance, in a wavelength of from 380 to 780 nm, when light enters from the film surface side, was 0.33% in Comparative Example 60, 0.29% in Comparative Example 61, and 0.37% in Comparative Example 62. In addition, the average reflectance, in a wavelength of from 380 to 780 nm, when light enters from the film substrate surface, became 1.27% in Comparative Example 60, 1.35% in Comparative Example 61, and 1.47% in Comparative Example 62, higher as compared with Examples 75 to 77. In addition, the L* value of the film surface was 42 in Comparative Example 60, 39 in Comparative Example 61 and 41 in Comparative Example 62, however, the L* value of the film substrate surface became 49 to 52 in Comparative Examples 60 to 62, higher as compared with Examples 75 to 77, showing color with low black degree. It should be noted that surface resistance was 200 to 300Ω/□.

In a heating test at 270° C. in air, there was observed change of color, or reflectance or the like, similarly as in Examples 75 to 77.

Therefore, because the light shading plates of Comparative Examples 60 to 62 have the high average reflectance at the substrate surface side, and color of low black degree, although having complete light shading property with the average optical density of equal to or higher than 4.0, they are not suitable for optical members.

TABLE 6

| | Kind of substrate Material | First layer film | | Second layer film | | Third layer film | | Average optical reflectance at film surface in wavelength 380-780 nm (%) | Average reflectance at substrate surface in wavelength 380-780 nm (%) |
|---|---|---|---|---|---|---|---|---|---|
| | | Kind of film | Film thickness (nm) | Kind of film | Film thickness (nm) | Kind of film | Film thickness (nm) | | |
| Example 66 | Polyimide | Film of Ex. 6 | 70 | Film of Com. Ex. 1 | 190 | Film of Ex. 6 | 70 | 0.31 | 0.24 |
| Example 67 | | Film of Ex. 6 | 70 | Film of Com. Ex. 1 | 100 | Film of Ex. 6 | 70 | 0.27 | 0.22 |
| Example 68 | | Film of Ex. 6 | 70 | Film of Com. Ex. 1 | 240 | Film of Ex. 6 | 70 | 0.26 | 0.20 |
| Example 69 | | Film of Ex. 6 | 30 | Film of Com. Ex. 1 | 190 | Film of Ex. 6 | 70 | 0.26 | 0.25 |
| Example 70 | | Film of Ex. 6 | 50 | Film of Com. Ex. 1 | 190 | Film of Ex. 6 | 70 | 0.27 | 0.23 |
| Example 71 | | Film of Ex. 6 | 100 | Film of Com. Ex. 1 | 190 | Film of Ex. 6 | 70 | 0.25 | 0.21 |
| Example 72 | | Film of Ex. 6 | 70 | Film of Com. Ex. 1 | 190 | Film of Ex. 6 | 30 | 0.32 | 0.24 |
| Example 73 | | Film of Ex. 6 | 70 | Film of Com. Ex. 1 | 190 | Film of Ex. 6 | 50 | 0.30 | 0.23 |
| Example 74 | | Film of Ex. 6 | 70 | Film of Com. Ex. 1 | 190 | Film of Ex. 6 | 100 | 0.27 | 0.22 |
| Com. Ex. 58 | | Film of Ex. 6 | 70 | Film of Com. Ex. 1 | 80 | Film of Ex. 6 | 70 | 0.30 | 0.24 |
| Com. Ex. 59 | | Film of Com. Ex. 3 | 190 | Film of Ex. 6 | 70 | — | — | 0.32 | 1.13 |
| Example 75 | | Film of Ex. 6 | 70 | Ti | 190 | Film of Ex. 6 | 70 | 0.31 | 0.24 |
| Example 76 | | Film of Ex. 6 | 70 | Ni—Ti | 190 | Film of Ex. 6 | 70 | 0.28 | 0.24 |
| Example 77 | | Film of Ex. 6 | 70 | Al | 190 | Film of Ex. 6 | 70 | 0.27 | 0.23 |
| Com. Ex. 60 | | Ti | 190 | Film of Ex. 6 | 70 | — | — | 0.33 | 1.27 |
| Com. Ex. 61 | | Ni—Ti | 190 | Film of Ex. 6 | 70 | — | — | 0.29 | 1.35 |
| Com. Ex. 62 | | Al | 190 | Film of Ex. 6 | 70 | — | — | 0.37 | 1.47 |

TABLE 6-continued

|  | Average optical density in wavelength 380-780 nm | Film surface roughness [Ra] (nm) | Film surface resistance (Ω/□) | Discoloration in heating for 30 min in air | | | Lightness | |
|---|---|---|---|---|---|---|---|---|
|  |  |  |  | 150° C. | 200° C. | 270° C. | Film surface L* | Substrate surface L* |
| Example 66 | >4.0 | 0.68 | 200 | No charge | No charge | No charge | 41 | 35 |
| Example 67 | >4.0 | 0.64 | 200 | No charge | No charge | No charge | 40 | 37 |
| Example 68 | >4.0 | 0.61 | 200 | No charge | No charge | No charge | 38 | 31 |
| Example 69 | >4.0 | 0.67 | 200 | No charge | No charge | No charge | 42 | 34 |
| Example 70 | >4.0 | 0.60 | 200 | No charge | No charge | No charge | 41 | 32 |
| Example 71 | >4.0 | 0.59 | 300 | No charge | No charge | No charge | 39 | 27 |
| Example 72 | >4.0 | 0.66 | 400 | No charge | No charge | No charge | 42 | 28 |
| Example 73 | >4.0 | 0.64 | 300 | No charge | No charge | No charge | 41 | 28 |
| Example 74 | >4.0 | 0.62 | 200 | No charge | No charge | No charge | 38 | 27 |
| Com. Ex. 58 | 3.8 | 0.67 | 300 | No charge | No charge | No charge | 39 | 29 |
| Com. Ex. 59 | >4.0 | 0.60 | 200 | No charge | No charge | No charge | 42 | 50 |
| Example 75 | >4.0 | 0.57 | 300 | No charge | No charge | Charged | 43 | 34 |
| Example 76 | >4.0 | 0.54 | 200 | No charge | No charge | Charged | 40 | 30 |
| Example 77 | >4.0 | 0.49 | 300 | No charge | Charged | Charged | 42 | 36 |
| Com. Ex. 60 | >4.0 | 0.55 | 300 | No charge | No charge | Charged | 42 | 51 |
| Com. Ex. 61 | >4.0 | 0.55 | 200 | No charge | No charge | Charged | 39 | 49 |
| Com. Ex. 62 | >4.0 | 0.46 | 200 | No charge | Charged | Charged | 41 | 52 |

What is claimed is:

1. A black coating film (A), where a titanium oxide film containing titanium and oxygen as main components and having an oxygen content of from 0.7 to 1.4 as atomicity ratio O/Ti, is formed on a substrate, characterized in that said titanium oxide film takes a constitution of fine columnar crystals assembled, where the longitudinal direction of the crystal extends in a film thickness direction, has protrusions at said film surface, and has a film thickness of equal to or thicker than 50 nm.

2. The black coating film according to claim 1, characterized in that the substrate is selected from a thin film of a metal such as stainless steel, SK (carbon steel), Al or Ti, a thin film of ceramic such as alumina, magnesia, silica or zirconia, a glass plate, a resin plate or a resin film.

3. The black coating film according to claim 1, characterized in that the titanium oxide film still more contains carbon, and is a titanium oxy-carbide film having a content of equal to or higher than 0.7 as atomicity ratio C/Ti.

4. The black coating film according to claim 1, characterized in that crystallite size of the fine columnar crystal, which constitutes the titanium oxide film or the titanium oxy-carbide film, is from 10 to 40 nm as diameter (width).

5. The black coating film according to claim 1, characterized in that the film thickness is from 50 to 250 nm.

6. The black coating film according to claim 1, characterized in that an arithmetic average height (Ra) in a region of 1 μm×1 μm, measured with an atomic force microscope, is equal to or higher than 1.8 nm.

7. The black coating film according to claim 6, characterized in that an arithmetic average height (Ra) in a region of 1 μm×1 μm, measured with an atomic force microscope, is equal to or higher than 2.4 nm.

8. The black coating film according to, claim 1, characterized in that a parallel light transmittance of the film itself, in a wavelength of from 380 to 780 nm, is from 13 to 35%, as an average value.

9. A method for producing the black coating film according to claim 1, characterized in that a titanium oxide film or a titanium oxy-carbide film is formed on a substrate by sputtering under a film-formation gas pressure of equal to or higher than 1.5 Pa, by using any of sintered body target selected from titanium oxide, titanium oxide and titanium carbide, or titanium oxy-carbide.

10. The method for producing the black coating film according to claim 9, characterized in that the film-formation gas is inert gas comprising mainly argon or helium, and a content of oxygen gas is equal to or lower than 0.8% by volume.

11. A laminated body of a black light shading thin film having sequential lamination, on the black coating film (A) selected from the titanium oxide film or the titanium oxy-carbide film according to claim 1, of a metallic light shading film (B) and the black coating film (A) similar to the above.

12. The laminated body of a black light shading thin film according to claim 11, characterized in that the metallic light shading film (B) is a metal material containing one or more kinds of elements selected from titanium, tantalum, tungsten, cobalt, nickel, niobium, iron, zinc, copper, aluminum, or silicon, as main components.

13. The laminated body of a black light shading thin film according to claim 11, characterized in that the metallic light shading film (B) is a titanium carbide film or a titanium oxy-carbide film, and a carbon content in said film is equal to or higher than 0.6 as atomicity ratio C/Ti, and an oxygen content in the film is equal to or lower than 0.4 as atomicity ratio O/Ti.

14. A black light shading plate, where the laminated body of a black light shading thin film according to claim 11 is formed at one surface side of a translucent substrate, characterized in that the metallic light shading film (B) has a film thickness of equal to or thicker than 100 nm, an average optical density in a wavelength of from 380 to 780 nm is equal to or higher than 4.0, and an average value of direct optical reflectance at the surface of the laminated body and at the substrate surface not formed with the film in a wavelength of from 380 to 780 nm is equal to or lower than 18%.

15. The black light shading plate according to claim 14, characterized in that the translucent substrate is a resin film, a resin plate, a glass plate, a ceramic plate or a single crystal plate of an inorganic compound.

16. The black light shading plate according to claim 15, characterized in that the translucent substrate is a polyimide film.

17. The black light shading plate according to claim 14, characterized in that the translucent substrate has surface irregular property.

18. The black light shading plate according to claim 14, characterized in that surface roughness at the translucent substrate side is from 0.0001 to 0.7 μm (arithmetic average height), and an average value of direct optical reflectance at the surface of the laminated body of a black light shading thin film in a wavelength of from 380 to 780 nm is equal to or lower than 0.8%.

19. The black light shading plate according to claim 14, characterized in that the lightness (L*) of the film surface side of the black light shading plate formed with the laminated body of a black light shading thin film, is from 25 to 45.

20. The black light shading plate according to claim 14, characterized in that the lightness (L*) of the translucent substrate surface side of the black light shading plate formed with the laminated body of a black light shading thin film, is from 25 to 45.

21. A black light shading plate, characterized in that a surface roughness of the black coating film (A) formed at the surface of the metallic light shading film (B), in the laminated body of a black light shading thin film according to claim 11 is from 0.05 to 0.7 μm (arithmetic average height), and an average value of direct optical reflectance at the surface of the black coating film (A) in a wavelength of from 380 to 780 nm is equal to or lower than 0.8%.

22. A black light shading plate, wherein by using a resin film, a resin plate, a metal thin plate or a ceramic thin plate, as a substrate, the metallic light shading film (B) having a film thickness of equal to or thicker than 40nm, is formed onto at least one surface thereof, and still more the black coating film (A) according to claim 1 is laminated and formed onto the surface of the metallic light shading film (B), characterized in that an average optical density in a wavelength of from 380 to 780 nm is equal to or higher than 4.0, and an average value of direct optical reflectance at the surface of the black coating film in a wavelength of from 380 to 780 nm is equal to or lower than 18%.

23. The black light shading plate according to claim 22, characterized in that the resin film, the resin plate, the metal thin plate or the ceramic thin plate has surface irregular property.

24. The black light shading plate according to claim 22, characterized in that the resin film is a polyimide film.

25. The black light shading plate according to claim 22, characterized in that the metallic light shading film (B) is a metal material containing one or more kinds of elements selected from titanium, tantalum, tungsten, cobalt, nickel, niobium, iron, zinc, copper, aluminum, or silicon, as main components.

26. The black light shading plate according to claim 22, characterized in that the metallic light shading film (B) is a titanium carbide film or a titanium oxy-carbide film, and a carbon content in said film is equal to or higher than 0.6, as atomicity ratio C/Ti, and an oxygen content in the film is equal to or lower than 0.4, as atomicity ratio O/Ti.

27. The black light shading plate according to claim 22, characterized in that the metallic light shading film (B) having substantially the same film thickness and the same composition is formed at both surfaces of the substrate of the resin film, the resin plate, the metal thin plate or the ceramic thin plate, and still more the black coating film (A) having substantially the same film thickness and the same composition is laminated and formed at the surface of the metallic light shading film (B), and they have a symmetric structure to the substrate.

28. The black light shading plate according to claim 22, characterized in that a surface roughness of the black coating film (A) formed at the surface of the metallic light shading film (B) is from 0.05 to 0.7 μm (arithmetic average height), and an average value of direct optical reflectance at the surface of the black coating film (A) in a wavelength of from 380 to 780 nm is equal to or lower than 0.8%.

29. The black light shading plate according to claim 22, characterized in that a lightness (L*) of the black light shading plate, where the black coating film (A) is formed on the surface of the metallic light shading film (B), is from 25 to 45.

30. A diaphragm obtained by fabrication of the black light shading plate according to claim 22.

31. A diaphragm device for light intensity adjustment using blade materials obtained by fabrication of the black light shading plate according to claim 22.

32. A shutter using the blade materials obtained by fabrication of the black light shading plate according to claim 22.

33. A heat resistant light shading tape comprising an adhesive layer placed at one surface or both surfaces of the black light shading plate according to claim 22.

34. A black light shading plate, wherein by using a colored resin film as a substrate, the black coating film (A) according to claim 1 is formed on at least one surface thereof, characterized in that film thickness of the black coating film (A) is equal to or thicker than 20 nm, and an average value of direct optical reflectance at the surface of the black light shading plate, in a wavelength of from 380 to 780 nm, is equal to or lower than 1%.

35. The black light shading plate according to claim 34, characterized in that the colored resin film has surface irregular property.

36. The black light shading plate according to claim 34, characterized in that the film thickness of the black coating film (A) is from 20 to 150 nm.

37. The black light shading plate according to claim 34, characterized in that the lightness (L*) of the black light shading plate obtained by formation of the black coating film (A) on the colored resin film, is from 25 to 45.

38. A method for producing a black coating film, characterized in that oxygen contained in a sintered body and/or oxygen in residual gas in a film-formation room is incorporated into the film by sputtering film-formation by using any of a sintered body target selected from titanium oxide, titanium oxide and titanium carbide, or titanium oxy-carbide, without introducing oxygen gas and introducing inert gas comprising mainly argon or helium, as the film-formation gas, during film-formation.

39. The method for producing the black coating film according to claim 38, characterized in that film-formation is performed under a film-formation gas pressure of equal to or higher than 1.5 Pa, in sputtering.

* * * * *